United States Patent
Higashino

(10) Patent No.: US 10,522,183 B2
(45) Date of Patent: Dec. 31, 2019

(54) SIGNAL PROCESSING APPARATUS AND SIGNAL PROCESSING METHOD

(71) Applicant: SONY CORPORATION, Tokyo (JP)

(72) Inventor: Satoru Higashino, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/095,448

(22) PCT Filed: May 12, 2017

(86) PCT No.: PCT/JP2017/017965
§ 371 (c)(1),
(2) Date: Oct. 22, 2018

(87) PCT Pub. No.: WO2017/204002
PCT Pub. Date: Nov. 30, 2017

(65) Prior Publication Data
US 2019/0130940 A1 May 2, 2019

(30) Foreign Application Priority Data
May 27, 2016 (JP) .................. 2016-106614

(51) Int. Cl.
*G11B 20/10* (2006.01)
*G11B 20/14* (2006.01)
*G11B 20/18* (2006.01)
*G11B 20/12* (2006.01)
*H03M 13/41* (2006.01)

(52) U.S. Cl.
CPC .. *G11B 20/10055* (2013.01); *G11B 20/10009* (2013.01); *G11B 20/10046* (2013.01); *G11B 20/10287* (2013.01); *G11B 20/10296* (2013.01); *G11B 20/1217* (2013.01); *G11B 20/14* (2013.01); *G11B 20/1426* (2013.01);
(Continued)

(58) Field of Classification Search
CPC ..... G11B 5/00; G11B 20/08; G11B 20/10268; G11B 5/09; G11B 20/16; G11B 20/1407; G11B 2020/183; G11B 5/5921; G11B 20/1209; G11B 20/1205; G11B 20/10222
USPC ......... 360/25, 29, 39, 31, 40, 41, 53, 54, 51
See application file for complete search history.

(56) References Cited

U.S. PATENT DOCUMENTS 6,622,280 B1    9/2003  Higashino
8,300,344 B1 *  10/2012 Yang ............... B82Y 10/00
                                                  360/31

(Continued)

OTHER PUBLICATIONS

May 13, 2019, European Search Report issued for related EP Application No. 17802596.1.

*Primary Examiner* — Nabil Z Hindi
(74) *Attorney, Agent, or Firm* — Paratus Law Group, PLLC

(57) ABSTRACT

There is provided a signal processing apparatus and a signal processing method capable of allowing data recorded at a high density to be robustly reproduced. A frame sync (FS) is restored by performing maximum likelihood decoding of the FS according to a time-varying trellis with a state and a state transition being limited according to a time, in maximum likelihood decoding of a reproduction signal reproduced from a disk-shaped recording medium, the FS representing a head of a frame, the FS of the frame being arranged at the head of the frame, the FS being recorded at the same positions in a track direction in two adjacent tracks.

13 Claims, 38 Drawing Sheets

(52) U.S. Cl.
CPC ......... *G11B 20/18* (2013.01); *H03M 13/4107* (2013.01); *H03M 13/41* (2013.01)

(56) References Cited

U.S. PATENT DOCUMENTS

2003/0009724 A1     1/2003   Ino
2009/0274247 A1    11/2009   Galbraith et al.

* cited by examiner

FIG. 10

CODE TABLE

| | S1 | S2 | S3 | S4 | S5 |
|---|---|---|---|---|---|
| 00 (0) | 000 S3 | 001 S1 | 010 S3 | 100 S3 | 100 S1 |
| 01 (1) | 000 S4 | 001 S2 | 010 S4 | 100 S4 | 100 S2 |
| 10 (2) | 000 S1 | 001 S3 | 010 S1 | 010 S5 | 101 S1 |
| 11 (3) | 000 S2 | 000 S5 | 010 S2 | 100 S5 | 101 S2 |

SUBSTITUTION TABLE

| DEPARTURE STATE | INFORMATION BIT SEQUENCE | SUBSTITUTION SIGNAL SEQUENCE | | ARRIVAL STATE |
|---|---|---|---|---|
| S1 | 10 10 10 (**) | 000 000 000 | => 000 101 010 | S1 |
| S1 | 10 10 11 (**) | 000 000 000 | => 000 101 010 | S2 |
| S1 | 10 10 00 (**) | 000 000 000 | => 000 101 010 | S3 |
| S1 | 10 10 01 (10) | 000 000 000 | => 000 101 010 | S4 |
| S5 | 00 10 10 (**) | 100 000 000 | => 100 101 010 | S1 |
| S5 | 00 10 11 (**) | 100 000 000 | => 100 101 010 | S2 |
| S5 | 00 10 00 (**) | 100 000 000 | => 100 101 010 | S3 |
| S5 | 00 10 01 (10) | 100 000 000 | => 100 101 010 | S4 |

EXTENDED FS CODE STRING HAVING CLOCK SHIFT OF −1
(NRZI REPRESENTATION)

FSC0 = [000 010 000 10000000000 10000000000 100 001**]
FSC1 = [010 010 000 10000000000 10000000000 100 001**]
FSC2 = [001 010 000 10000000000 10000000000 100 001**]
FSC3 = [010 010 000 10000000000 10000000000 100 001**]
FSC4 = [100 010 000 10000000000 10000000000 100 001**]
FSC5 = [100 001 000 10000000000 10000000000 100 001**]

EXTENDED FS CODE STRING HAVING NO CLOCK SHIFT
(NRZI REPRESENTATION)

FSB0 = [*000 010 000 10000000000 10000000000 100 001*]
FSB1 = [*010 010 000 10000000000 10000000000 100 001*]
FSB2 = [*001 010 000 10000000000 10000000000 100 001*]
FSB3 = [*010 010 000 10000000000 10000000000 100 001*]
FSB4 = [*100 010 000 10000000000 10000000000 100 001*]
FSB5 = [*100 001 000 10000000000 10000000000 100 001*]

EXTENDED FS CODE STRING HAVING CLOCK SHIFT OF +1
(NRZI REPRESENTATION)

FSA0 = [**000 010 000 10000000000 10000000000 100 001]
FSA1 = [**010 010 000 10000000000 10000000000 100 001]
FSA2 = [**001 010 000 10000000000 10000000000 100 001]
FSA3 = [**010 010 000 10000000000 10000000000 100 001]
FSA4 = [**100 010 000 10000000000 10000000000 100 001]
FSA5 = [**100 001 000 10000000000 10000000000 100 001]

FIG. 30

FS CANDIDATE BIT STRING (NRZI REPRESENTATION)
IN CASE OF t=7

BIT AT t=7
BIT AT t=5 ↓
↓ ↓
FSA0[0:4] = [**000]
FSA1[0:4] = [**010]
FSA2[0:4] = [**001]
FSA3[0:4] = [**010]
FSA4[0:4] = [**100]
FSA5[0:4] = [**100]

BIT AT t=7
BIT AT t=5 ↓
↓ ↓
FSB0[0:4] = [*000 0]
FSB1[0:4] = [*010 0]
FSB2[0:4] = [*001 0]
FSB3[0:4] = [*010 0]
FSB4[0:4] = [*100 0]
FSB5[0:4] = [*100 0]

BIT AT t=7
BIT AT t=5 ↓
↓ ↓
FSC0[0:4] = [000 01]
FSC1[0:4] = [010 01]
FSC2[0:4] = [001 01]
FSC3[0:4] = [010 01]
FSC4[0:4] = [100 01]
FSC5[0:4] = [100 00]

SIGNAL PROCESSING APPARATUS AND SIGNAL PROCESSING METHOD

CROSS REFERENCE TO PRIOR APPLICATION

This application is a National Stage Patent Application of PCT International Patent Application No. PCT/JP2017/017965 (filed on May 12, 2017) under 35 U.S.C. § 371, which claims priority to Japanese Patent Application No. 2016-106614 (filed on May 27, 2016), which are all hereby incorporated by reference in their entirety.

TECHNICAL FIELD

The present technology relates to a signal processing apparatus and a signal processing method, and more particularly to, for example, a signal processing apparatus and a signal processing method capable of allowing data recorded at a high density to be robustly reproduced.

BACKGROUND ART

Non-patent document 1 describes a time-varying trellis of which structure varies with time.

CITATION LIST

Non-Patent Document

Non-Patent Document 1: Borivoje Nikolic et. al, "Rate 8/9 Sliding Block Distance-Enhancing Code with Stationary Detector", IEEE TRANSACTIONS ON MAGNETICS, VOL. 37, NO. 3, May 2001

SUMMARY OF THE INVENTION

Problems to be Solved by the Invention

In recent years, a demand for recording data at a high density has been increased, and thus, there has been an increasing demand for robustly reproducing data recorded at a high density.

In view of such a situation, the present technology is to make it possible to allow data recorded at a high density to be robustly reproduced.

Solutions to Problems

A signal processing apparatus of the present technology is a signal processing apparatus including a restoration unit that restores a frame sync (FS) by performing maximum likelihood decoding of the FS according to a time-varying trellis with a state and a state transition being limited according to a time, in maximum likelihood decoding of a reproduction signal reproduced from a disk-shaped recording medium, the FS representing a head of a frame, the FS of the frame being arranged at the head of the frame, the FS being-recorded at the same positions in a track direction in two adjacent tracks.

A signal processing method of the present technology is a signal processing method including restoring a frame sync (FS) by performing maximum likelihood decoding of the FS according to a time-varying trellis with a state and a state transition being limited according to a time, in maximum likelihood decoding of a reproduction signal reproduced from a disk-shaped recording medium, the FS representing a head of a frame, the FS of the frame being arranged at the head of the frame, the FS being recorded at the same positions in a track direction in two adjacent tracks.

In signal processing apparatus and a signal processing method of the present technology, a frame sync (FS) is restored by performing maximum likelihood decoding of the FS according to a time-varying trellis with a state and a state transition being limited according to a time, in maximum likelihood decoding of a reproduction signal reproduced from a disk-shaped recording medium, the FS representing a head of a frame, the FS of the frame being arranged at the head of the frame, the FS being recorded at the same positions in a track direction in two adjacent tracks.

In addition, the signal processing apparatus may be an independent device or may be an internal block constituting one apparatus.

Furthermore, the signal processing apparatus may be implemented by causing a computer to execute a program. The program can be provided by being transmitted via a transmission medium or by being recorded on a recording medium.

Effects of the Invention

According to the present technology, it is possible to robustly reproduce data recorded at a high density.

In addition, the effects described herein are not necessarily limited, and any of the effects to be described in the present disclosure may be applied.

BRIEF DESCRIPTION OF DRAWINGS

FIG. 10 is a diagram illustrating an outline of a PCWA110 code.

FIG. 27 is a diagram illustrating an example of the FS.

FIG. 28 is a diagram illustrating examples of FS in the case of no clock shift and FS in the case of clock shift with respect to FS of 6 patterns.

FIG. 30 illustrates the FS candidate bit strings FSA#i[0: 4], FSB#i [0:4], and FSC#i [0:4] in the case of time t=7.

MODE FOR CARRYING OUT THE INVENTION

Figure 1:
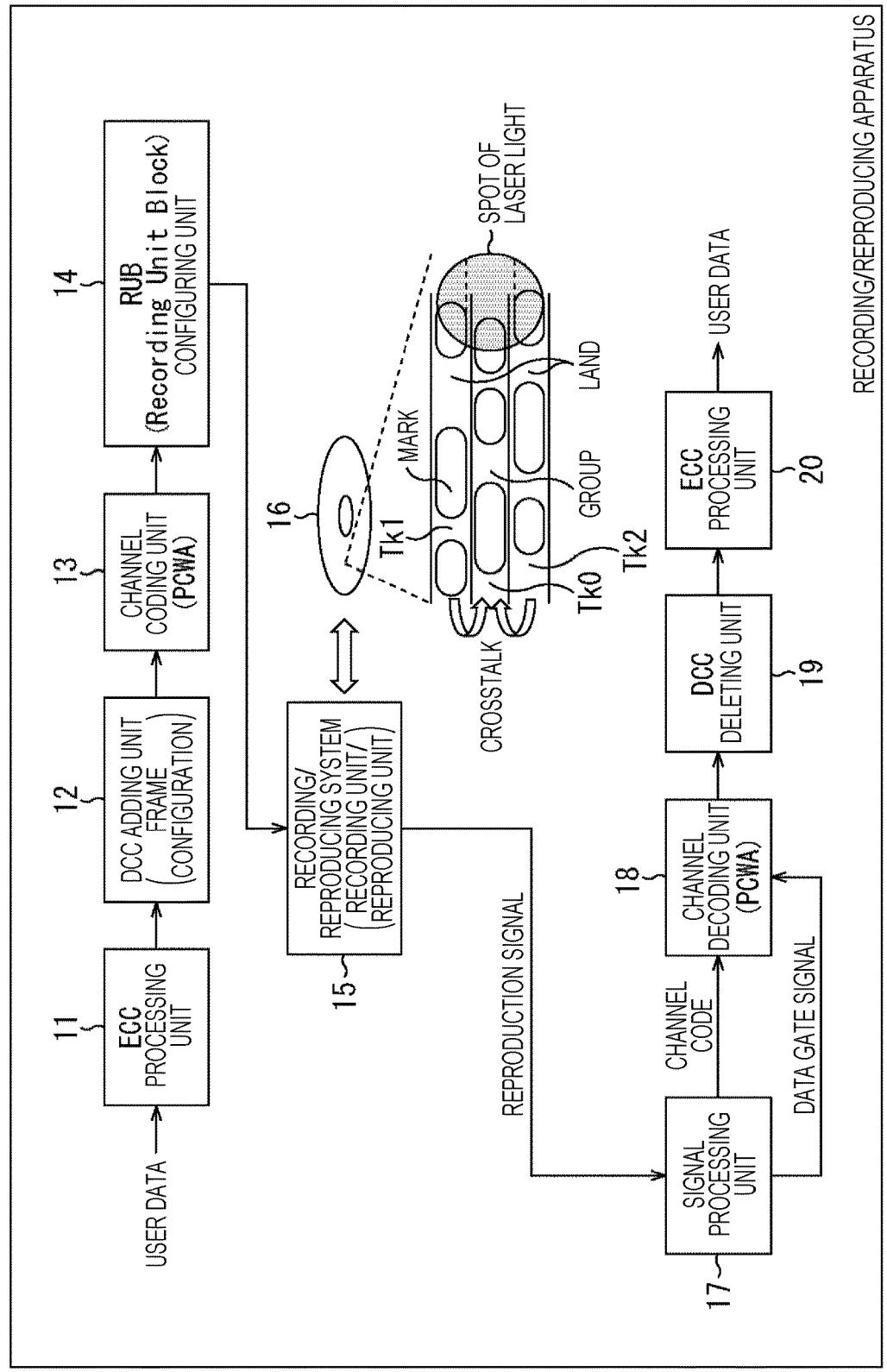
FIG. 1 is a block diagram illustrating a configuration example of one embodiment of a recording/reproducing apparatus to which the present technology is applied.

Embodiment of Recording/Reproducing Apparatus to which Present Technology is Applied FIG. 1 is a block diagram illustrating a configuration example of one embodiment of a recording/reproducing apparatus to which the present technology is applied.

In FIG. 1, the recording/reproducing apparatus includes an error correction coding (ECC) processing unit 11, a direct current control (DCC) adding unit 12, a channel coding unit 13, a recording unit block (RUB) configuring unit 14, a recoding/reproducing system 15, an optical disk 16, a signal processing unit 17, a channel decoding unit 18, a DCC deleting unit 19, and an ECC processing unit 20.

User data (contents such as images and sounds, computer programs, and various other data) which are to be recorded on the optical disk 16 are supplied to the ECC processing unit 11.

For each predetermined unit of the user data, the ECC processing unit 11 configures the ECC target data which includes the user data of the predetermined unit and is to be subjected to an ECC process.

Furthermore, the ECC processing unit 11 configures an ECC block by performing the ECC process for adding parity to the ECC target data and supplies the ECC block to the DCC adding unit 12.

The DCC adding unit 12 divides the ECC block from the ECC processing unit 11 into row data as data of a predetermined unit and adds (inserts) a DCC bit for direct current (DC) control to each row data.

Furthermore, the DCC adding unit 12 configures a frame by adding necessary data such as frame sync (FS) indicating the head of the frame to the row data to which the DCC bit is added and supplies the frame to the channel coding unit 13.

The channel coding unit 13 codes the frame from the DCC adding unit 12 into a predetermined channel code and supplies the channel code to the RUB configuring unit 14.

Herein, as the channel code, for example, a parity-complementary word assignment (PCWA) code, in particular, for example, a PCWA 110 code or other arbitrary run-length limited (RLL) codes can be adopted. In addition, the PCWA 110 code is a binary code, but a multi-valued code of three or more values can be adopted as the channel code.

In addition, an RLL code with a minimum run of d and a maximum run of k is called a (d, k) RLL code. The PCWA 110 code is a code obtained by coding 2-bit information into a 3-bit code with a coding rate of 2/3 and is a (1, 10) RLL code with a minimum run d of 1 and a maximum run k of 10 in a non return to zero inversion (NRZI) representation. The PCWA 110 code is disclosed in, for example, Japanese Patent No. 4998472.

In addition, if the period of the channel clock of the recording/reproducing apparatus is represented by T, the minimum run d and the maximum run k of the PCWA 110 are 2T and 11T, respectively, in a non return to zero NRZ representation.

Hereinafter, for runs such as a minimum run d and a maximum run k, the runs in the NRZI representation are denoted without T, and the runs in the NRZ representation are denoted with T.

Furthermore, it is assumed that, in the NRZI representation in the present specification, for example, 1 denotes inversion of an immediately-before bit, and 0 denotes maintaining of the immediately-before bit as it is.

The RUB configuring unit 14 configures an RUB by adding Run_in and Run_out indicating the start and end of the ECC block to a set (a frame cluster to be described later) of frames (frames coded into channel codes) from the channel coding unit 13 and supplies the RUB to the recording/reproducing system 15.

The recording/reproducing system 15 is configured with a pickup or the like (not illustrated). The recording/reproducing system 15 functions as a recording unit for recording data on the optical disk 16 by irradiating the optical disk 16 with light such as laser light to form, marks. In addition, the recording/reproducing system 15 irradiates the optical disk 16 with laser light, receives reflected light from the optical disk 16 with respect to the laser light, and outputs a reproduction signal corresponding to the reflected light, so that the recording/reproducing system functions as a reproducing unit for reproducing the data recorded on the optical disk 16.

According to the RUB from the RUB configuring unit 14, the recording/reproducing system 15 irradiates the optical disk 16 with laser light and records the RUB on the optical disk 16. In addition, the recording/reproducing system 15 reproduces the reproduction signal (a radio frequency (RF) signal) corresponding to the RUB or the like recorded on the optical disk 16 by irradiating the optical disk 16 with the laser light, and supplies the reproduction signal to the signal processing unit 17.

The optical disk 16 is a kind of disk-shaped recording medium, and lands (tracks) and grooves (tracks) are formed as tracks.

The groove is a grooved track, which is wobbled for addressing. The land is a track interposed between two (adjacent) grooves.

In order to record data at a high density on the optical disk 16, the data are recorded (marks are formed) in both the land and the groove.

As described above, since the data is recorded on both the land and the groove on the optical disk 16, in a case where a certain track TK0 (the groove in FIG. 1) is a reproduction target track, the laser light (the spot thereof) to be irradiated onto the reproduction target track TK0 by the recording/reproducing system 15 is also irradiated onto the tracks TK1 and TK2 adjacent to the track TK0 (and also the track adjacent to the side of the track TK1 or TK2 which is not adjacent to the track TK0) in addition to the track TK0.

As a result, in the reproduction of the reproduction target track TK0, a crosstalk occurs from the tracks TK1 and TK2 adjacent to the track TK0, and the reproduction signal of which reproduction target is the track TK0 is deteriorated caused by the crosstalk from the tracks TK1 and TK2 adjacent to the track TK0. In other words, the reproduction signal of which reproduction target is the track TK0 includes a crosstalk component caused by the crosstalk from the tracks TK1 and TK2 adjacent to the track TK0, and the reproduction signal of which reproduction target is the track TK0 is deformed from an original waveform (a waveform in a case where there is no crosstalk).

In the signal processing unit 17 described later, crosstalk cancellation (hereinafter, also referred to as crosstalk cancel (XTC) for canceling the crosstalk (component) of the reproduction signal is performed as one of the signal processes, and thus, the reproduction signal having an original waveform is obtained.

Herein, in the recording/reproducing system 15, the light receiving surface of a light receiving element (not illustrated) for receiving the reflected light from the optical disk 16 is divided into three regions in the radial direction (corresponding to the direction of the optical disk 16), for example. In these three regions, the reflected light from the optical disk 16 which is incident on the regions is received, and the signal components rs0, rs1, and rs2 corresponding to the reflected light are obtained. As a result, in the recording/reproducing system 15, the signal components rs0, rs1, and rs2 are output as reproduction signals, respectively.

The signal component rs0 is a signal component mainly corresponding to the reflected light from the reproduction target track TK0. Furthermore, the signal component rs1 is a signal component mainly corresponding to the reflected light from the track TK1 (at least a portion thereof) adjacent to one of the inner circumference and the outer circumference of the track TK0, and the signal component rs2 is a signal component mainly corresponding to the track TK2 (at least a portion thereof) adjacent to the other of the inner circumference and the outer circumference of the track TK0.

As described above, the reproduction signal obtained by the recording/reproducing system 15 includes a plurality of signal components corresponding to a plurality of different regions (for example, the tracks TK0, TK1, and TK2) in the radial direction of the optical disk 16, for example, the signal components rs0, rs1, and rs2.

In addition, in this case, the light receiving surface of the light receiving element of the recording/reproducing system 15 is divided into three regions in the radial direction of the optical disk 16. However, the method of dividing the light receiving surface of the light receiving element is not limited thereto. That is, the light receiving surface of the light receiving element can be divided into, for example, four or more regions in the radial direction of the optical disk 16. Furthermore, by dividing the light receiving surface of the light receiving element in the radial direction and the track direction of the optical disk 16, the light receiving surface of the light receiving element can be divided into a plurality of regions, the number of which is arbitrary. In the recording/reproducing system 15, the number of signal components equal to the number of divisions of the light receiving surface of the light receiving element can be obtained as a reproduction signal.

Furthermore, in obtaining a plurality of signal components such as the signal components rs0, rs1, and rs2, for example, as the reproduction signal, the light receiving surface of the light receiving element is not divided, but the reflected light from the optical disk 16 may be received by a plurality of the light receiving elements.

In addition, as described above, instead of adopting a plurality of signal components as the reproduction signal, a signal obtained by receiving the reflected light from the optical disk 16 by one light receiving element of which the light receiving surface is not divided can be adopted.

The signal processing unit 17 performs a signal process of the reproduction signal from the recording/reproducing system 15 to restore the frame of ideally a similar channel code to that output by the channel coding unit 13 and supplies the frame of the channel code to the channel decoding unit 18.

Furthermore, the signal processing unit 17 performs a signal process of the reproduction signal to generate the frame data which is a data of a portion of the frame of the channel code other than the FS, that is, the data gate signal representing the section of the row data to which the DCC bits are added and supplies the data gate signal to the channel decoding unit 18.

The channel decoding unit 18 extracts, for example, the PCWA 110 code as a channel code which is also a frame data of the section represented by the data gate signal from the signal processing unit 17 from the frame of the channel code from the signal processing unit 17. Furthermore, the channel decoding unit 18 performs decoding (channel decoding) of the PCWA 110 code which is the frame data extracted from the frame and converts the frame data obtained by the decoding, that is, the row data to which the DCC bits are added, to the DCC detecting unit 19.

The DCC deleting unit 19 deletes the DCC bits from the frame data from the channel decoding unit 18 and supplies the row data obtained as a result to the ECC processing unit 20.

The ECC processing unit 20 collects the row data from the DCC deleting unit 19 and configures an ECC block. Furthermore, the ECC processing unit 20 corrects the error occurring in the ECC target data included in the ECC block, by applying the ECC process to the ECC block and outputs the user data included in the ECC target data.

In addition, in FIG. 1, the recording/reproducing apparatus may be configured as a device that performs both reproduction and recording and may also be configured as a reproducing dedicated device that performs only reproducing or a recording dedicated device that performs only recording.

Furthermore, in FIG. 1, the recording/reproducing apparatus may be configured in such a form that the optical disk 16 is built in beforehand or may be configured in such a form that the optical disk 16 is detachable.

<Recording Process>

Figure 2:
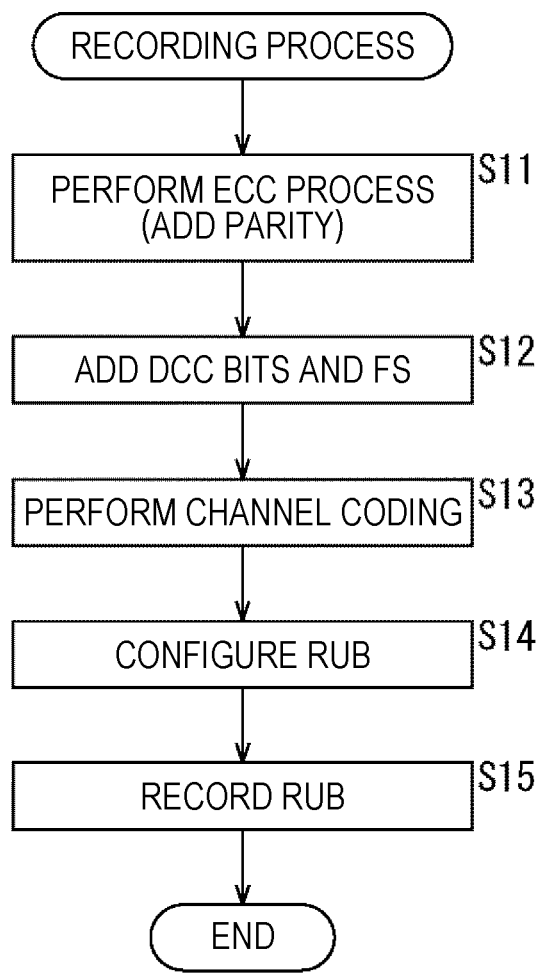
FIG. 2 is a flowchart illustrating an example of a recording process in which the recording/reproducing apparatus records user data on an optical disk 16.

FIG. 2 is a flowchart illustrating an example of a recording process in which the recording/reproducing apparatus of FIG. 1 records the user data on the optical disk 16.

In step S11, the ECC processing unit 11 configures an ECC target data including the user data by using the user data supplied to the ECC processing unit. Furthermore, the ECC processing unit 11 configures an ECC block in which parity is added to the ECC target data by performing an ECC process on the ECC target data and supplies the ECC block to the DCC adding unit 12, and the process proceeds from step S11 to step S12.

In step S12, the DCC adding unit 12 configures a frame by dividing the ECC block from the ECC processing unit 11 into row data, adding DCC bits to each row data, and adding necessary data such as frame sync (FS).

The DCC adding unit 12 supplies the frame to the channel coding unit 13, and the process proceeds from step S12 to step S13.

In step S13, the channel coding unit 13 codes the frame from the DCC adding unit 12 into a channel code such as the PCWA 110 code and supplies the frame to the RUB configuring-unit 14, and the process proceeds to step S14.

In step S14, the RUB configuring unit 14 receives the frame from the channel coding unit 13, collects the frames obtained from one ECC block, and adds the Run_in and the Run_out to the set of frames. The RUB configuring unit 14 supplies the RUB to the recording/reproducing system 15, and the process proceeds from step S14 to step S15.

In step S15, the recording/reproducing system 15 records the RUB on the optical disk 16 by irradiating the optical disk 16 with laser light according to the RUB from the RUB configuring unit 14.

Hereinafter, similar processes are performed, so that user data is recorded on the optical disk 16 in units of RUB.

<Reproducing Process>

Figure 3:
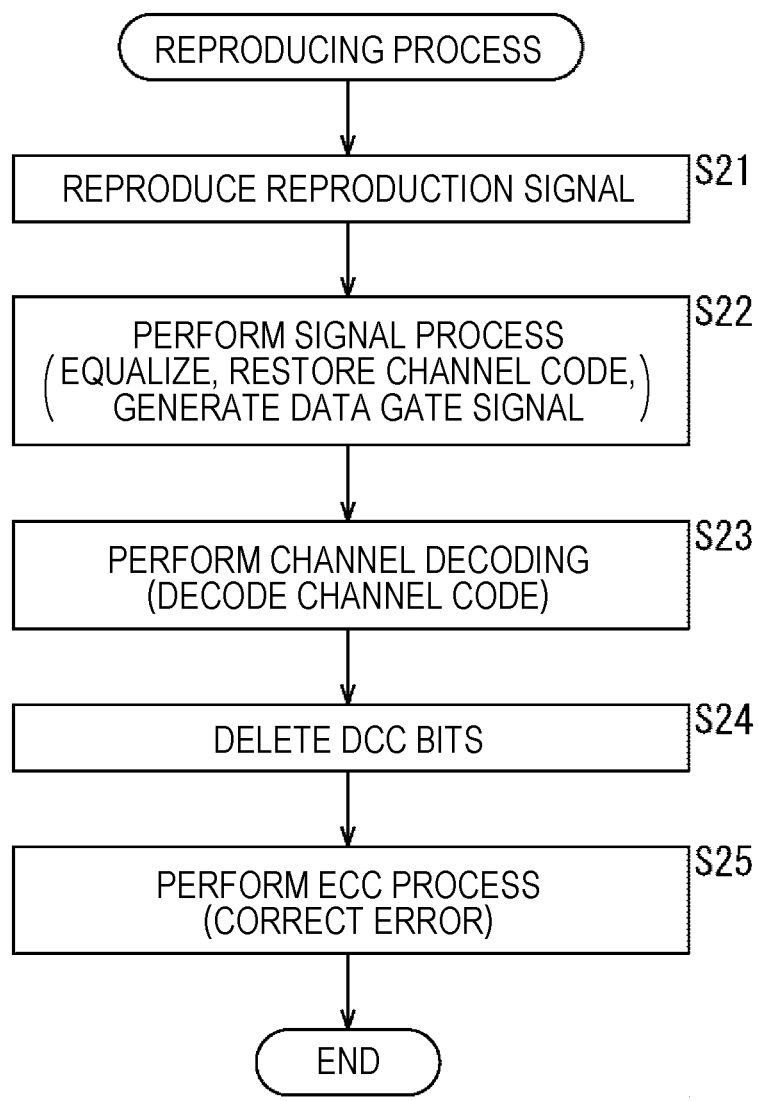
FIG. 3 is a flowchart illustrating an example of a reproducing process in which the recording/reproducing apparatus reproduces the user data recorded on the optical disk 16.

FIG. 3 is a flowchart illustrating an example of a reproducing process for reproducing the user data recorded on the optical disk 16 by the recording/reproducing apparatus of FIG. 1.

In step S21, the recording/reproducing system 15 reproduces a reproduction signal corresponding to the RUB recorded on the optical disk 16 by irradiating the optical disk 16 with laser light, and supplies the reproduction signal to the signal processing unit 17, and the process proceeds to S22.

In step S22, the signal processing unit 17 performs a signal process on the reproduction signal from the recording/reproducing system 15.

In the signal process of the reproduction signal, equalization of the reproduction signal, restoration of a frame of a channel code such as the PCWA 110 code, generation of a data gate signal, and the like are performed.

The frame of the channel code and the data gate signal obtained by the signal process of the reproduction signal are supplied from the signal processing unit 17 to the channel decoding unit 18, and the process proceeds from step S22 to step S23.

In step S23, the channel decoding unit 18 extracts, from the frame of the channel code from the signal processing unit 17, the channel code which becomes the frame data in the section represented by the data gate signal from the signal processing unit 17, for example, the PCWA 110 code. Furthermore, the channel decoding unit 18 performs channel decoding of the channel code which is the frame data extracted from the frame. Then, the channel decoding unit 18 supplies the frame data (the row data to which the DCC bit is added) obtained by channel decoding to the DCC deleting unit 19, and the process proceeds from step S23 to step S24.

In step S24, the DCC deleting unit 19 deletes the DCC bits from the frame data from the channel decoding unit 18, supplies the row data obtained as a result to the ECC processing unit 20, and the process proceeds to step S25.

In step S25, the ECC processing unit 20 collects the row data from the DCC deleting unit 19 to configure an ECC block. Furthermore, the ECC processing unit 20 corrects the error of the ECC block by applying the ECC process to the ECC block by using the parity included in the ECC block and outputs the user data included in the ECC target data of the ECC block.

Hereinafter, similar processes are performed, so that the user data is reproduced from the optical disk 16 in units of RUB.

<Configuration Example of Signal Processing Unit 17>

Figure 4:
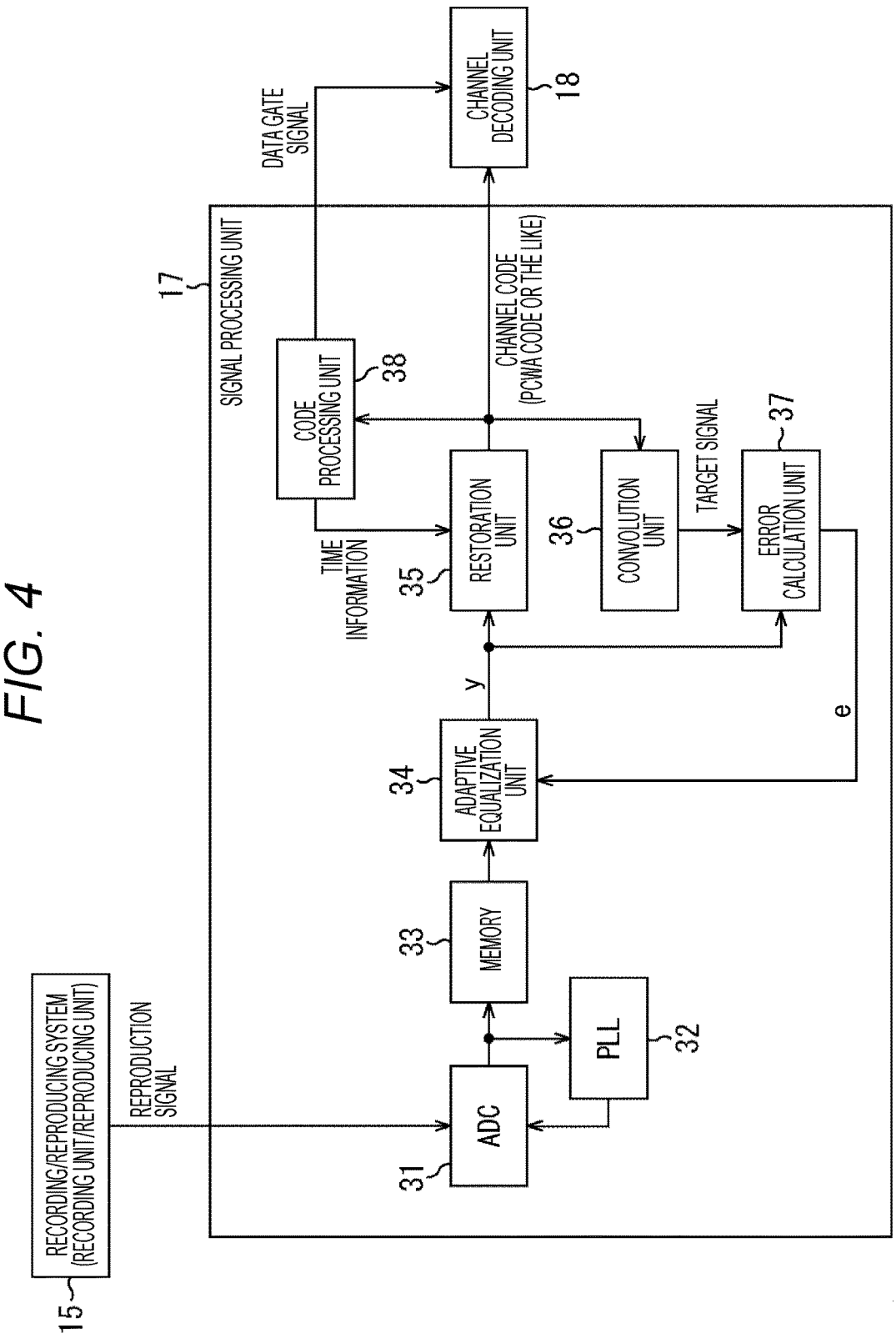
FIG. 4 is a block diagram illustrating a configuration example of a signal processing unit 17.

FIG. 4 is a block diagram illustrating a configuration example of the signal processing unit 17 in FIG. 1.

In FIG. 4, the signal processing unit 17 includes an analog to digital converter (ADC) 31, a phase lock loop (PLL) 32, a memory 33, an adaptive equalization unit 34, a restoration unit 35, a convolution unit 36, an error calculation unit 37, and a code processing unit 38.

A reproduction signal is supplied from the recording/reproducing system 15 to the ADC 31. The ADC 31 performs AD conversion of the analog reproduction signal from the recording/reproducing system 15 in synchronization with the channel clock supplied from the PLL 32 and supplies the resulting digital reproduction signal to the PLL 32 and the memory 33.

The PLL 32 generates a clock synchronized with the reproduction signal from the ADC 31 as a channel clock and supplies the clock to the ADC 31 and other necessary blocks constituting the recording/reproducing apparatus.

The memory 33 temporarily stores, for example, the signal components rs0, rs1, and rs2 as the reproduction signals supplied from the ADC 31.

Herein, as described with reference to FIG. 1, the signal component rs0 is a signal component mainly corresponding to the reflected light from the reproduction target track TK0. In addition, the signal component rs1 is a signal component mainly corresponding to the reflected light from the track TK1 adjacent to one of the inner circumference and the outer circumference of the track TK0, and the signal component rs2 is a signal component mainly corresponding to the reflected light from the track TK2 adjacent to the other of the inner circumference and the outer circumference of the track TK0.

The adaptive equalization unit 34 adaptively equalizes the reproduction signal stored in the memory 33 and supplies an equalized signaly obtained by equalizing the reproduction signal such as a partial response (PR) signal obtained from a desired PR channel to the restoration unit 35 and the error calculation unit 37.

Herein, the error e of the equalized signal y is supplied from the error calculation unit 37 to the adaptive equalization unit 34. The equalization of the reproduction signal in the adaptive equalization unit 34 is adaptively performed so as to reduce the error e from the error calculation unit 37.

In addition, the adaptive equalization unit 34 obtains the equalized signal y, for example, by independently equalizing the signal components rs0, rs1, and rs2 as the reproduction signal stored in the memory 33 and adding the equalization results of the signal components rs0, rs1, and rs2.

In addition, in the equalization of the reproduction signal in the adaptive equalization unit 34, the signal components rs0, rs1, and rs2 as the reproduction signal are not independently equalized, but the signal obtained by synthesizing (adding) the signal components rs0, rs1, and rs2 can be equalized.

The restoration unit 35 restores the PCWA 110 code (the frame thereof) or the like, which is a channel code, from the equalized signal y by performing the maximum likelihood decoding or the like of the equalized signal y from the adaptive equalization unit 34 and supplies the decoding result to the channel decoding unit 18 and also supplies the decoding result to the convolution unit 36 and the code processing unit 38.

Herein, the restoration unit 35 restores the FS by performing and the maximum likelihood decoding according to the time-varying trellis in which the state and the state transition are limited for the FS according to the time only in the maximum likelihood decoding of the FS at the head of the frame among the maximum likelihood decoding of the equalized signal y.

In addition, with respect to the maximum, likelihood decoding of portions other than the FS, the time-varying trellis for the portions can be prepared, and the maximum likelihood, decoding can be performed according to the time-varying trellis.

In addition, the restoration of the PCWA 110 code other than the FS in the restoration unit 35 can be performed by a method other than the maximum likelihood decoding, that is, for example, binarization by a threshold value process or the like.

The convolution unit 36 generates a target signal as a target of the equalized signal y which is the equalization result of the adaptive equalization unit 34 by convoluting the restoration result from the restoration unit 35 with an impulse response of a desired PR channel and supplies the target signal, to the error calculation unit 37.

The error calculation unit 37 obtains an error e of the equalized signal y from the adaptive equalization unit 34 with respect to the target signal from the convolution unit 36 and supplies the error to the adaptive equalization unit 34.

Herein, for example, the Run_in included in the RUB recorded on the optical disk 16 is a known pattern. The target signal of the equalized signal y obtained by equalizing the reproduction signal of the known pattern can be obtained by convolution of the known pattern with the impulse response of the desired PR channel as well as the convolution of the restoration result restored from the equalized signal y with the impulse response of the desired PR channel. The target signal of the equalized signal y obtained by equalizing the reproduction signal of the known pattern can be obtained by using the known pattern instead of the restoration result restored from the equalized signal y.

The code processing unit 38 generates time information to be used for the maximum likelihood decoding according to the time-varying trellis in the restoration unit 35 by processing the restoration result from the restoration unit 35 and supplies the time information to the restoration unit 35. In the restoration unit 35, the maximum likelihood decoding of the FS is performed by using the time information from the code processing unit 38.

In addition, the code processing unit 38 generates a data gate signal according to the restoration result from the restoration unit 35 and supplies the data gate signal to the channel decoding unit 18.

<Configuration Example of Adaptive Equalization Unit 34>

Figure 5:
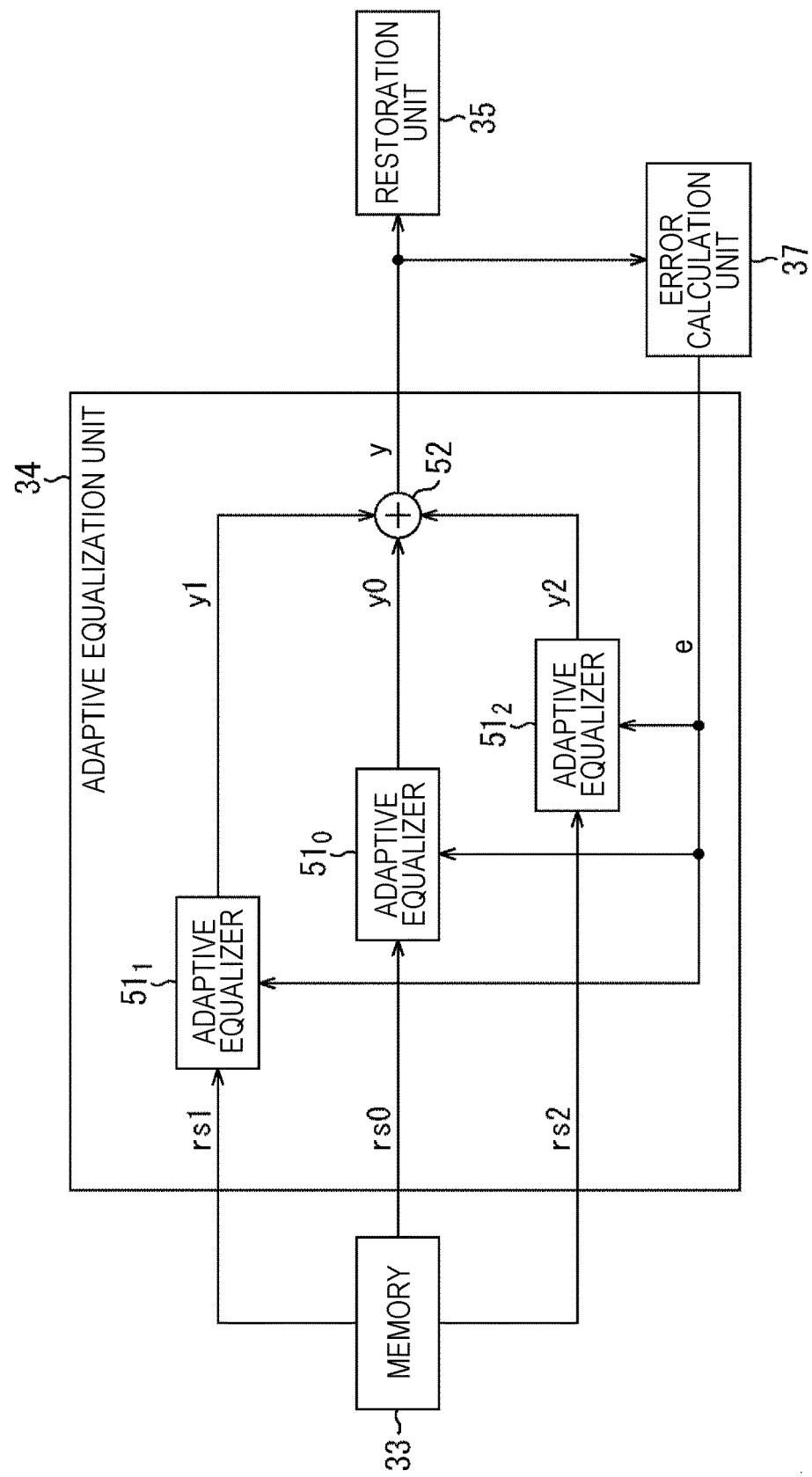
FIG. 5 is a block diagram illustrating a configuration example of an adaptive equalization unit 34.

FIG. 5 is a block diagram illustrating a configuration example of the adaptive equalization unit 34 in FIG. 4.

In FIG. 5, the adaptive equalization unit 34 includes three adaptive equalizers $51_0$, $51_1$ and $51_2$, the number of which is the same as the number of the signal components rs0, rs1, and rs2 of the reproduction signal output from the recording/reproducing system 15, and an addition unit 52.

In the adaptive equalizer $51_i$ (i=0, 1, and 2 in FIG. 5), the signal component rs#i is supplied from the memory 33. The adaptive equalizer $51_i$ is configured with, for example, an FIR (Finite Impulse Response) filter and performs equalization by filtering the signal component rs#i from the memory 33 with the FIR filter. The adaptive equalizer $51_i$ supplies an equalized component y#i which is an equalization result of the signal component rs#i to the addition unit 52.

In addition, an error e of the equalized signal y with respect to the target signal is supplied from the error calculation unit 37 to the adaptive equalizer $51_i$. The adaptive equalizer $51_i$ adaptively equalizes the signal component rs#i by adjusting the tap coefficient of the FIR filter that performs equalization by, for example, −e×a (a is a predetermined coefficient) according to the error e from the error calculation unit 37.

That is, by adjusting the tap coefficient of the FIR filter by −e×a, the adjusted tap coefficient is set so as to reduce the square error of the equalized signal y with respect to the target signal.

Therefore, in the adaptive equalizer $51_i$, the equalization of the signal component rs#i is performed by using the tap coefficient that reduces the error e between the equalized signal y and the target signal.

In the adaptive equalization unit 34 configured as described above, XTC (crosstalk cancellation) is performed as follows.

That is, in the adaptive equalizer $51_i$, the tap coefficient of the FIR filter is set according to the error e from the error calculation unit 37. Furthermore, in the adaptive equalizer $51_i$, the signal component rs#i is independently equalized by being filtered by the FIR filter.

Then, in the addition unit 52, the equalized components y#0 to y#2 which are the equalization results of the signal components rs#0 to rs#2 obtained in the adaptive equalizers $51_0$ to $51_2$ are added, so that the crosstalk component is removed from the reproduction signal from the optical disk 16, and thus, an equalized signal y can be obtained as if the signal passed through the desired PR channel.

Herein, in the adaptive equalizer $51_i$, the process of adjusting the tap coefficient of the FIR filter so that the error e of the equalized signal y becomes smaller as described above is also referred to as learning of XTC. In the learning of XTC, since the tap coefficient is adjusted so as to reduce the square error of the equalized signal y with respect to the target signal as described above, the learning of XTC is least mean square (LMS) learning.

<Configuration Example of Code Processing Unit 38>

Figure 6:
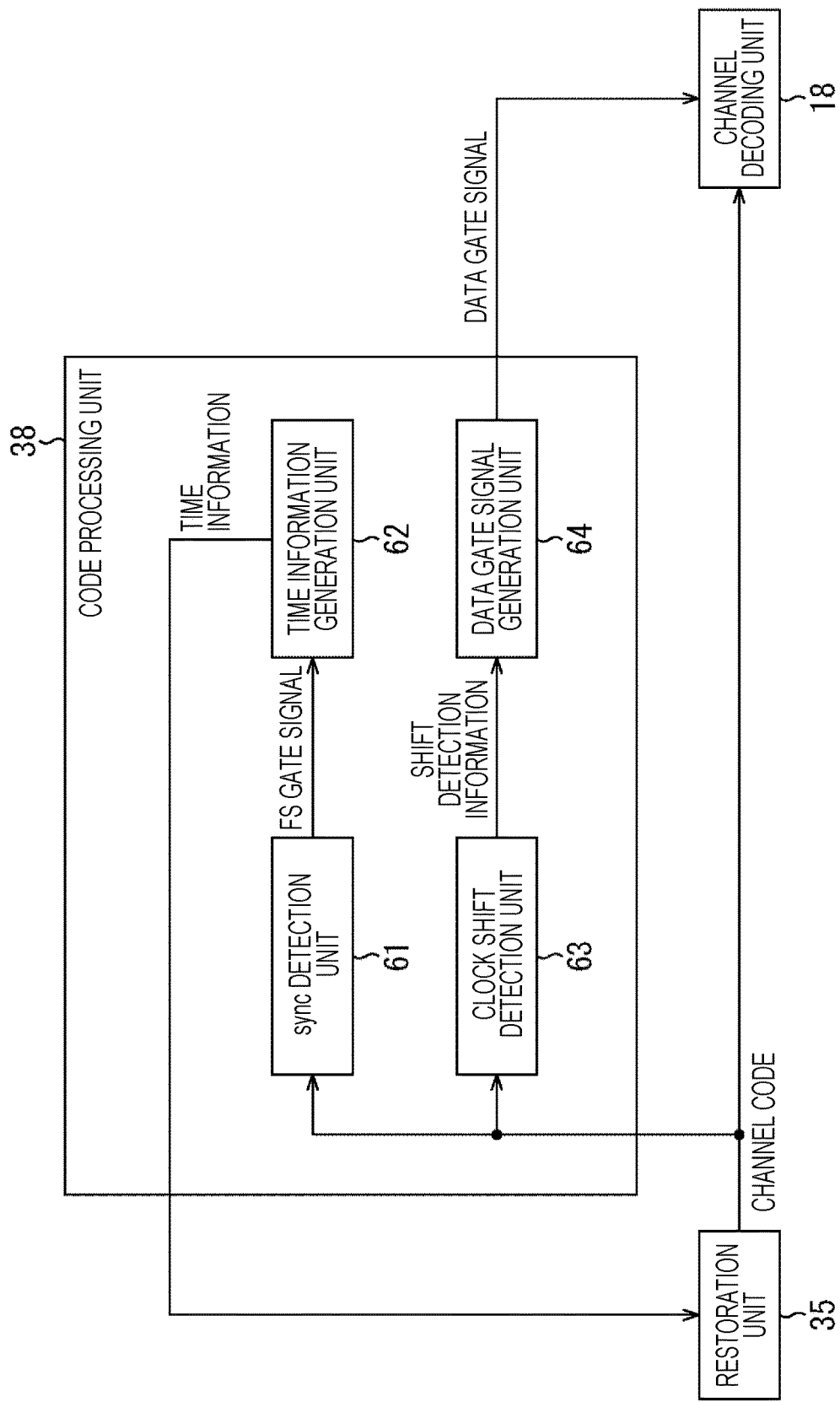
FIG. 6 is a block diagram illustrating a configuration example of a code processing unit 38.

FIG. 6 is a block diagram illustrating a configuration example of the code processing unit 38 in FIG. 4.

In FIG. 6, the code processing unit 38 includes a sync detection unit 61, a time information generation unit 62, a clock shift detection unit 63, and a data gate signal generation unit 64.

The PCWA 110 code or the like as a restoration result is supplied from the restoration unit 35 to the sync detection unit 61.

The sync detection unit 61 detects a predetermined pattern such as the synchronization pattern syn0 for synchronizing from the restoration result of the restoration unit 35 and generates an FS gate signal representing a section of the FS at the head of a frame included in the equalized signal y supplied from the adaptive equalization unit 34 to the restoration unit 35 according to the detection result. Then, the sync detection unit 61 supplies the FS gate signal to the time information generation unit 62.

The time information generation unit 62 recognizes the position (timing, section) of the FS from the FS gate signal from the sync detection unit 61. Furthermore, the time information generation unit 62 counts the time based on the position of the FS as a reference in synchronization with the channel clock generated by the PLL 32 and supplies the time as the time information to the restoration unit 35.

The restoration result is supplied from the restoration unit 35 to the clock shift detection unit 63.

The clock shift detection unit 63 detects the clock shift of the channel clock (the positional shift of the data reproduced from the optical disk 16 caused by the clock shift) according to the FS (the restoration result) of the restoration result from the restoration unit 35. Furthermore, the clock shift detection unit 63 supplies the shift detection information indicating the detection result of the clock shift to the data gate signal generation unit 64.

The data gate signal generation unit 64 generates a data gate signal representing a section of frame data subsequent to the FS at the head of the frame according to the shift detection information from the clock shift detection unit 63 and supplies the data gate signal to the channel decoding unit 18.

<ECC Block>

Figure 7:
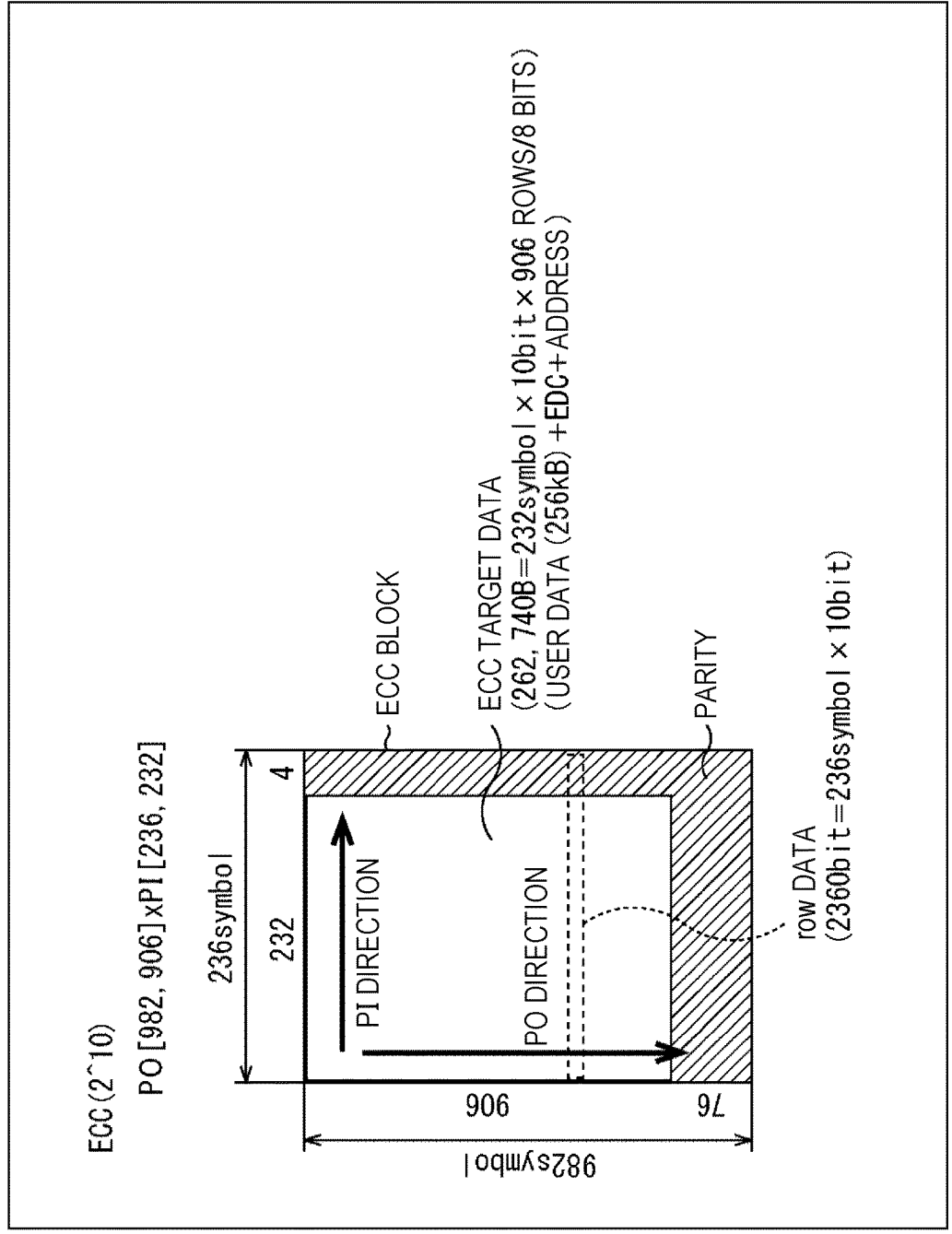
FIG. 7 is a diagram illustrating an example of an ECC-block configured by an ECC processing unit 11.

FIG. 7 is a diagram illustrating an example of an ECC block configured with the ECC processing unit 11 of FIG. 1.

The ECC processing unit 11 scrambles user data of, for example, 256 kB (kilo byte) with EDC (Error Detection Code) being included and adds an address to the scrambling result, so that the data of 262,740 B (Byte) is configured as an ECC target data.

Herein, for example, assuming that one symbol is 10 bits, the ECC processing unit 11 configures an ECC target data of 232×906 symbols in terms of horizontal×vertical symbols. In a case where one symbol is 10 bits, the ECC target data of 232×906 symbols is data of 262,740 B=232 symbols×10 bits×906 rows/8 bits as described above.

For example, the ECC processing unit 11 configures a 236×982-symbol ECC block by adding, for example, 4-symbol parity (parity inner (PI)) to each row of the 232×906-symbol ECC target data, and adds 76-symbol parity (parity outer (PO)) to each column. The ECC block configured by the ECC processing unit 11 is a product code of 10-bit symbols ($2^{10}$ Galois field).

The symbol sequence of one row of the ECC block is 2360 dbits (data bit)=236 symbols×10 bits. Assuming that the 2,360-dbits data in this one row is set to the row data, the ECC block is divided into the row data and recorded on the optical disk 16.

<Frame>

Figure 8:
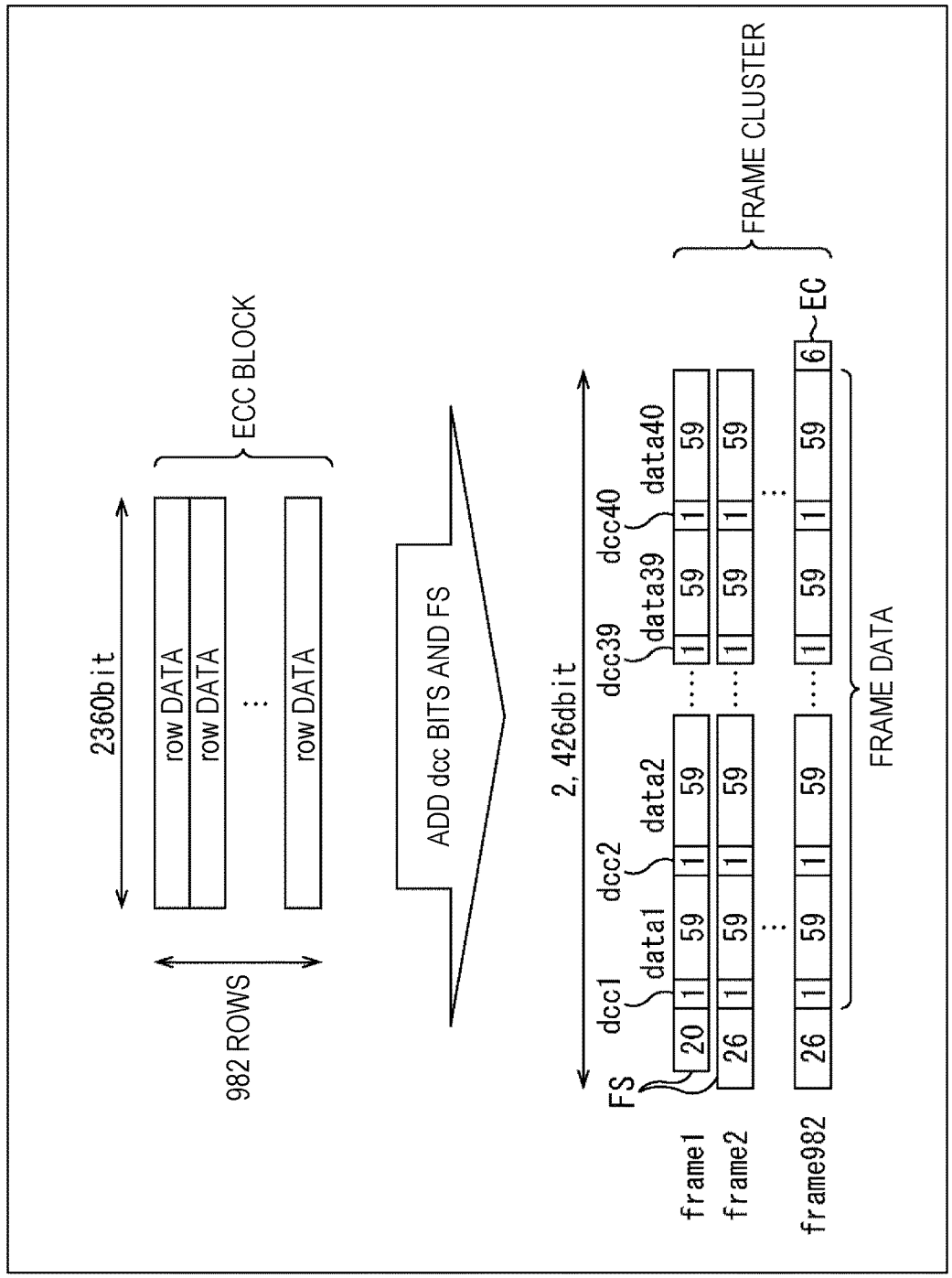
FIG. 8 is a diagram illustrating an example of a frame configured by a DCC adding unit 12.

FIG. 8 is a diagram illustrating an example of a frame configured by the DCC adding unit 12 in FIG. 1.

The DCC adding unit 12 divides the ECC block into row data which is one row of 2,360-dbit data.

Furthermore, the DCC adding unit 12 divides each row data divided from the ECC block into 40 59-dbit data data 1 to data 40. Then, the DCC adding unit 12 adds 1-bit DCC bit dcc#i to the head of each data data#i (i=1, 2, . . . , and 40 in FIG. 8). With this arrangement, a 2,400-dbit frame data is configured with the of the 2,360-dbit row data.

The 2,400-dbit frame data is configured with 40 sets of the data data#i and the DCC bit dcc#i.

The DCC adding unit 12 adds the FS to the head of the frame data, so that the FS is arranged at the head, and thus, a frame frame#i in which the frame data is arranged to be subsequent to the FS is configured.

Since one ECC block is configured with 982 rows of row data, the 982 frames frame 1 to frame 982 are configured from one ECC block.

The FS is a 26-dbit pattern, so that one frame frame#i is a 2,426-dbit data including a 26-dbit FS and a 2,400-dbit frame data.

However, among the 982 frames frame 1 to frame 982 obtained from one ECC block, as the FS of the first one frame frame 1, the 20-dbit FS without the first 6 dbits of the 26-dbit FS is adopted.

For this reason, among the 982 frames frame 1 to frame 982 obtained from one ECC block, only the first one frame frame 1 becomes 2,420-dbit data.

The DCC adding unit 12 adds the end code (EC) as a 6T (6 dbit) data to be described later, which constitutes the FS, to the end of the last frame frame 982 among the 982 frames frame 1 to frame 982 obtained from one ECC block.

With this arrangement, the DCC adding unit 12 configures a frame cluster including 982 frames frame 1 to frame 982 and the EC and supplies the frame cluster to the channel coding unit 13 (FIG. 1).

<RUB>

Figure 9:
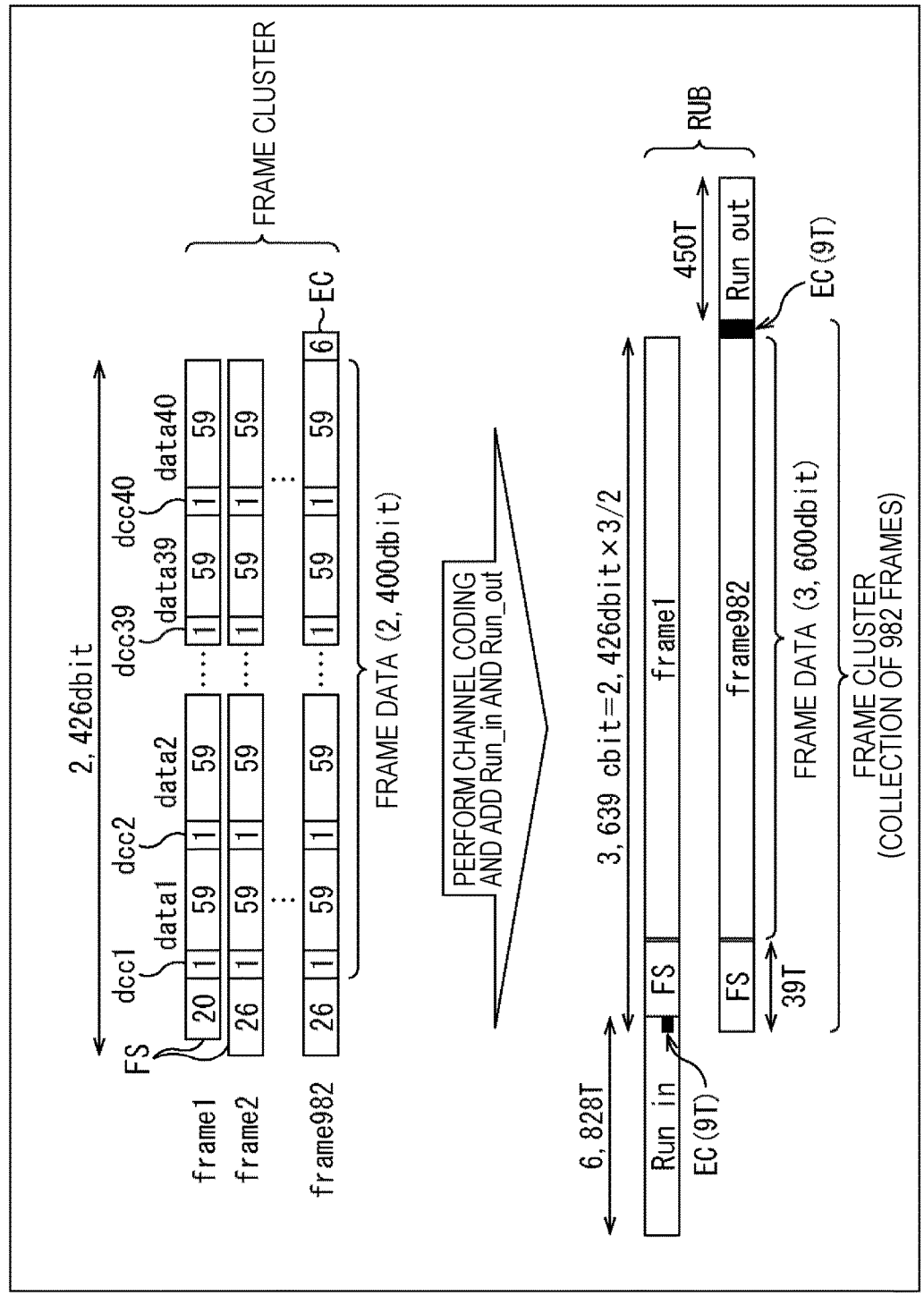
FIG. 9 is a diagram illustrating an example of an RUB configured by an RUB configuring unit 14.

FIG. 9 is a diagram illustrating an example of the RUB configured by the RUB configuring unit 14 in FIG. 1.

The channel coding unit 13 channel-codes the frame cluster supplied from the DCC adding unit 12 into, for example, a PCWA 110 code or the like. Since the PCWA 110 code is a code with a coding rate of 2/3 as described with reference to FIG. 1, the size (the number of bits) of the frame cluster after the channel coding becomes 3/2 times the size before the channel coding.

That is, the size of each of the frames frame 2 to frame 982 other than the leading frame frame 1 constituting the frame cluster becomes 3,639 cbits (channel bits) which is 3/2 times of 2,426 dbits. In addition, the size of the FS at the head of each of the frames frame 2 to frame 982 becomes 39T (39 cbits) which is 3/2 times of 26 dbits.

The size of the leading frame frame 1 constituting the frame cluster becomes 3,630 cbits which is 3/2 times 2,420 dbits. In addition, the size of the FS at the head of the frame frame 1 becomes 30T (30 cbits) which is 3/2 times of 20 dbits.

The size of the EC constituting the frame cluster becomes 9T (9 cbit) which is 3/2 times of 6T (6 dbits).

Herein, the size of the leading frame frame 1 constituting the frame cluster is 3,630 cbits, which is smaller by the 9-dbit EC than the size of 3,639 cbits of the other frame.

However, since the 9-dbit EC is arranged at the end of the frame cluster, and eventually, the size of the frame cluster configured with 982 frames frame 1 to frame 982 and the EC is 3,573,498 cbits (=3,639 cbits×982 bits), which is the size of 982 pieces of 3,639-cbit frames.

The frame cluster coded into the PCWA 110 code by the channel coding unit 13 is supplied to the RUB configuring unit 14.

The RUB configuring unit 14 configures an RUB by adding a Run_in representing the head of the RUB and a Run_out representing the end of the RUB to the head and the end of the frame cluster from the channel coding unit 13, respectively.

The size of the Run_in becomes 6,828T, and the size of Run_out becomes 450T. Herein, the total size of 6,828T+ 450T of the Run_in and the Run_out is equal to the size of 3,639 cbits×2 of the two 3,639-cbit frames.

In addition, the end of the Run_in is a 9T EC.

In addition, the head of the 39T FS at the head of each of the frames frame 2 to frame 982 becomes 9T EC as described later.

Since the RUB is configured by adding the Run_in to the head of the frame cluster, in the RUB, the leading frame frame 1 of the frame cluster is arranged to be subsequent to the Run_in.

There is no 9T EC at the head of the 39T FS of other frames (frame 2 to frame 982) in the 30T FS of the frame frame 1, but since the EC is arranged at the end of the Run_in, if the last EC of the Run_in is considered, the 39T FS is arranged at the head of the frame frame 1, similarly to the other frames.

<PCWA 110 Code>

FIG. 10 is a diagram illustrating the outline of the PCWA 110 code.

That is, FIG. 10 is a diagram illustrating a code table and a substitution table used for the coding (PCWA 110 coding) into the PCWA 110 code.

In the PCWA 110 coding, there are five coding states S1, S2, S3, S4, and S5, and the PCWA 110 code is determined according to the current coding state in addition to the information bits to be coded.

The determination of the PCWA 110 code is performed according to the code table.

In the code table of FIG. 10, the leftmost column represents 2-bit information bits 00, 01, 10, and 11 to be coded by the PCWA 110. The numbers in parentheses subsequent to the 2-bit information bits are the decimal notation of the 2-bit information bits.

In the code table of FIG. 10, the uppermost row represents the current coding state (possible states) S1, S2, S3, S4, and S5.

In the code table, a site in the C-th column from the left and the R-th row from the top is also referred to as a site (C, R).

In addition, the PCWA 110 code is represented by the NRZI representation unless otherwise noted.

For example, in a case where the current coding state is S1, if the information bit 00 is subject to the PCWA 110 coding, the information bit 00 is coded into the PCWA 110 code 000 described in the site (2, 2) according to the site (2, 2) of the coding table in which the coding state is the column (the second column) of the current state S1 and the information bit is the row (the second row) of 00.

Furthermore, the coding state transitions from the current state S1 toward the state S3 described in the site (2, 2).

For example, in a case where the next information bit to be subject to the PCWA 110 coding is, for example, 00 similarly to the previous case, the information bit 00 is coded into the PCWA 110 code 010 described in the site (4, 2) according to the site (4, 2) of the coding table in which the coding-state is the column (the fourth column) of the current state S3 and the information bit is the row (the second row) of 00.

Furthermore, the coding state transitions from the current state S3 toward the state S3 described in the site (4, 2).

Similarly, hereinafter, the PCWA 110 coding is performed according to the code table according to the current coding state.

However, in the PCWA 110 coding, in a case where a specific condition is satisfied, code sequence substitution is performed to substitute the code sequence of the PCWA 110 code determined according to the code table.

Code sequence substitution is performed according to the substitution table.

In the substitution table of FIG. 10, the departure state represents the state at the time of starting the PCWA 110 coding of certain 6-bit information bit (the sequence thereof), the arrival state represents the state arriving after the PCWA 110 coding of the 6-bit information bit.

In a case where the departure state is the (coded) state S1, according to the code table, all the 6-bit information bits 10 10 10, 10 10 11, 10 10 00, and 10 10 01 are coded into the PCWA 110 code 000 000 000. In addition, the arrival states of the 6-bit of information bits 10 10 10, 10 10 11, 10 10 00, and 10 10 01 after the PCWA 110 coding becomes the states S2, S3, and S4, respectively.

In this case, according to the substitution table, the PCWA 110 code 000 000 000 of each of the 6-bit information bits 10 10 10, 10 10 11, 10 10 00, and 10 10 01 is replaced with the substitution code sequence 000 101 010.

In addition, in a case where the departure state is the state S5, according to the code table, all the 6-bit information bits 00 10 10, 00 10 11, 00 10 00, and 00 10 01 are coded into the PCWA 110 code 100 000 00 0. Furthermore, the arrival states of the 6-bit information bits 00 10 10, 00 10 11, 00 10 00, and 00 10 01 after the PCWA 110 coding become the states S1, S2, S3, and S4, respectively.

In this case, according to the substitution table, each of the PCWA 110 codes 100 000 000 of the 6-bit information bits 00 10 10, 00 10 11, 00 10 00, and 00 10 01 is replaced with the substitution code sequence 100 101 010.

<FS>

Figure 11:
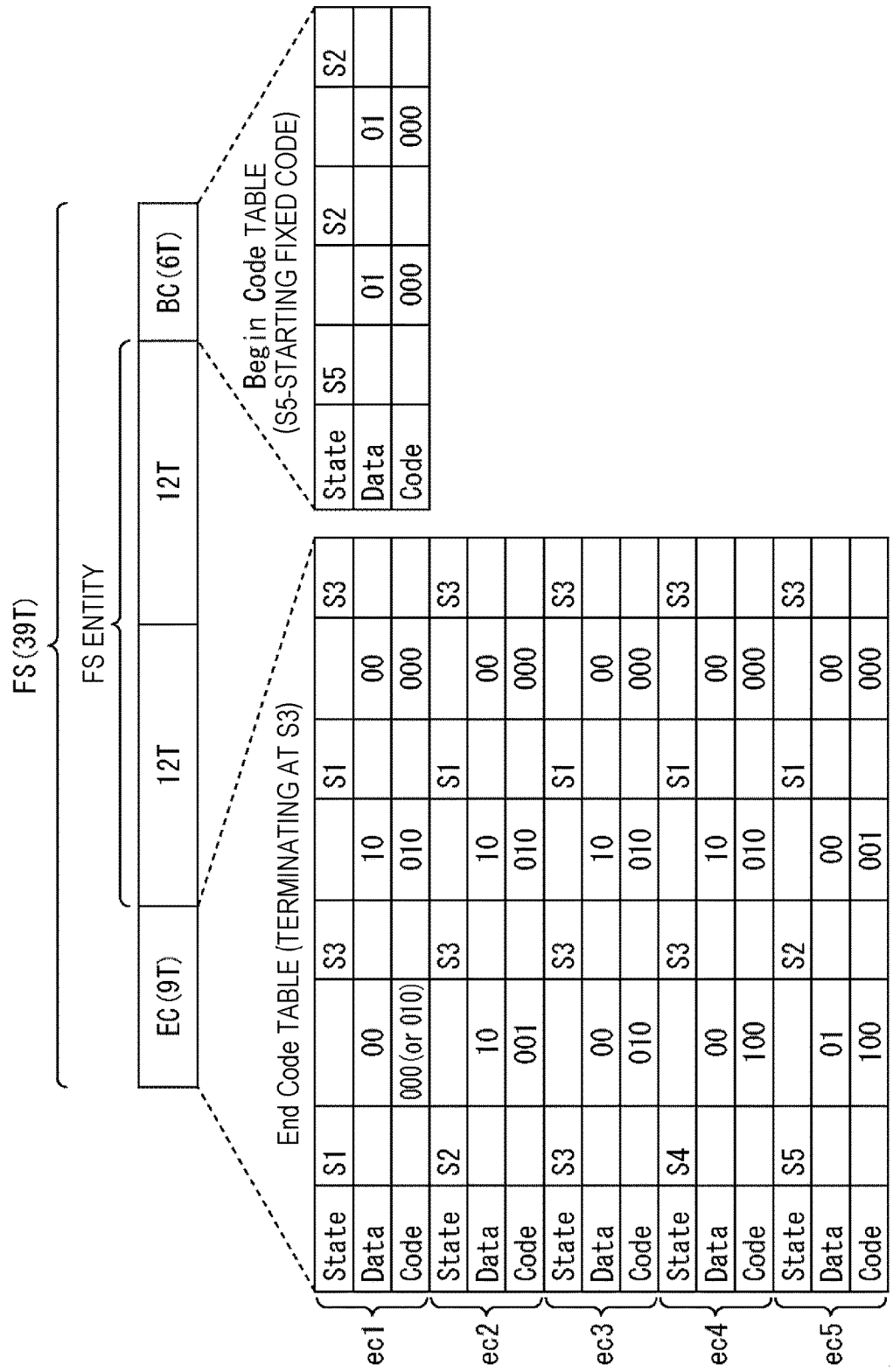
FIG. 11 is a diagram illustrating a configuration example of a 39T FS.

FIG. 11 i s a diagram illustrating a configuration example of the 39T FS of FIG. 9.

The 39T FS (FS after the PCWA coding or the like of the frames frame 2 to frame 982) is configured such that a 9T EC, an FS entity including two 12T data, and a 6T begin code (BC) are arranged in this order.

In addition, the 30T FS (FIG. 9) in the frame frame 1 is configured such that there is no 9T EC at the head of the 39T FS.

In FIG. 11, an end code (EC) table illustrates a pattern to be an EC, and a begin code (BC) table illustrates a pattern to be a BC. The EC and the BC are patterns having runs that satisfy the code rule of the PCWA 110 code (a kind of a (d, k) RLL code) as a channel code.

That is, the EC is a 9T pattern that terminates the coding state of the PCWA 110 coding from possible states S1 to S5 (FIG. 10) to a specific one state.

In FIG. 11, the state S3 is adopted as a specific one state. In addition, the specific one state is not limited to the state S3.

In the PCWA 110 coding of the data immediately before the EC, in a case where the coding state becomes the state S1, as illustrated in the ec1 of the EC table, as the 9T EC (the EC (code) after the PCWA 110 coding), 000 010 000 is adopted.

In a case where the coding state departs from the state S1, the 000 010 000, which is the EC after the PCWA 110 coding is obtained by the PCWA 110 coding of the 6-bit information bit (data) 00 10 00. In this PCWA 110 coding, the coding state transitions from the state S1 toward the states S3, S1, and S3 in this order and terminates (ends) in the state S3.

In the PCWA 110 coding of the data immediately before the EC, in a case where the coding state becomes the state S2, 001 010 000 is adopted as the 9T EC (code) as illustrated in the ec2 of the EC table.

In a case where the coding state departs from the state S2, 001 010 000, which is the EC after the PCWA 110 coding, is obtained by the PCWA 110 coding of 6-bit information bit (data) 10 10 00. In this PCWA 110 coding, the coding state transitions from the state S2 toward the states S3, S1, and S3 in this order and terminates to the state S3.

In the PCWA 110 coding of the data immediately before the EC, in a case where the coding state becomes the state S3, 010 010 000 is adopted as the 9T EC (code) as illustrated in the ec3 of the EC table.

In a case where the coding state departs from the state S3, 010 010 000, which is the EC after the PCWA 110 coding, is obtained by the PCWA 110 coding of 6-bit information bit (data) 00 10 00. In the PCWA 110 coding, the coding state transitions from the state S3 toward the states S3, S1, and S3 in this order and terminates to the state S3.

In the PCWA 110 coding of the data immediately before the EC, in a case where the coding state becomes the state S4, 100 010 000 is adopted as the 9T EC (code) as illustrated in the ec4 of the EC table.

In a case where the coding state departs from the state S4, 100 010 000, which is the EC after the PCWA 110 coding, is obtained by the PCWA 110 coding of 6-bit information bit (data) 00 10 00. In this PCWA 110 coding, the coding state transitions from the state S4 toward the states S3, S1, and S3 in this order and terminates to the state S3.

In the PCWA 110 coding of the data immediately before the EC, in a case where the coding state becomes the state S5, 100 001 000 is adopted as the 9T EC (code) as illustrated in the ec5 of the EC table.

In a case where the coding state departs from the state S5, 100 001 000, which is the EC after the PCWA 110 coding, is obtained by the PCWA 110 coding of the 6-bit information bit (data) 01 00 00. In this PCWA 110 coding, the coding state transitions from the state S5 toward the state S2, S1, S3 in this order and terminates to the state S3.

In addition, in the PCWA 110 coding of the data immediately before the EC, in a case where the coding state becomes the state S1, by the PCWA 110 coding of the first 2-bit information bit 00 of the 6-bit information bit (data) 00 10 00 illustrated in the ec1 of the EC table, the coding state transitions from the state S1 toward the state S3 according to the coding table (FIG. 10).

In this case, in the PCWA 110 coding of the data immediately before the EC, when the coding state transitions in the order of the states S1, S3, and S1, thereafter, after the PCWA 110 coding of the first 2-bit information bit 00 of the EC, the coding state transitions toward the state S3.

In a case where the transition of the coding state occurs as described above, since the departure state is the state S1 and the arrival state is the state S3, in the PCWA 110 coding in which the transition from the departure state S1 toward the arrival state S3 (in order of states S1, S3, S1, and S3) occurs, the PCWA 110 code 000 000 000 may be obtained.

In this case, the PCWA 110 code 000 000 000 is replaced with the substitution code sequence 000 101 010, as illustrated in the substitution table (the fourth row from the top of FIG. 10).

According to the replacement with the substitution code sequence 000 101 010, the PCWA 110 code 000 (the first PCWA 110 code 000 illustrated in the ec 1 of the EC table) obtained by the PCWA 110 coding of the information bits 00 of the first 2-bit EC is replaced by the last 3-bit 010 of the substitution code sequence 000 101 010.

Therefore, in the PCWA 110 coding of the data immediately before the EC, in a case where the coding state becomes the state S1, in a case where replacement with the substitution code sequence 000 101 010 is not performed, as described above, the 9T EC (Code) becomes 000 010 000. However, in a case where replacement with the substitution code sequence 000 101 010 is performed, the 9T EC (Code) becomes 010 010 000 in which the first 3 bits 000 of 000 010 000 are replaced with the last 3 bits 010 of the substitution code sequence 000 101 010.

Therefore, in the PCWA 110 coding of the data immediately before the EC, in a case where the coding state becomes the state S1, there are cases where the EC becomes 000 010 000 and 010 010 000.

In the EC described above, the last run is a pattern of 4 or 3 in the NRZI representation (5T or 4T in the NRZ representation).

That is, in the EC table, with respect to the ECs illustrated in ec 1 to ec 4 become patterns in which the last run is 4 (5T in the NRZ representation), and the EC illustrated in ec 5 becomes a pattern in which the last run is 3 (4T in the NRZ representation).

BC is a 6T pattern which the coding state of the PCWA 110 coding is started from a predetermined one among the possible states S1 to S5 (FIG. 10).

In FIG. 11, the state S5 is adopted as a predetermined one state. In addition, the predetermined one state is not limited to the state S5.

Then, 100 001 is adopted as the 6T BC (the BC (Code) after the PCWA 110 coding).

The PCWA 110 code 100 001 as the BC is a pattern with the first run of 4 (5T in the NRZ representation).

In a case where the coding state departs from the state S5, 100 001, which is the BC after the PCWA 110 coding, is obtained by the PCWA 110 coding of the 4-bit information bits (data) 01 01. In this PCWA 110 coding, the coding state transitions from the state S5 toward the states S2 and S2 in this order.

In addition, according to the BC as described above, since the coding state is the state S2 at the time of performing the PCWA 110 coding of the data immediately after the BC, according to the coding table (FIG. 10), the BC is coded into the PCWA 110 code 001 or 000.

Therefore, a pattern with a run of at least 2 or 3 (3T or 4T in NRZ representation) is subsequent to the BC.

As illustrated in FIG. 9, the FS is arranged at the head of the frame, and the EC is arranged after the last frame frame 982. Therefore, immediately before the frame data subsequent to the FS of the frame, the last BC of the FS exists; and immediately after the frame data, the first EC of the FS of the next frame or the EC arranged after the last frame frame 982 exists.

Therefore, the frame data is interposed between the BC and the EC, and the RUB has a data structure in which the BC, the frame data, and the EC are aligned in this order. In the data structure in which the BC, the frame data, and the EC are aligned in this order, the coding state departs from the state S5 and terminates to the state S3.

As described above, in the frame data constituting the data structure starting from the fixed state and terminating to the fixed state, the relationship between the number of edges of the frame data before the PCWA 110 coding, that is, the oddity of the number of 1 in the NRZI representation and the oddity of the number of edges of the frame data after the PCWA 110 coding becomes constant.

That is, in a case where the number of edges of the frame data before the PCWA 110 coding is odd, the number of edges of the frame data after the PCWA 110 coding becomes even. In addition, in a case where the number of edges of the frame data before the PCWA 110 coding is even, the number of edges of the frame data after the PCWA 110 coding becomes odd.

Therefore, the DC control can be performed by adding the DCC bit to the frame data (row data) before the PCWA 110 coding.

The FS entity is a pattern in which the runs larger than the maximum run k=10 (11T in the NRZ representation) of the PCWA 110 code are repeated, and in FIG. 11, for example, a pattern in which a pattern of 12T run larger by 1T than the maximum run k=11T of the PCWA 110 code is repeated twice is adopted as the FS entity.

In addition, for example, a pattern in which a pattern in which a 12T-run pattern is repeated three times or more or a pattern in which a run pattern larger than 12T is repeated twice or more may be adapted as the FS entity.

The FS has a data structure in which an FS entity having a run of 12T is interposed between an EC having a run of 4T or 5T which is about a half of 12T and a BC having a run of 5T. According to such a data structure, it is possible to suppress the disorder of the waveform of the reproduction signal of the FS entity due to the influence of intersymbol interference (ISI) from the EC before the FS entity and the data before the EC, and the BC after the FS entity and the data after the BC, and it is possible to improve the detection performance of the FS entity and, consequently, the FS.

<Run_in>

Figure 12:
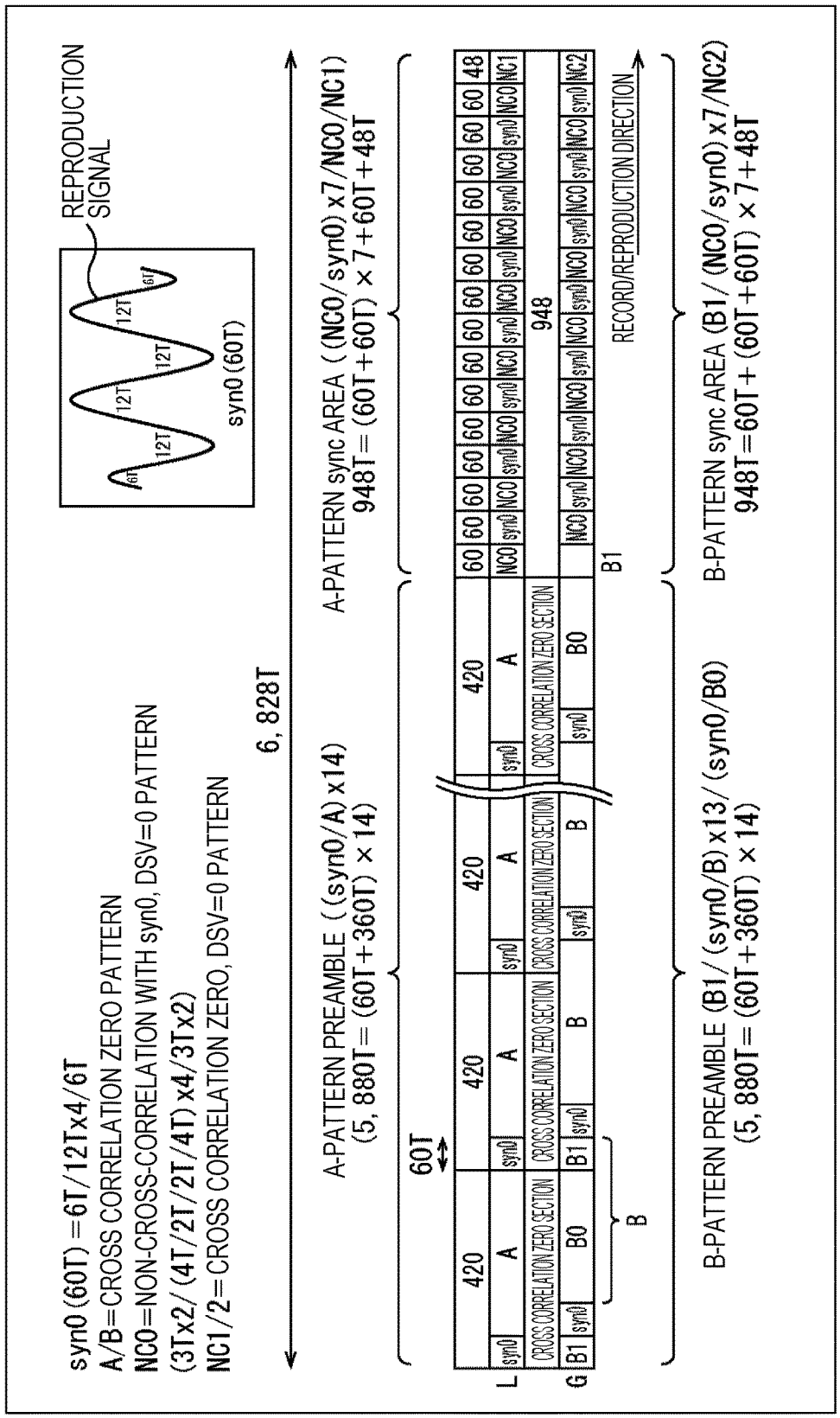
FIG. 12 is a diagram illustrating a configuration example of a 6,828T Run_in.

FIG. 12 is a diagram illustrating a configuration example of a 6,828T Run_in in FIG. 9.

Herein, an archival disc (AD) is proposed as an optical disk capable of recording data at a high density.

In the AD 1, if the Run_in of the same pattern in an adjacent form is recorded in the two adjacent land and groove, due to the polarity of the Run_in of the same pattern recorded in the adjacent land and groove, the reproduction signal of the Run_in is attenuated or emphasized. Therefore, in the AD 1, different patterns of the Run_in are recorded in adjacent lands and grooves in order to prevent attenuation and emphasis of the reproduction signal of the Run_in.

However, in the AD 1, since the Run_in recorded in the adjacent lands and grooves is not a pattern in which cross correlation is zero and is a short pattern with a size of 60 chits, in such Run_in, it is difficult to thoroughly perform the learning of XTC.

In addition, in such an AD 1, data is recorded at a higher-density, and it becomes difficult to robustly detect the synchronization pattern in the case of reproducing the data recorded at a high density in such a manner.

Furthermore, in the AD 1, the learning of XTC, gain recovery, and timing recovery are performed by using a reproduction signal of the Run_in and a reproduction signal of the user data.

Also, in the recording/reproducing apparatus of FIG. 1, similarly to the case of AD 1, the learning of XTC, the gain recovery, and the timing recovery may be performed by using the reproduction signal of the Run_in and the reproduction signal of the frame.

In a case where the learning of XTC, the gain recovery, the timing recovery, and the like are performed by using the reproduction signal of the Run_in or the frame, it is preferable that the reproduction signal of the Run_in is a signal having similar characteristics to those of the reproduction signal of the frame. This is because, in a case where the characteristics of the reproduction signal of the Run_in and the characteristics of the reproduction signal of the frame are largely different from each other, the learning of XTC and the like performed by using the reproduction signal of the Run_in and the learning of XTC and the like performed by using the reproduction signal of the frame are processed with significantly different tendencies. For example, as the tap coefficients of the FIR filter performing the XTC, significantly different tap coefficients are obtained in the learning of XTC performed by using the reproduction signal of the Run_in and the learning of XTC performed by using the reproduction signal of the frame, and with the tap coefficients obtained by the learning of XTC performed by using the reproduction signal of the Run_in, it is possible to appropriately perform the XTC immediately after the start of the reproduction of the frame data.

Herein, since particularly the frame data of the frame is configured with relatively random user data, the cross correlation between the frame data of the two adjacent tracks tends to be zero or a small value close to zero.

Therefore, as the Run_in of the two adjacent tracks, it is preferable to adopt a pattern in which the cross correlation becomes zero, similarly to the frame data of the two adjacent tracks.

Therefore, the Run_in of the optical disk 16 is configured such that the synchronization pattern is recorded in the two tracks adjacent to each other while being shifted by a certain shift amount in the track direction.

That is, FIG. 12 illustrates an example of the Run_in recorded on the two adjacent tracks of the optical disk 16.

In FIG. 12, the Run_in (hereinafter, also referred to as land Run_in) recorded on the land L and the Run_in (hereinafter, also referred to as groove Run_in) recorded on the groove G of any one of the inner circumference side and the outer circumference side of the land L are illustrated.

In the optical disk 16, the land L and at least one groove G on the inner circumference side and the outer circumference side of the land L are paired. In each pair of the land L and the groove R, the Run_in (and eventually the RUB) is recorded in the same positions in the track direction. FIG. 12 illustrates a Run_in as the pair of the land L and the groove G.

As described with reference to FIG. 9, the Run_in is a 6,828T pattern and is configured with 5,880T preambles and 948T sync areas arranged from the head thereof.

Herein, in FIG. 12, the preamble and sync area of the land Run_in are also referred to as an A-pattern preamble and an A-pattern sync area, respectively. In addition, the preamble and sync area of the groove Run_in are also referred to as a B-pattern preamble and a B-pattern sync area, respectively. In addition, the configurations of the land Run_in and the groove Run_in may be reversed. That is, the land Run_in may be configured with the B-pattern preamble and the B-pattern sync area, and the groove Run_in may be configured with the A-pattern preamble and the A-pattern sync area.

The Run_in has a synchronization pattern syn0. The synchronization pattern syn0 is a 60T pattern of 6T/12T×4/6T.

Herein, the following description, the pattern is appropriately represented by notation such as "6T/12T×4/6T" or the like. The "6T/12T×4/6T" represents a pattern in which a 6T run is arranged, followed by four 12T runs, and followed by a 6T run.

In the Run_in, the preamble is configured by alternately arranging a 60T synchronization pattern syn0 and an A-pattern or a B-pattern as a predetermined 360T pattern.

That is, the A-pattern preamble of the land Run_in is configured by alternately arranging the synchronization pattern syn0 and the A-pattern. The 16-pattern preamble of the groove Run_in is configured by alternately arranging the synchronization pattern syn0 and the B-pattern.

In addition, in the A-pattern preamble and the B-pattern preamble, the synchronization pattern syn0 is arranged to be shifted by 60T which is the length of the synchronization pattern syn0.

That is, the A-pattern preamble is configured so that, for example, only 14 sets of the 60T synchronization pattern syn0 and the 360T A-pattern are arranged from the head thereof. Therefore, the A-pattern preamble is a 5,880T=(60T+360T)×14 pattern.

In the B-pattern preamble, for example, only 13 sets of the 60T synchronization pattern syn0 and the 360T B-pattern are arranged from the position shifted by 60T which is the length of the synchronization pattern syn0 from the head thereof.

Furthermore, if a 60T pattern, of which length is the same as that of the synchronization pattern syn0, at the end of the B-pattern is referred to as a B1-pattern and a pattern of a portion other than the B1-pattern on the top side of the B-pattern is referred to as a B0-pattern, the B1-pattern is arranged at the head of the B-pattern preamble.

Then, in the B-pattern preamble, the synchronization pattern syn0 and the B0-pattern are arranged after 13 sets of the synchronization pattern syn0 and the B-pattern.

That is, the B-pattern preamble has a data structure in which a sequence of 14 sets of the synchronization pattern syn0 and the B-pattern is rotated toward the right by 60T which is the length of the synchronization pattern syn0.

Therefore, similarly to the A-pattern preamble, the B-pattern preamble is a 5,880T=(60T+360T)×14 pattern.

As described above, in the B-pattern preamble, the synchronization pattern syn0 is arranged at a position shifted from the position of the synchronization pattern syn of the A-pattern preamble by 60T which is the length of the synchronization pattern syn0.

For this reason, similarly to the synchronization pattern syn0, the B-pattern arranged in the B-pattern preamble is arranged at a position shifted from the position of the A-pattern arranged in the A-pattern preamble by 60T which is the length of the synchronization pattern syn0.

For example, the A-pattern and the B-pattern are, for example, PCWA 110 codes as 360-cbit (360T) channel codes on which the DC control is performed at a period of 90 cbits.

Furthermore, the A-pattern and the B-pattern are patterns in which the number of edges (the number of 1 in the NRZI representation) is an odd number and a terminating digital sum value (DSV) is zero.

Herein, the terminating DSV of the pattern is a total sum of all the bits constituting the pattern, which is obtained by setting 1 and 0 out of the bits constituting the pattern in the NRZ representation as +1 and −1, respectively.

The B-pattern is a pattern in which the cross correlation between the section of 420T of the synchronization pattern syn0 and the A-pattern and the section of the B-pattern preamble corresponding to the synchronization pattern syn0 and the A-pattern is zero. In this case, the cross correlation between the A-pattern preamble and the B-pattern preamble becomes zero in the section of 420T at an arbitrary position.

As described above, in a case where the cross correlation between the A-pattern preamble and the B-pattern preamble becomes zero in the section of 420T of the synchronization pattern syn0 and the A-pattern, the tendency of the DC component occurring in the preamble reproduction signal, the offset, the gain, and the like is similar to the tendency of the DC component and the like occurring in the reproduction signal of the frame data in which the cross correlation between the adjacent tracks tends to be zero or a small value close to zero.

That is, the reproduction signal of the preamble becomes a signal having similar characteristics to those of the reproduction signal of the frame data.

In the Run_in, the syncarea is configured by alternately arranging a 60T synchronization pattern syn0 and a 60T correlation zero pattern NC0 having zero cross correlation with the synchronization pattern syn0.

That is, the A-pattern sync area of the land Run_in is configured by alternately arranging the synchronization pattern syn0 and the correlation zero pattern NC0. The B-pattern sync area of the groove Run_in is configured by alternately arranging the synchronization pattern syn0 and the correlation zero pattern NC0.

In addition, in the A-pattern sync area and the B-pattern sync area, the synchronization pattern syn0 is shifted by 60T which is the length of the synchronization pattern syn0.

That is, in the A-pattern sync area, for example, only 7 sets of the 60T correlation zero pattern NC0 and the 60T synchronization pattern syn0 are arranged from the head thereof. Then, at the end of the A-pattern sync area, the 60T correlation zero pattern NC0 and the first pattern NC1 of 48T are arranged. Therefore, the A-pattern sync area is a 948T=(60T+60T)×7+60T+48T pattern.

In the B-pattern sync area, for example, only 7 sets of the 60T correlation zero pattern NC0 and the 60T synchronization pattern syn0 are arranged from the position shifted by 60T which is the length of the synchronization pattern syn0 or the correlation zero pattern NC0 from the head thereof.

Furthermore, in the B-pattern sync area, a 60T B1-pattern is arranged at the head thereof, and a second pattern NC2 of 48T is arranged at the end thereof.

Therefore, similarly to the A-pattern sync area, the B-pattern sync area is a 948T=60T+(60T+60T)×7+48T pattern.

The first pattern NC1 and the second pattern NC2 are the 48-cbit (48T) PCWA 110 code with zero cross correlation, and the pattern in which the terminating DSV is zero.

Furthermore, the last of the first pattern NC1 and the second pattern NC2 is the EC. Therefore, the Run_in terminates with the EC.

In addition, as described above, the B1-pattern is arranged at the head of the B-pattern sync area. As described, since the synchronization patterns syn0 and B0-patterns are arranged at the end of the B-pattern preamble before the B-pattern sync area, the B0-pattern and the B1-pattern, that is, the B-patterns are arranged after the synchronization pattern syn0, as viewed from the last synchronization pattern syn0 of the B-pattern preamble.

As described above, in the A-pattern sync area and the B-pattern sync area, similarly to the A-pattern preamble and the B-pattern preamble, the synchronization pattern syn0 is arranged at a position shifted by 60T which is the length of the synchronization pattern syn0.

As a result, the synchronization pattern syn0 of any one sync area of the A-pattern sync area and the B-pattern sync area is adjacent to the correlation zero pattern NC0 of the other sync: area, which has zero cross correlation with the synchronization pattern syn0.

Therefore, the reproduction signal of the sync area becomes a signal having similar characteristics to those of the reproduction signal of the frame data, similarly to the reproduction signal of the preamble.

From the above, the reproduction signal of the whole Run_in becomes a signal having similar characteristics to those of the reproduction signal of the frame data.

As a result, the process with the same tendency is performed between the learning of XTC and the like performed by using the reproduction signal of the Run_in and the learning of XTC and the like performed by using the reproduction signal of the frame data, so that it is possible to prevent the significantly different tap coefficients from being obtained. With this arrangement, it is possible to appropriately perform XTC or the like immediately after the start of the reproduction of the frame data by the tap coefficient obtained by the learning of XTC which is performed by using the reproduction signal of the Run_in, for example. The same applies to the learning, adjustment, and the like of the offset and the gain of the reproduction signal.

In addition, the shift amount of the synchronization patterns syn0 of the pair of the land L and the groove G is not limited to the length of the synchronization pattern syn0, but the shift amount may be smaller than the length of the synchronization pattern syn0 or may be larger than the length of the synchronization pattern syn0.

Furthermore, the synchronization patterns syn0 of the pair of the lands L and the grooves G may be shifted in such a manner that portions thereof are overlapped (adjacent). However, from the viewpoint of reducing the cross correlation between the A-pattern preamble and the B-pattern preamble similarly to the cross correlation between the frame data recorded in the pair of the lands L and the grooves G, it is preferable that the synchronization patterns syn0 of the pair of the lands L and the grooves G are shifted in such a manner that the synchronization patterns are not overlapped.

Herein, an n-th track from the inner circumference side of the optical disk 16 is referred to as a track TK(n). As a case where the synchronization pattern is shifted in the track direction by a certain shift amount on the two adjacent tracks (the pairs thereof), there are a case where the synchronization pattern is shifted by a certain shift amount between an arbitrary one track TK(n) on the optical disk 16 and each of the track TK(n+1) on the inner circumference side and the track TK(n−1) adjacent to the outer circumference side adjacent to the track TK (n) and a case where the synchronization pattern is shifted by a certain shift amount between the odd-numbered track TK (2n'−1) of the optical disk 16 and the even-numbered track TK (2n') on the outer circumference side of the track TK(2n'−1). In a case where the synchronization pattern is shifted by a certain shift amount between the odd-numbered track TK(2n'−1) and the even-numbered track TK(2n'), it is not considered whether or not the synchronization pattern is shifted by a certain amount of shift between the even-numbered track TK (2n') and the odd-numbered track TK (2n'+1) on the outer circumference side of the track TK (2n').

<Synchronization Pattern syn0 and Correlation Zero Pattern NC0>

Figure 13:
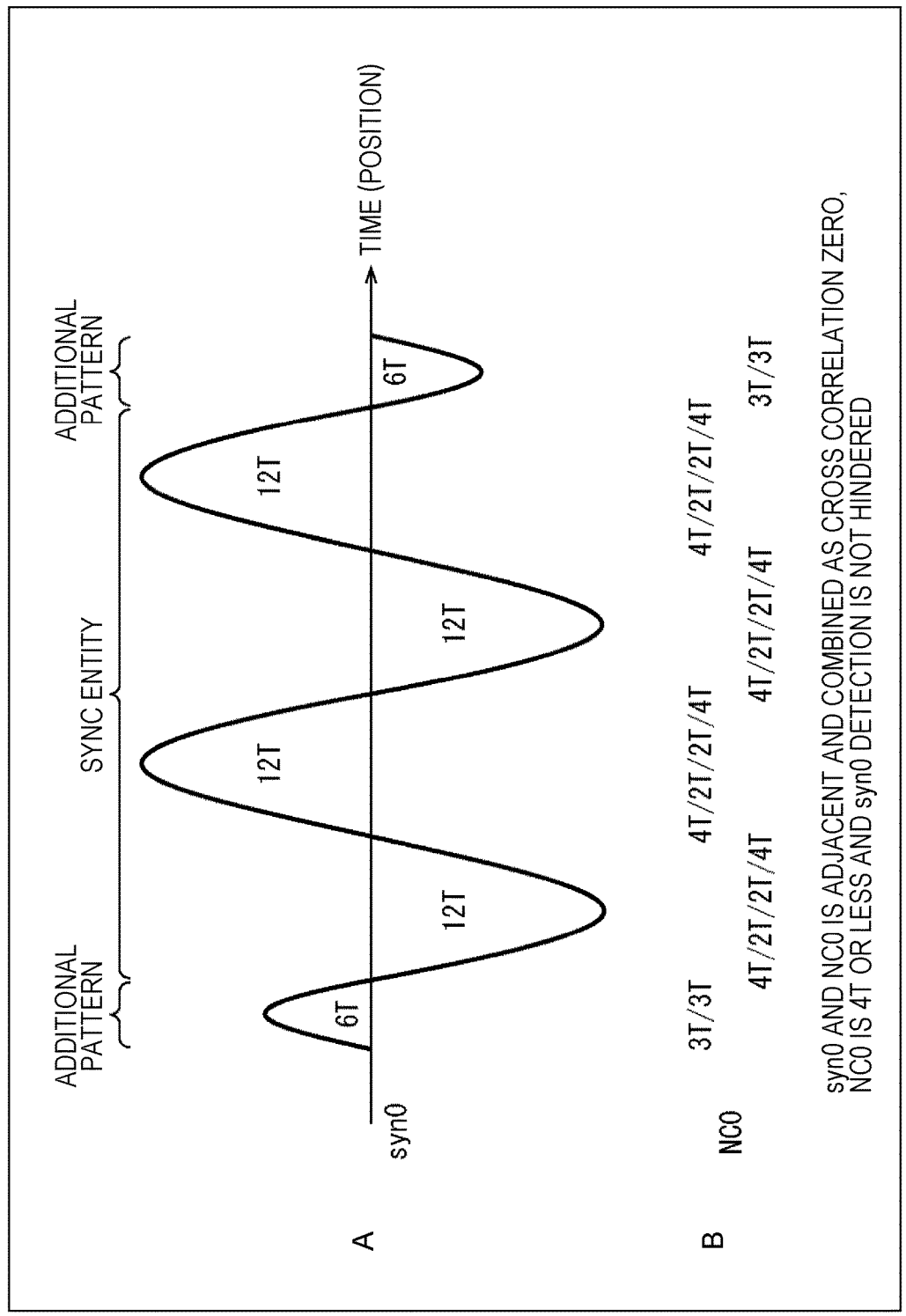
FIG. 13 is a diagram illustrating examples of a synchronization pattern syn0 and a correlation zero pattern NC0.

FIG. 13 is a diagram illustrating an example of the synchronization pattern syn0 and the correlation zero pattern NC0.

A of FIG. 13 illustrates an example of the synchronization pattern syn0.

As described with reference to FIG. 12, the synchronization pattern syn0 becomes a 60T=6T/12T×4/6T pattern.

That is, the synchronization pattern syn0 is a 60T pattern in which the sync entity of the 12T×4 pattern are interposed by the additional 6T patterns.

As described with reference to FIG. 12, the synchronization pattern syn0 is recorded while being shifted by the length of the synchronization pattern syn0 on the two adjacent (pairs) tracks, but since the additional 6T patterns are arranged before and after the sync entity of the synchronization pattern syn0, a certain distance is secured by the additional patterns between the sync entities of the synchronization pattern syn0 recorded while being shifted on the two adjacent tracks.

As a result, it is possible to suppress the RF fluctuation of the reproduction signal caused by the interference of one sync entity of the sync entities of the synchronization pattern syn0 which is recorded while being shifted to the two adjacent tracks, with the other sync entity.

B of FIG. 13 illustrates an example of the correlation zero pattern NC0.

The correlation zero pattern NC0 is, for example, a 60T pattern of 3T×2/(4T/2T/2T/4T)×4/T×2 and is a pattern in which the cross correlation with the synchronization pattern syn0 is zero.

Furthermore, the correlation zero pattern NC0 is a pattern in which the number of edges (number of 1 in the NRZI representation) is even and the terminating DSV is zero.

<A-Pattern and B-Pattern>

Figure 14:
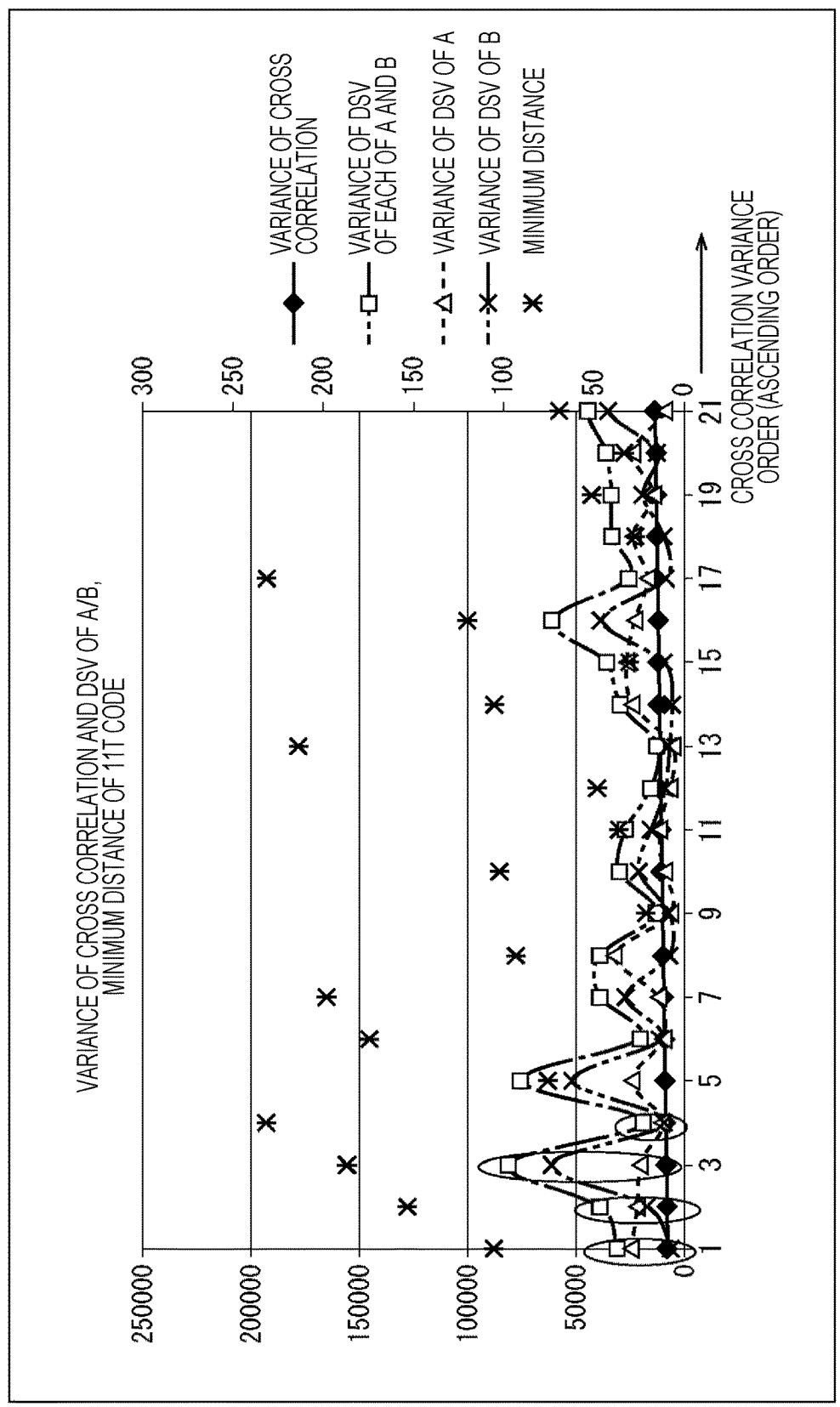
FIG. 14 is a diagram illustrating an A-pattern and a B-pattern arranged in the Run_in.

FIG. 14 is a diagram illustrating the A-pattern and the B-pattern arranged in the Run_in in FIG. 12.

Herein, the RUB configured by the RUB configuring unit 14 in FIG. 1 is represented in the NRZI representation in which the inversion of data (bits) is represented by 1 and the non-inversion is represented by 0. In the recording/reproducing system 15, the RUB is recorded on the optical disk 16 as the data of ±1 in the NRZ representation which is inverted from a case where the initial value starts with +1 or −1 and the RUB data in the NRZI representation is 1.

The DSV is an integrated value of the data of ±1 in the NRZ representation and can be obtained, for example, according to Formula (1).

$$DSV(K) = \Sigma NRZ(k) \tag{1}$$

In Formula (1), DSV(K) represents the DSVs from the first bit to the K-th bit of the pattern for obtaining the DSVs. $\Sigma$ represents a summation by changing k to an integer ranging from 1 to K. NRZ(k) represents the value (+1 or −1) of the k-th bit of the pattern for obtaining the DSVs.

Furthermore, the cross correlation between the two patterns P1 and P2 can be obtained, for example, according to Formula (2).

$$XC(K) = \Sigma P1(k)P2(k) \tag{2}$$

In Formula (2), XC(K) represents the cross correlations between the first bit and the K-th bit of the patterns P1 and P2. $\Sigma$ represents a summation by changing k to an integer ranging from 1 to K. P1($k$) and P2($k$) represent the values of the k-th bit (+1 or −1) of the patterns P1 and P2, respectively.

As an A-pattern and a B-pattern which are to be arranged in the Run_in, an appropriate pattern can be obtained, for example, as follows.

First, a 230-dbit data is obtained by a uniform random number, and DCC bits are added to the 230-dbit data at a period of 59 dbits (FIG. 8) which is the same period (DCC period) as the DCC bits are added to the frame. The addition of the DCC bits is performed so that the absolute value of the DSV in minimum (preferably 0).

In addition, in a case where the DCC bits are added to 230-dbit data at a period of 59 dbits, 4-bit DCC bits are added in total, and the 230-dbit data becomes a 234-dbit data.

The PCWA 110 coding into the PCWA 110 code which is the channel code is performed on the 234-dbit data to which the DCC bits are added. The PCWA 110 coding starts from the state S5, for example, similarly to the BC arranged immediately before the frame data.

According to PCWA 110 coding of the 234-dbit data, a 351-cbits PCWA 110 code is obtained.

By adding the 9-cbit PCWA 110 code as the termination code to the 351-cbit PCWA 110 code, the coding state terminates to the state S5.

As the state transition of the coding state from which the 9-cbit termination code terminating the coding state to the state S5 can be obtained by adding to the 351-cbit PCWA 110 code, there are the following five types from the code table of FIG. 10, for example.

$$S1 \to 11/000 \to S2 \to 01/001 \to S2 \to 11/000 \to S5$$

$$S2 \to 01/001 \to S2 \to 01/001 \to S2 \to 11/000 \to S5$$

$$S3 \to 11/010 \to S2 \to 01/001 \to S2 \to 11/000 \to S5$$

$$S4 \to 11/101 \to S2 \to 11/010 \to S2 \to 11/000 \to S5$$

$$S5 \to 11/101 \to S2 \to 01/001 \to S2 \to 11/000 \to S5 \quad \text{(ST)}$$

Herein, among the state transitions (ST), for example, S1→11/000→S2→01/001→S2→11/000→S5 at the top represents that, in a case where the coding state is the state S1, the information bit 11 is coded into the PCWA 110 code 000 and transitions toward the state S2; in the state S2, the information bit 01 is coded into the PCWA 110 code 001 and transitions toward the state S2; in the state S2, the information bit 11 is coded into the PCWA 110 code 000 and transitions toward the state S5.

In this case, the termination code that terminates the coding state to the state S5 is 000 001 000.

According to the five state transitions (ST) described above, in a case where the coding state is the state S1, the 9-cbit termination code that terminates the coding state to the state S5 becomes 000 001 000; in a case where the coding state is the state S2, the 9-cbit termination code that terminates the coding state to the state S5 becomes 001 001 000; in a case where the coding state is the state S3, the 9-cbit termination code that terminates the coding state to the state S5 becomes 010 001 000; in a case where the coding state is the state S4, the 9-cbit termination code that terminates the coding state to the state S5 becomes 100 010 000; and in a case where the coding state is the state S5, the 9-cbit termination code that terminates the coding state to the state S5 becomes 101 001 000.

In a case where the last coding state of the 351-cbit PCWA 110 code is, for example, the state S1, the terminating code 000 001 000 of a case where the coding state is the state S1 is added to the 351-cbit PCWA 110 code, and the 360-bit PCWA 110 code obtained by the addition is terminated to the state S5.

Among the 360-cbit PCWA 110 codes obtained as described above, a predetermined number, for example, 100 or the like of the PCWA 110 codes (hereinafter, also referred to as A/B-candidate codes) in which the DSV(360) of Formula (1) which is the terminating DSV is 0, the number of edges (the number of 1s in the NRZI representation) becomes odd, and one or more 11T runs which is the maximum run k of the PCWA 110 code are included are generated.

A combination of two A/B-candidate codes is selected among the 100 A/B-candidate codes. By using one of the two A/B-candidate codes as an A-pattern, and using the other A/B-candidate code as a B-pattern, the synchronization pattern syn0 and the A-pattern are configured, and the synchronization pattern syn0 and the B-pattern are configured.

Furthermore, a pattern in which the synchronization pattern syn0 and the A-pattern are repeatedly arranged and a pattern in which the synchronization pattern syn0 and the B-pattern are repeatedly arranged are arranged shifted by the length of the synchronization pattern syn0, similarly to Run_in in FIG. 12, and in the section of the synchronization pattern syn0 and the A-pattern, a combination of the two A/B candidate codes in which the XC (420) of Formula (2) which is a cross correlation between the synchronization pattern syn0 and the A-pattern and the synchronization patterns syn0 and the B-pattern is zero is obtained.

According to the simulation performed by the present inventor, 256 combinations of A/B-candidate codes were obtained as the combinations of the two A/B-candidate codes as described above.

Herein, in the 256 combinations of A/B-candidate codes as described above, the A/B-candidate code used as the A-pattern in the calculation of the XC (420) of Formula (2) is also referred to as an A-candidate code, and the A/B-candidate code used as the B-pattern is also referred to as a B-candidate code.

FIG. 14 illustrates information regarding the 256 combinations (a portion thereof) of A-candidate codes and B-candidate codes.

In FIG. 14, with respect to the 256 combinations of the A-candidate code and the B-candidate code, the information is illustrated in the ascending order (cross correlation variance order). of the variances of the cross correlations XC(1) XC(2) . . . , and XC(420) of the times (positions) k= 1, 2, . . . , and 420 in the section of the synchronization pattern syn0 and the A-pattern.

That is, in FIG. 14, with respect to the 256 combinations (a portion thereof) of A-candidate codes and B-candidate codes, the variances of the cross correlations XC(1) to XC(420) are indicated as the "variance of cross correlation" in the ascending order of the variances of the cross correlations XC (1) to XC (420).

Furthermore, in FIG. 14, with respect to the 256 combinations of the A-candidate codes and the B-candidate codes, in the ascending order of the variances of the cross correlations XC(1) to XC(420), the variances of the DSV(1), DSV (2), . . . , and DSV(360) of the times k=1, 2, . . . , and 360 of the A-candidate codes and the variances of the DSV(1), DSV (2), . . . , and DSV(360) of the times k=1, 2, . . . , and 360 of the B-candidate codes are indicated as the "variance of DSV of A" and the "variance of DSV of B", respectively.

Furthermore, in FIG. 14, in the 256 combinations of the A-candidate code and the B-candidate code, in the ascending order of variances of the cross correlations XC (1) to XC (420), the variance of DSV as a sum of DSV(1) to DSV(360) of the A-candidate codes and DSV(1), DSV(2), . . . , and DSV(360) of the B-candidate codes are indicated as the "variance of DSV of each of A and B".

Furthermore, in FIG. 14, in the 256 combinations of the A-candidate code and the B-candidate code, the minimum value among the distances between the 11T-run pattern included in the A-candidate code and the 11T-run pattern included in the B-candidate code (the shift amount of the 11T pattern in the track direction) is indicated as a "minimum distance".

Figure 15:
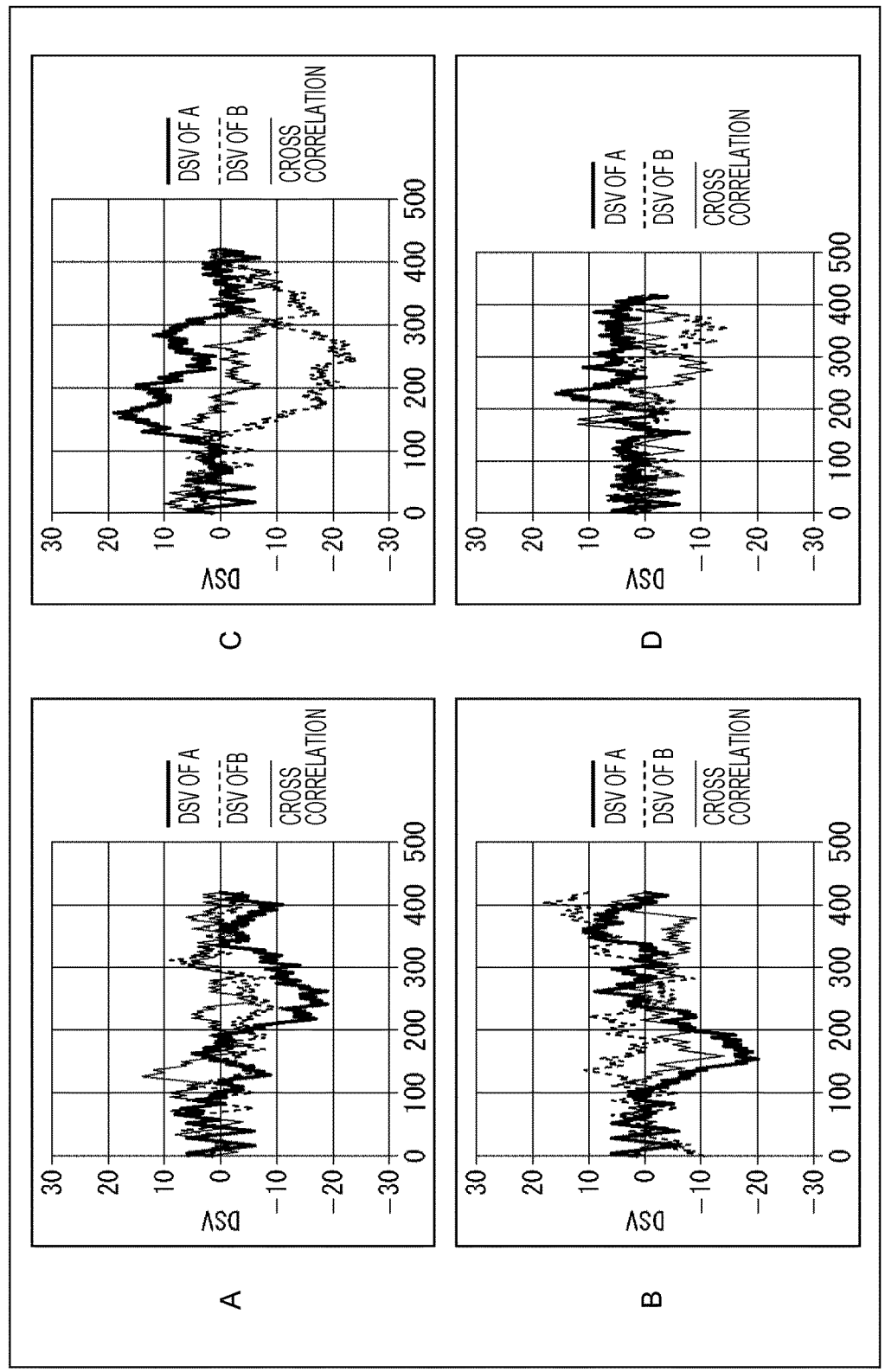
FIG. 15 is a diagram illustrating information regarding combinations of an A-candidate code and a B-candidate code from first to fourth ranks in the ascending order of variance of cross correlations XC(1) to XC(420).

FIG. 15 is a diagram illustrating information regarding combinations of the A-candidate code and the B-candidate codes of the first to fourth ranks in the ascending order of the variances of the cross correlations XC(1) to XC(420) among 256 combinations of the A-candidate code and the B-candidate code described with reference to FIG. 14.

That is, A, B, C, and D of FIG. 15 indicate information regarding the combinations of the A-candidate code and the B-candidate code of the first, second, third and fourth ranks, respectively.

In FIG. 15, the A-candidate code and the B-candidate code are arranged as the A-pattern and the B-pattern together with the synchronization pattern syn0 similarly to a case where the A-candidate code and the B-candidate code are arranged in the Run_in. In a case where the head of the Run_in is set to the time k=1, DSV(1), DSV(2), . . . , and DSV(420) of the synchronization patterns syn0 and the A-candidate codes at the time k=1, 2, . . . , and 420 are indicated as the "DSV of A", and DSV (1), DSV(2), and DSV(420) of the synchronization patterns syn0 and the B-candidate codes at the time k=1, 2, . . . , and 420 are indicated as the "DSV of B".

Furthermore, in FIG. 15, the A-candidate code and the B-candidate code are arranged as the A-pattern and the B-pattern together with the synchronization pattern syn0 similarly to a case where the A-candidate code and the B-candidate code are arranged in the Run_in, and in a case where the head of the Run_in is set to the time k=1, in the section of the synchronization pattern syn0 and A-candidate code, the cross correlations XC(1), XC(2), . . . , and XC (420) between the synchronization pattern syn0 and the A-candidate code of the times k=1, 2, . . . , and 420 and the synchronization pattern syn0 and the B-candidate code indicated as the"cross correlation".

Herein, in order to perform the process with similar tendency to the learning of the offset, the gain, and the XTC of the reproduction signal between a case where the Run_in is reproduced and a case where the frame data is reproduced, it is preferable that the DC component of the reproduction signal of the Run_in has similar characteristics to those of the DC component of the reproduction signal of the frame data, that is, for example, the DC component is small on average.

Therefore, as the A-pattern and the B-pattern, among the combinations of the A-candidate codes and the B-candidate codes of which the variances of DSV(1) to DSV (420) are equal to or smaller than the threshold value TH1 and of which the variances of the cross correlations XC (1) to XC (420) are equal to or smaller than the threshold value TH2, a combination of the A-candidate code and the B-candidate code of which the DSV (1) to DSV (420) and the cross correlations XC (1) to XC(420) are small on average can be adopted.

According to FIG. 15, among the combinations of the A-candidate codes and the B-candidate codes the first to fourth rank, the combination of the A-candidate code and the B-candidate code of the fourth rank of D of FIG. 15 becomes the combination of which the DSV(1) to DSV(420) of the synchronization pattern syn0 and the A-candidate code, the DSV(1) to DSV(420) of the synchronization pattern syn0 and the B-candidate code, and the cross correlations XC (1) to XC (420) are small on average.

Therefore, as the A-pattern and the B-pattern, a combination of the A-candidate code and the B-candidate code at the fourth position of D of FIG. 15 can be adopted.

Figure 16:
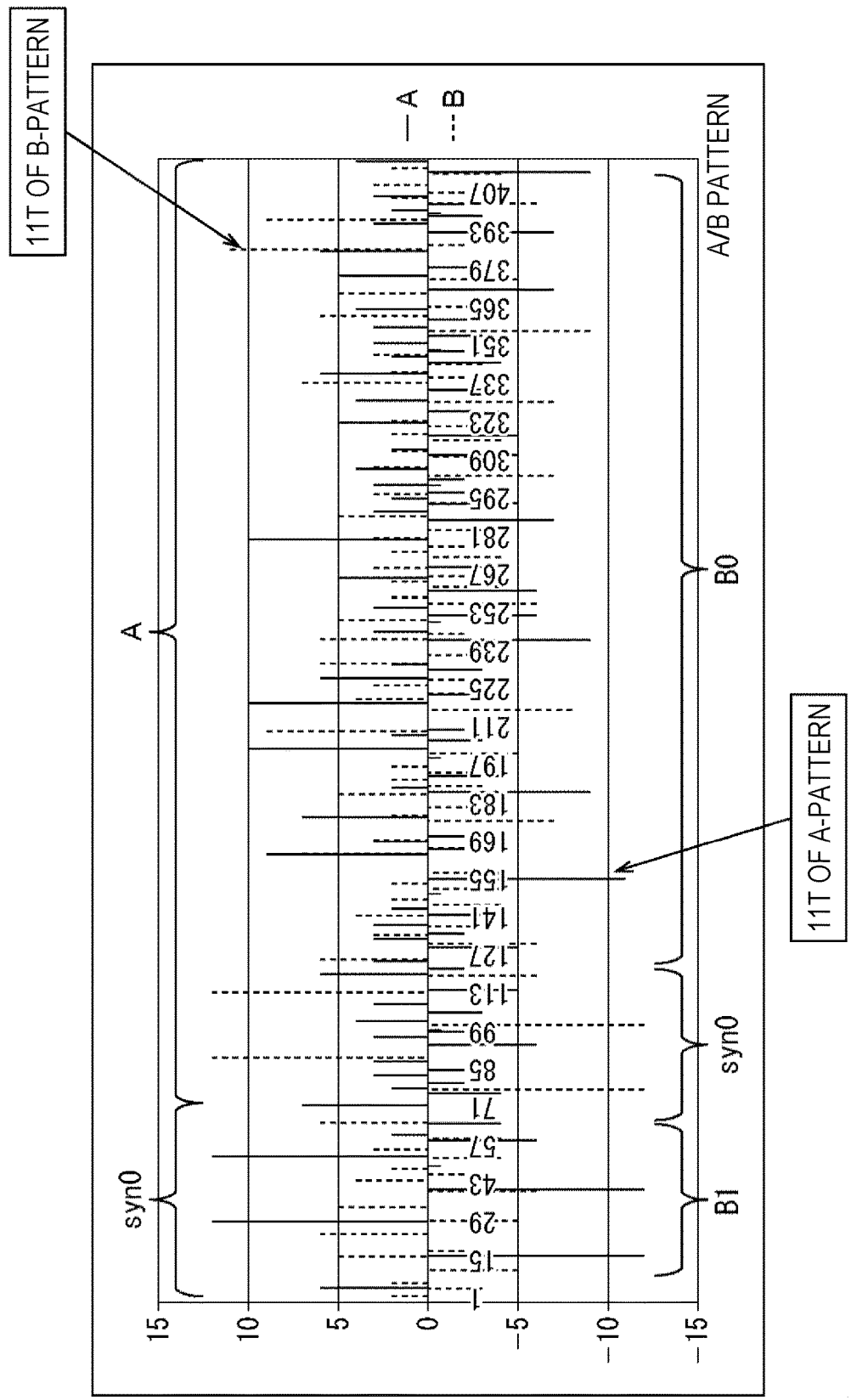
FIG. 16 is a diagram illustrating examples of the A-pattern and the B-pattern.

FIG. 16 is a diagram illustrating examples of the A-pattern and the B-pattern.

That is, FIG. 16 illustrates a combination of the A-candidate code and the B-candidate code at the fourth position of D of FIG. 15.

In FIG. 16, the A-pattern and the B-pattern are arranged together with the synchronization pattern syn0 similarly to a case where the A-pattern and the B-pattern are arranged in the Run_in.

That is, with respect to the A-pattern, the synchronization pattern syn0 and the A-pattern are arranged in this order, and with respect to the B-pattern, the B0-pattern and the B1-pattern are separately arranged, and thus, the B1-pattern, the synchronization pattern syn0, and B0-pattern are arranged in this order.

In FIG. 16, the horizontal axis represents the position (time) from the head of the Run_in, and the vertical axis represents the run length of the data of ±1 in the NRZ representation ending at the position represented by the horizontal axis.

According to FIG. 16, it can be understood that each of the A-pattern and the B-pattern includes one 11T run, and the 11T run included in the A-pattern and the 11T run included in the B-pattern are relatively far away from each other, and the like.

Figure 17:
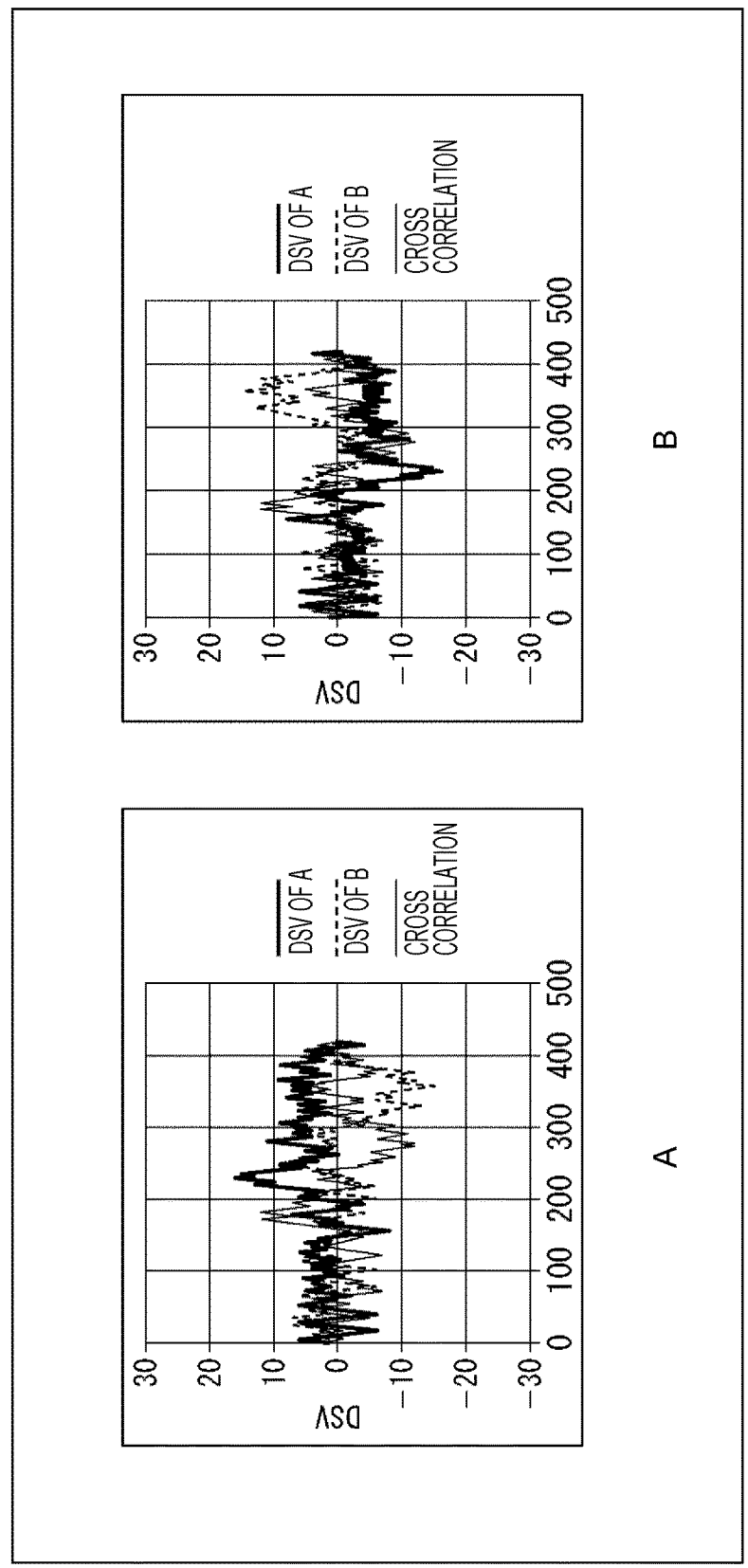
FIG. 17 is a diagram illustrating information regarding the A-pattern and the B-pattern.

FIG. 17 is a diagram illustrating information regarding the A-pattern and the B-pattern in FIG. 16.

In FIG. 17, the A-pattern and the B-pattern are arranged together with the synchronization pattern syn0 similarly to a case where the A-pattern and the B-pattern are arranged in the Run_in, and in a case where the head of the Run_in is set to the time k=1, the DSV (1) to DSV (420) of the synchronization pattern syn0 and the A-pattern are indicated as the "DSV of A", and the DSV(1) to DSV(420) of the synchronization pattern syn0 and the B-patterns are indicated as the "DSV of B".

Furthermore, in FIG. 17, the A-pattern and the B-pattern are arranged together with the synchronization pattern syn0 similarly to a case where the A-pattern and the B-pattern are arranged in the Run_in, and in a case where the head of the Run_in is set to the time k=1, in the section of the synchronization pattern syn0 and the A-pattern, the cross correlations XC(1) to XC (420) between the synchronization pattern syn0 and the A-pattern and the synchronization pattern syn0 and the B-patterns are indicated as the "cross correlation".

As described with reference to FIG. 12, in the A-pattern and the B-pattern, the number of edges (the number of 1s in the NRZI representation) is an odd number.

In the preamble of the Run_in, the synchronization pattern syn0 and the A-pattern are repeatedly arranged. However, since the number of edges of the A-pattern is odd, the polarities of the DSV(1) to DSV(420) of the A-pattern are inverted between a certain 420T section pd of the synchronization pattern syn0 and the A-pattern and the next 420T section pd+1 of the period pattern sync and the A-pattern. In this respect, the same applies to the DSV(1) to DSV(420) of the B-pattern.

A of FIG. 17 illustrates the "DSV of A", the "DSV of B" and the "cross-correlation" of a certain 420T section pd of the synchronization pattern syn0 and the A-pattern, and B of FIG. 17 illustrates the "DSV of A", the "DSV of B", and the "cross correlation" of the next 420T section pd+1 of the synchronization pattern syn0 and the A-pattern.

According to FIG. 17, it can be understood that the polarities of the "DSV of A" and the "DSV of B" are inverted between the section pd (A of FIG. 17) and the next section pd+1 (B of FIG. 17).

In this case, it is possible to effectively perform the learning the offset of the reproduction signal (the learning for canceling the offset).

<First Pattern NC1 and Second Pattern NC2>

Figure 18:
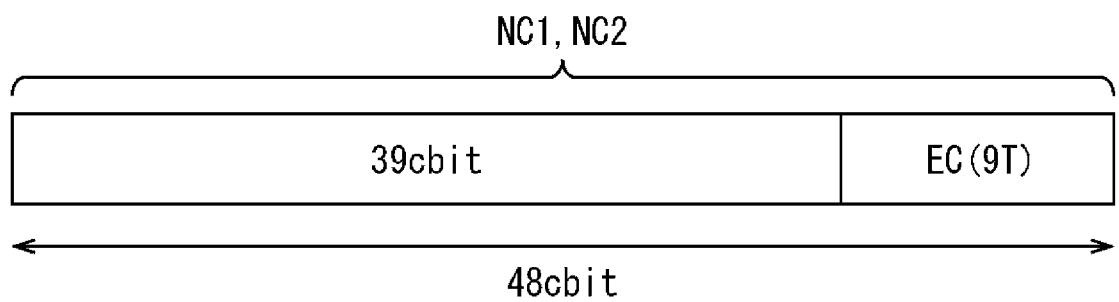
FIG. 18 is a diagram illustrating an example of a first pattern NC1 and a second pattern NC2 arranged at the end of the Run_in.

FIG. 18 is a diagram illustrating examples of the first pattern NC1 and the second pattern NC2 arranged at the end of the Run_in in FIG. 12.

The first pattern NC1 and the second pattern NC2 are the 48-cbit (48T) PCWA 110 code of which cross correlation is zero and are the pattern of which the terminating DSV is zero.

Furthermore, each of the ends of the first pattern NC1 and the second pattern NC2 is a 9T EC (9 cbits).

As illustrated in FIG. 12, since the first pattern NC1 and the second pattern NC2 are arranged at the end of the Run_in, the Run_in is terminated with the EC arranged at each of the ends of the first pattern NC1 and the second pattern NC2.

The first pattern NC1 and the second pattern NC2 can be obtained, for example, as follows.

First, a 26-dbit data is obtained by a uniform random number, and the 26-dbit data is coded (PCWA 110 coding) into a PCWA 110 code which is a channel code. The PCWA 110 coding is started from the state S5, for example, similarly to the case of obtaining the A-pattern and the B-pattern.

According to the PCWA 110 coding of the 26-dbit data, a 39-cbit PCWA 110 code is obtained.

By adding the 9T EC to the end of the 39-cbit PCWA 110 code, the 48-cbit PCWA 110 code is completed.

With respect to the 48-cbit PCWA 110 code to which the EC is added, the 4T or 5T run is guaranteed by the EC.

As described with reference to FIG. 9, after the first pattern NC1 and the second pattern NC2 arranged at the end of the Run_in, the FS having no EC at the head of the frame frame 1, that is, the FS in which only the FS entity and the BCs are aligned in this order (hereinafter, also referred to as simplified FS) is arranged.

The influence of the ISI on the FS entity of the simplified FS becomes large depending on the data arranged immediately before the simplified FS. However, the EC is arranged at the end of the Run_in before the simplified FS is arranged (each of the ends of the first pattern NC1 and the second pattern NC2) as described above, and thus, the run of 4T or 5T is guaranteed. In this case, the influence of the ISI on the FS entity of the simplified FS can be reduced.

Among the 48-cbit PCWA 110 codes to which the EC is added obtained as described above, a predetermined number, for example, 100 or the like of the PCWA 110 codes (hereinafter, also referred to as NC1/2 candidate codes) in which the DSV (48) of Formula (1) which is the terminating DSV is 0 and the 11T run which is the maximum run k of the PCWA 110 code are not included are generated.

Herein, from the viewpoint of performing the learning of the offset, the gain, and the XTC by using the reproduction signal of the Run_in, it is preferable that each of the runs of 2T, 3T, . . . , and 11T that can be generated by the PCWA 110 code as a channel code appears in the Run_in.

However, the first pattern NC1 and the second pattern NC2 are patterns arranged at the end of the Run_in, and thus, at the time of reproduction of the first pattern NC1 and the second pattern NC2, the learning of the offset, the gain, and the XTC is performed sufficiently by using the reproduction signal of the runs of the 2T, 3T, . . . , and 11T appearing in the Run_in up to the time.

On the other hand, since a simplified FS is arranged after the Run_in, if a long run exists in the first pattern NC1 or the second pattern NC2 of the end of the Run_in, the level of the reproduction signal is increase, and thus, in some cases, the detection of the FS entity of the simplified FS is greatly affected.

Therefore, as the NC1/2 candidate code, as described above, a PCWA 110 code having no 11T rum which is the maximum run k of the PCWA 110 code may be adopted.

In addition, as the NC1/2 candidate code, besides, for example, a PCWA 110 code having a 11T run which is the maximum run k of the PCWA 110 code may be adopted, a PCWA 110 code having no 11T rum which is the maximum run k of the PCWA 110 code and no 10T which is the next longest run and the like may be adopted.

In addition, with respect to the NC1/2 candidate code, the number of edges (the number of 1 in the NRZI representation) may be either an odd number or an even number, but herein, as the NC1/2 candidate code, the PCWA 110 code of which the number of edges is an even number is adopted.

A combination of the two NC1/2 candidate codes is selected from the 100 NC1/2 candidate codes, and the combination of the two NC1/2 candidate codes of the cross correlation XC(48) of the two NC1/2 candidate codes becomes zero is obtained.

According to the simulation performed by the present inventor, the 309 combinations of the NC1/2 candidate codes were obtained as a combination of the two NC1/2 candidate codes as described above.

Herein, in the 309 combinations of NC1/2 candidate codes as described above, one NC1/2 candidate code of the two NC1/2 candidate codes of each combination is also referred to as an NC1 candidate code, and the other NC1/2 candidate code is also referred to as an N2 candidate code.

Figure 19:
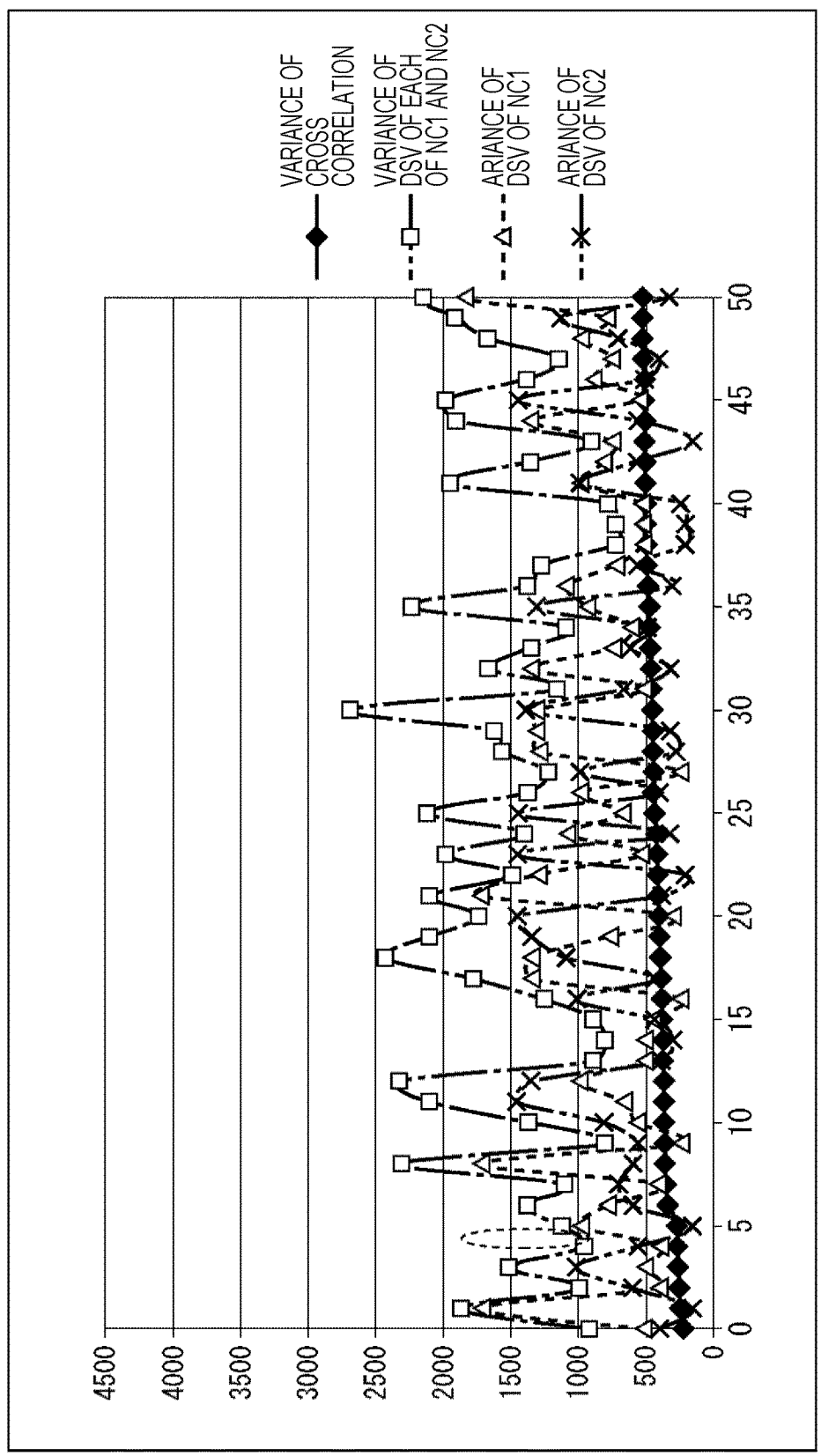
FIG. 19 is a diagram illustrating information regarding (a portion of) combinations of 309 sets of NC1 candidate codes and NC2 candidate codes.

FIG. 19 is a diagram illustrating information regarding (a portion of) 309 combinations of the NC1 candidate codes and the NC2 candidate codes.

In FIG. 19, in the 309 combinations of the NC1 candidate code and the NC2 candidate code, information is illustrated in the ascending order (cross correlation variance order) of the variances of the cross correlations XC (1), XC (2), . . . , and XC (48) between the NC1 candidate code and the NC2 candidate code.

That is, in FIG. 19, in (a portion of) the 309 combinations of the NC1 candidate code and the NC2 candidate code, the variances of the cross correlations XC(1) to XC (48) is indicated as the "cross correlation variance" in the ascending order of the variances of the cross correlations XC(1) to XC (48).

Furthermore, in FIG. 19, in the 309 combinations of the NC1 candidate code and the NC2 candidate code, in the ascending order of the variances of the cross correlations XC (1) to XC (48), the variances of DSV(1), DSV (2), . . . , and DSV (48) of the NC1 candidate codes and the variances of DSV(1), DSV (2), and DSV (48) of the NC2 candidate code are indicated as the "variance of DSV of NC1" and "variance of DSV of NC2", respectively.

Furthermore, in FIG. 19, in the 309 combinations of the NC1 candidate code and the NC2 candidate code, in the ascending order of the variances of the cross correlations XC (1) to XC (48), the variance of DSV as a sum of DSV(1) to DSV(48) of the NC1 candidate codes and DSV(1), DSV(2), . . . , and DSV(48) of the NC2 candidate code are indicated as the "variance of DSV of each of NC1 and NC2".

The selection of the first pattern NC1 and the second pattern NC2 from the combinations of the NC1 candidate code and the NC2 candidate code can be performed, for example, in a similar manner to the selection of the A-pattern and the B-pattern described with reference to FIGS. 14 to 17.

That is, as the first pattern NC1 and the second pattern NC2, among the combinations of the NC1 candidate code and the NC2 candidate code having the variances of DSV(1) to DSV(48) equal to or smaller than the threshold value TH1' and the variances of the cross correlations XC(1) to XC(48) equal to or smaller than the threshold value TH2', the combination of the NC1 candidate code and the NC2 candidate code of having the DSV (1) to DSV (48) and the cross correlation XC (1) toXC(48) which are small on average can be adopted.

In FIG. 19, among the combinations of the NC1 candidate code and the NC2 candidate code indicating the variances or the like of the cross correlations, the combination of the NC1 candidate code and the NC2 candidate code with the smallest variance of the cross correlations XC(1) to XC(48) becomes the combination of the NC1 candidate code and the NC2 candidate code having the variances of DSV(1) to DSV(48) equal to or smaller than the threshold value TH1' and the variances of the cross correlations XC (1) to XC (48) equal to or smaller than the threshold value TH2' and having the DSV(1) to DSV (48) and the cross correlation XC (1) to XC (48) which are small on average.

Therefore, as the first pattern NC1 and the second pattern NC2, among the combinations of the NC1 candidate code and the NC2 candidate code illustrating the variance and the like of the cross correlation in FIG. 19, the combination of the NC1 candidate code and the NC2 candidate code having the smallest variance of the cross correlations XC (1) to XC (48) can be adopted.

Figure 20:
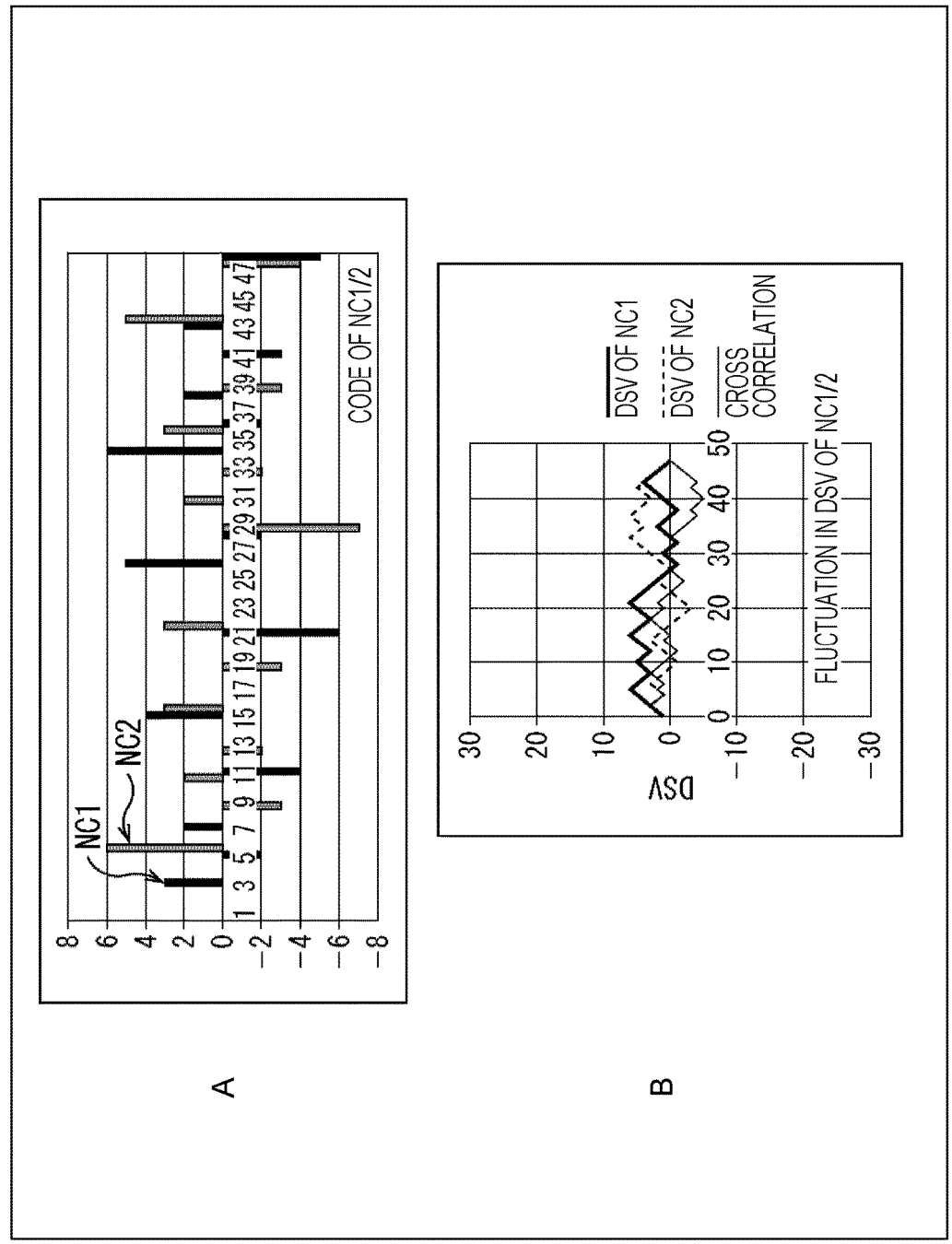
FIG. 20 is a diagram illustrating an example of a first pattern NC1 and a second pattern NC2.

FIG. 20 is a diagram illustrating an example of the first pattern NC1 and the second pattern NC2.

A of FIG. 20 illustrates the first pattern NC1 and the second pattern NC2 obtained as described with reference to FIG. 19.

In A of FIG. 20, the horizontal axis represents the position (time) from the head of the first pattern NC1 and the second pattern NC2, and the vertical axis represents the run length of the data of ±1 in the NRZ representation ending at the position represented by the horizontal axis.

According to A of FIG. 20, it can be understood that the maximum run of the first pattern NC1 is 6T, the maximum run of the second pattern NC2 is 7T, and the like.

B of FIG. 20 is a diagram illustrating information regarding the first pattern NC1 and the second pattern NC2 of A of FIG. 20.

In B of FIG. 20, the DSV(1) to DSV(48) of the first pattern NC1 are indicated as the "DSV of NC1", and the DSV(1) to DSV(48) of the second pattern NC2 are indicated as the "DSV of NC2".

Furthermore, in B of FIG. 20, the cross correlations XC (1) to XC (48) of the first pattern NC1 and the second pattern NC2 are indicated as the "cross correlation".

According to B of FIG. 20, it can be understood that the "DSV of NC1", the "DSV of NC2", and the "cross correlation" are small on average.

<Run_out>

Figure 21:
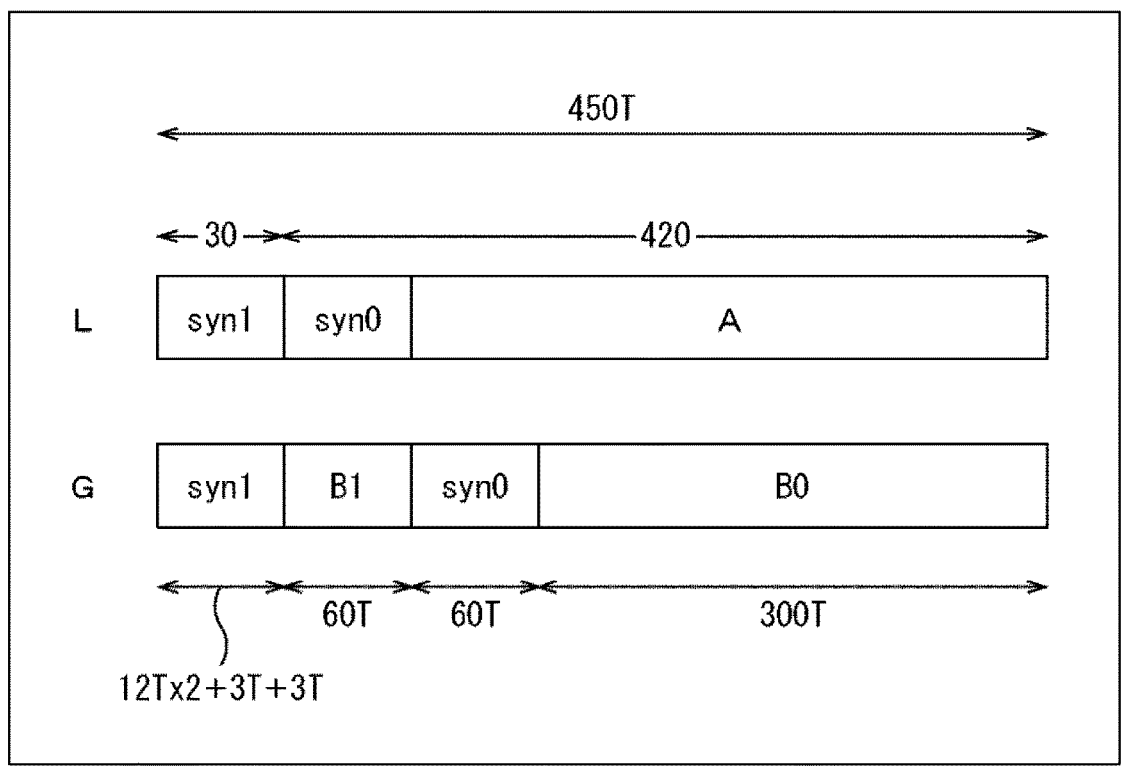
FIG. 21 is a diagram illustrating an example of a Run_out.

FIG. 21 is a diagram illustrating an example of the Run_out.

The Run_out is a 450T pattern configured by arranging a 30T pattern syn1, a 60T synchronization pattern syn0, and a 360T A-pattern or B-pattern.

That is, the Run_out of one of the two adjacent land L and groove G, for example, the Run_out of the land L is configured by arranging the pattern syn1, the synchronization pattern syn0, and the 360T A-pattern in this order.

Furthermore, the Run_out of the groove G, which is the other of the two adjacent land L and groove G, is configured by arranging the patterns syn1, the B1-pattern, the synchronization pattern syn0, and the B0-pattern in this order.

Therefore, in the Run_out of the land L and the Run_out of the groove G, the synchronization pattern syn0 is arranged to be shifted by 60T which is the length of the synchronization pattern svn0, similarly to the Run_in.

In addition, the cross correlation between the synchronization pattern syn0 and the A-patterns after the pattern syn1 of the Run_out of the land L and the B1-pattern, the synchronization pattern syn0, and the B0-pattern after the pattern syn1 of the Run_out of the groove G is zero similarly to the Run_in as described with reference to FIG. 12.

Therefore, the reproduction signal of the Run_out becomes a signal having similar characteristics to the reproduction signal of frame data, similarly to the reproduction signal of the Run_in.

The pattern syn1 is configured with a 12T×2 FS entity, a 3T pattern arranged after that, and another 3T pattern arranged after that in FIG. 11.

As the pattern syn1, for example, a pattern configured with a 12T×2 FS entity and a 6T BC arranged after the FS entity in FIG. 11 can be adopted.

<Example of Process of Sync Detection Unit 61>

Figure 22:
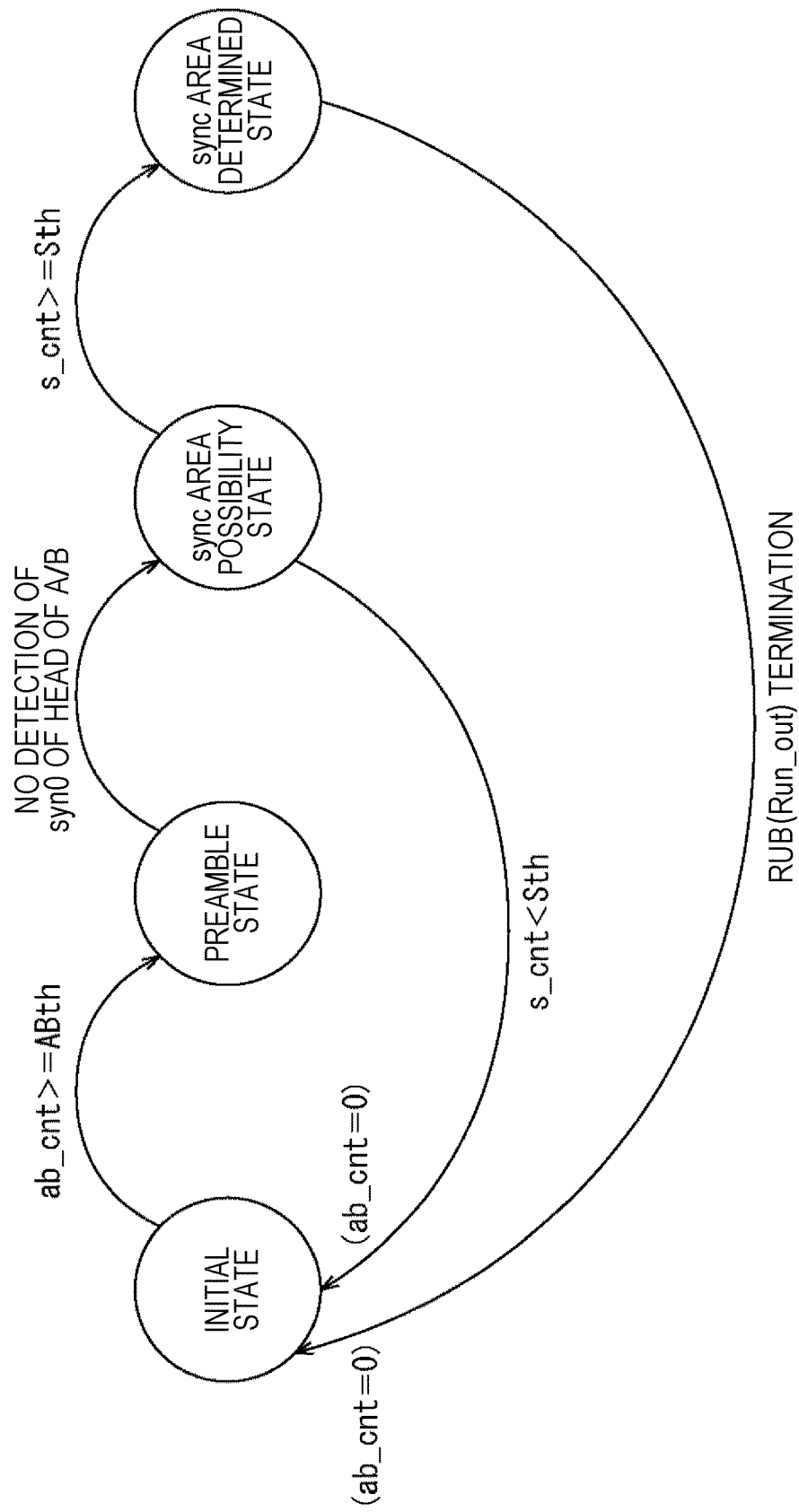
FIG. 22 is a diagram illustrating an example of a sync detecting process performed by a sync detection unit 61.

FIG. 22 is a diagram illustrating an example of the sync detecting process performed by the sync detection unit 61 in FIG. 6.

In a case where the Viterbi decoding as the maximum likelihood decoding starts from the head of the Run_in and the synchronization pattern syn0 is correctly restored in the restoration unit 35, the sync detection unit 61 detects the synchronization pattern syn0 which is a 6T/12T/12T/12T/12T/6T pattern from the Viterbi decoding result supplied from the restoration unit 35.

Now, in a case where the synchronization pattern syn0 is represented by a data of 1 in the NRZ representation, the ±1 in the NRZ representation is represented as 1, and the −1 is represented as 0.

In this case, the synchronization pattern syn0 is represented in the NRZ representation as 000000_111111111111_000000000000_111111111111_000000000000_111111, or 111111_000000000000_111111111111_000000000000_111111111111_000000.

In the synchronization pattern syn0, the four 12T patterns 111111111111 and 000000000000 in the central portion are sync entities.

Now, in the synchronization pattern syn0, a pattern of 12×4+r×2+1 bits from r bits before the first 12T pattern of the sync entity to r+1 bits after the last 12T pattern of the sync entity is set to a detection target pattern which is to be detected.

For example, in a case where the r bit is 2 bits, the detection target pattern of 53 bits=12×4+2×2+1 can be represented as 00_100000000000_100000000000_100000000000_100000000000_100 in the NRZI representation.

The detection target pattern as described above has five edges (1 in the NRZI representation), but in a case where the process of the PLL 32 (FIG. 4), an auto gain control (AGC) process (not illustrated), the learning of XTC, and the like are not sufficiently performed, the result of Viterbi decoding contains many errors, and thus, sometimes, the position of the edges of the detection target pattern may be shifted back and forth.

Therefore, for example, the sync detection unit 61 counts the number c of edges appearing at the correct positions in the above-described 53-bit detection target pattern, and in a case where the number c satisfies the formula of $5-(5-1)/2=3<=c$ and the remaining 5-c edges are located within the range of r=2 bits around the correct position, it is determined that the synchronization pattern syn0 (syncentity) is detected.

The sync detection unit 61 performs the sync detecting processes for detecting the synchronization pattern syn0 as described above.

FIG. 22 illustrates an example of a sequence of the sync detecting processes performed by the sync detection unit 61 of FIG. 6.

First, the sync detection unit 61 is in an initial state. In the initial state, the sync detection unit 61 resets the consecutive detection number ab_cnt for counting the number of synchronization patterns syn0 included in the preamble in the Run_in (FIG. 12) to 0. Furthermore, the sync detection unit 61 starts detecting the synchronization pattern syn0 from the restoration result (the decoding result of the maximum likelihood decoding) from the restoration unit 35, and every time the synchronization pattern syn0 is detected, the sync detection unit 61 increments the consecutive detection number ab_cnt by 1.

Herein, in the initial state, the sync detection unit 61 detects the synchronization pattern syn0 arranged immediately before the A-pattern or the B-pattern of the preamble of the Run_in. In the initial state, the number of consecutive detections of the synchronization pattern syn0 arranged immediately before the A-pattern or the B-pattern is counted as the consecutive detection number ab_cnt.

In the initial state, if the consecutive detection number ab_cnt becomes equal to or larger than the threshold value ABth of the consecutive detection number ab_cnt, the sync detection unit 61 recognizes that the preamble (FIG. 12) of the Run_in is being reproduced, and transition is performed from the initial state toward the preamble state.

In the preamble state, the sync detection unit 61 continues the detection of the synchronization pattern syn0 arranged immediately before the A-pattern or the B-pattern. Then, in a case where the synchronization pattern syn0 arranged immediately before the A-pattern or the B-pattern is not detected, the sync detection unit 61 recognizes that there is a possibility that the reproduction of the sync area (FIG. 12) of the Run_in has started, transition is performed from the preamble state toward the sync area possibility state.

In the sync area possibility state, the sync detection unit 61 resets the detection number s_cnt for counting the number of synchronization patterns syn0 included in the sync area of the Run_in to 0. Furthermore, the sync detection unit 61 starts detecting the synchronization pattern syn0 included in the sync area, and every time the synchronization pattern syn0 is detected, the sync detection unit 61 increments the detection number s_cnt by 1.

In the sync area possibility state, if the detection number s_cnt becomes equal to or larger than the threshold value Sth of the detection number s_cnt, the sync detection unit 61 recognizes that the sync area of the Run_in is being reproduced, and transition is performed from the sync area possibility state toward the sync area determined state.

On the other hand, in the sync area possibility state, in a case where the detection number s_cnt does not become equal to or larger than the threshold value Sth during (during the estimated time period of) the reproduction of the sync area, the sync detection unit 61 recognizes that the sync detection unit failed to detect the synchronization pattern syn0, and the state returns from the sync area possibility state to the initial state.

In the sync area determined state, the sync detection unit 61 recognizes the timing of the EC of the end of the Run_in (the EC arranged at the end of the first pattern NC1 or the second pattern NC2 of the Run_in (FIG. 18)) from the detection number s_cnt which is the count number of the synchronization patterns syn0 of the sync area.

Furthermore, the sync detection unit 61 generates a signal representing a section from the head of the EC at the end of the Run_in to the end of the FS of the frame frame 1 (FIG. 9) subsequent to the Run_in and supplies the signal as the FS gate signal representing the section of the FS of the frame frame 1 to the time information generation unit 62.

After that, if the sync detection unit 61 detects the Run_out (FIG. 9, FIG. 21) (the FS entity or the like included in the pattern syn1 thereof), the sync detection unit 61 transitions from the sync area determined state toward the initial state at the terminating point of the Run_out.

Figure 23:
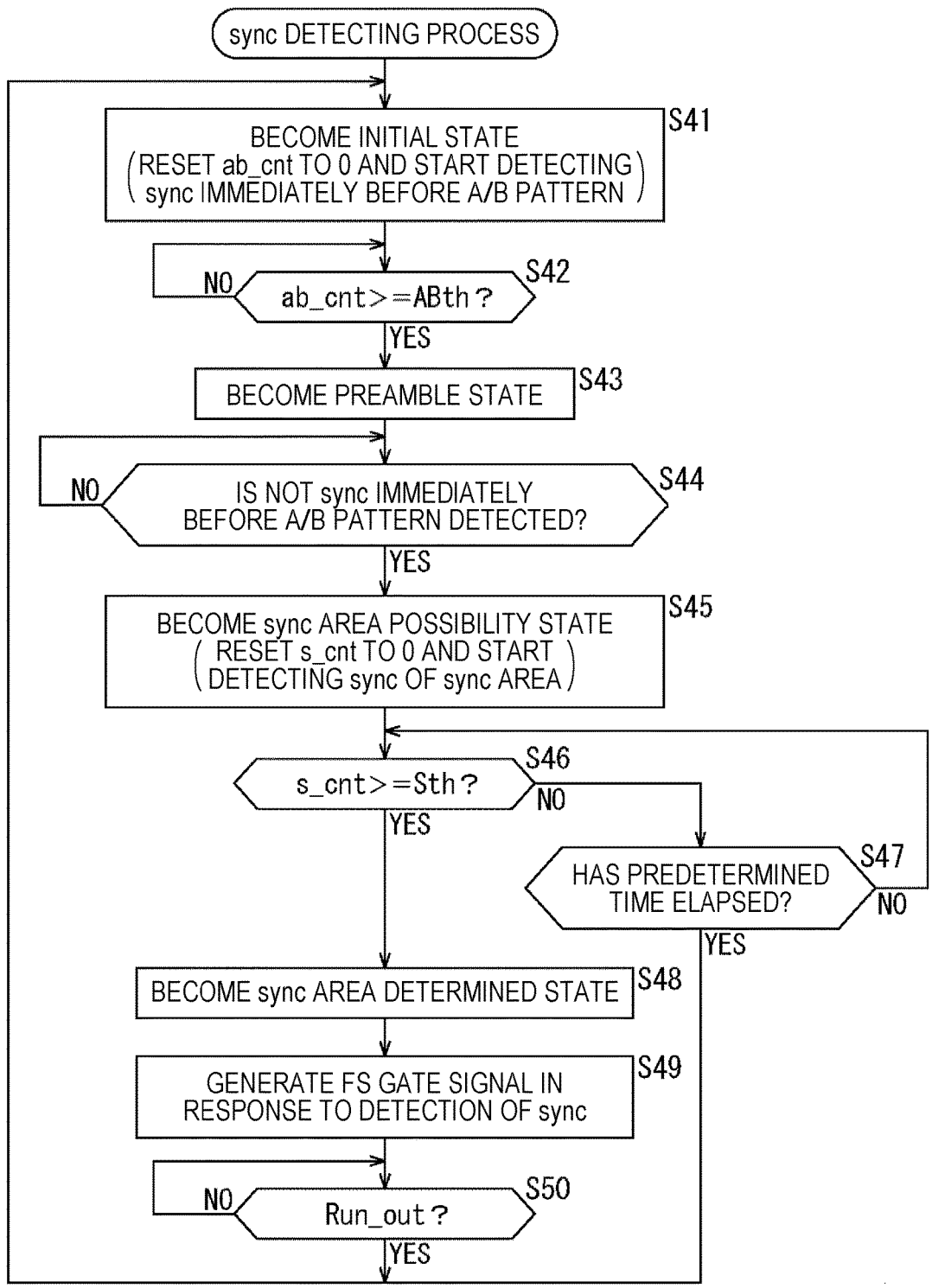
FIG. 23 is a flowchart illustrating an example of the sync detecting process performed by the sync detection unit 61.

FIG. 23 is a flowchart illustrating an example of a sync detecting process performed by the sync detection unit 61 of FIG. 6.

In step S41, the sync detection unit 61 is in an initial state and resets the consecutive detection number ab_cnt to 0. Furthermore, the sync detection unit 61 starts detecting the synchronization pattern syn0 arranged immediately before the A-pattern or the B-pattern from the restoration result of the restoration unit 35, and every time the synchronization pattern syn0 is detected, the sync detection unit 61 increments the consecutive detection number ab_cnt.

After that, the process proceeds from step S41 to step S42, and the sync detection unit 61 determines whether or not the consecutive detection number ab_cnt is equal to or larger than the threshold value ABth.

In a case where it is determined in step S42 that the consecutive detection number ab_cnt is not equal to or larger than the threshold value ABth, the process returns to step S42.

In addition, in a case where it is determined in step S42 that the consecutive detection number ab_cnt is equal to or larger than the threshold value ABth, the process proceeds to step S43, the sync detection unit 61 transitions from the initial state toward the preamble state, and the process proceeds to step S44.

In step S44, the sync detection unit 61 continues the detection of the synchronization pattern syn0 arranged immediately before the A-pattern or the B-pattern. Furthermore, in step S44, the sync detection unit 61 determines whether or not the synchronization pattern syn0 arranged immediately before the A-pattern or the B-pattern is detected.

In a case where it is determined in step S44 that the synchronization pattern syn0 arranged immediately before the A-pattern or the IB-pattern is detected, that is, in a case where the preamble (FIG. 12) of the Run_in is reproduced, the process of step S44 is repeated.

In addition, in a case where it is determined in step S44 that the synchronization pattern syn0 arranged immediately before the A-pattern or the B-pattern is no detected, that is, there is a possibility that the reproduction in the sync area (FIG. 12) of the Run_in is started, the process proceeds to step S45.

In step S45, the sync detection unit 61 transitions from the preamble state toward the sync area possibility state and resets the detection number s_cnt to 0. Furthermore, the sync detection unit 61 starts detecting the synchronization pattern syn0 included in the sync area from the restoration result of the restoration unit 35, and every time the synchronization pattern syn0 is detected, the sync detection unit 61 increments the detection number s_cnt by 1.

After that, the process proceeds from step S45 to step S46, and the sync detection unit 61 determines whether or not the detection number s_cnt is equal to or larger than the threshold Sth.

In a case where it is determined in step S46 that the detection number s_cnt is not equal to or larger than the threshold Sth, the process proceeds to step S47.

In step S47, the sync detection unit 61 determines whether or not a predetermined time estimated as the time required for reproduction of the sync area has elapsed since the sync area possibility state was reached.

In a case where it is determined in step S47 that the predetermined time has elapsed since the sync area possibility state was reached, the process returns to step S41, the sync detection unit 61 transitions from the sync area possibility state toward the initial state, and after that, similar processes are repeated.

In addition, in a case where it is determined in step S47 that the predetermined time has not elapsed since the sync area possibility state was reached, the process returns to step S46.

Then, in a case where it is determined in step S46 that the detection number s_cnt is equal to or larger than the threshold value Sth, the process proceeds to step S48, the sync detection unit 61 transitions from the sync area possibility state toward the sync area determined state, and the process proceeds to step S49.

In step S49, the sync detection unit 61 generates an FS gate signal representing a section of the FS of the frame frame 1, as described with reference to FIG. 22, from, the detection number s_cnt which is the count number of the synchronization pattern syn0 of the sync area, and supplies the FS gate signal to the time information generation unit 62; and the process proceeds to step S50.

In step S50, the sync detection unit 61 determines from the restoration result of the restoration unit 35 whether or not the Run_out (FIG. 9) (FIG. 21) has been detected, and in a case where it is determined that the Run_out has not been detected, the process returns to step S50.

In addition, in a case where it is determined in step S50 that the Run_out has been detected, the process returns to step S41.

As described above, in the recording/reproducing apparatus in FIG. 1, the synchronization pattern syn0 is recorded in the land and the groove as two adjacent tracks on the optical disk 16 while being shifted in the track direction by a certain shift amount, so that Interference from the adjacent track is suppressed at the time of reproduction of the synchronization pattern syn0 from the optical disk 16.

Furthermore, in the recording/reproducing apparatus of FIG. 1, a plurality of synchronization patterns syn0 are recorded in the Run_in of the optical disk 16.

Therefore, it is possible to accurately detect the synchronization pattern syn0, furthermore, the FS at the head of the frame after the Run_in including the synchronization pattern syn0, and it is possible to record the data at a high density on the optical disk 16 and to robustly reproduce the data recorded at a high density.

In addition, in FIG. 12, a plurality of sets of the synchronization pattern syn0 and the A-pattern or the B-pattern are arranged in the preamble, but one set of the synchronization pattern syn0 and the A-pattern or the B-pattern may be arranged in the preamble.

Similarly, in FIG. 12, a plurality of sets of the synchronization pattern syn0 and the correlation zero pattern NC0 are arranged in the sync area, but one set of the synchronization pattern syn0 and the correlation zero pattern NC0 may be arranged in the sync area.

<Recording of FS on Two Adjacent Tracks>

Figure 24:
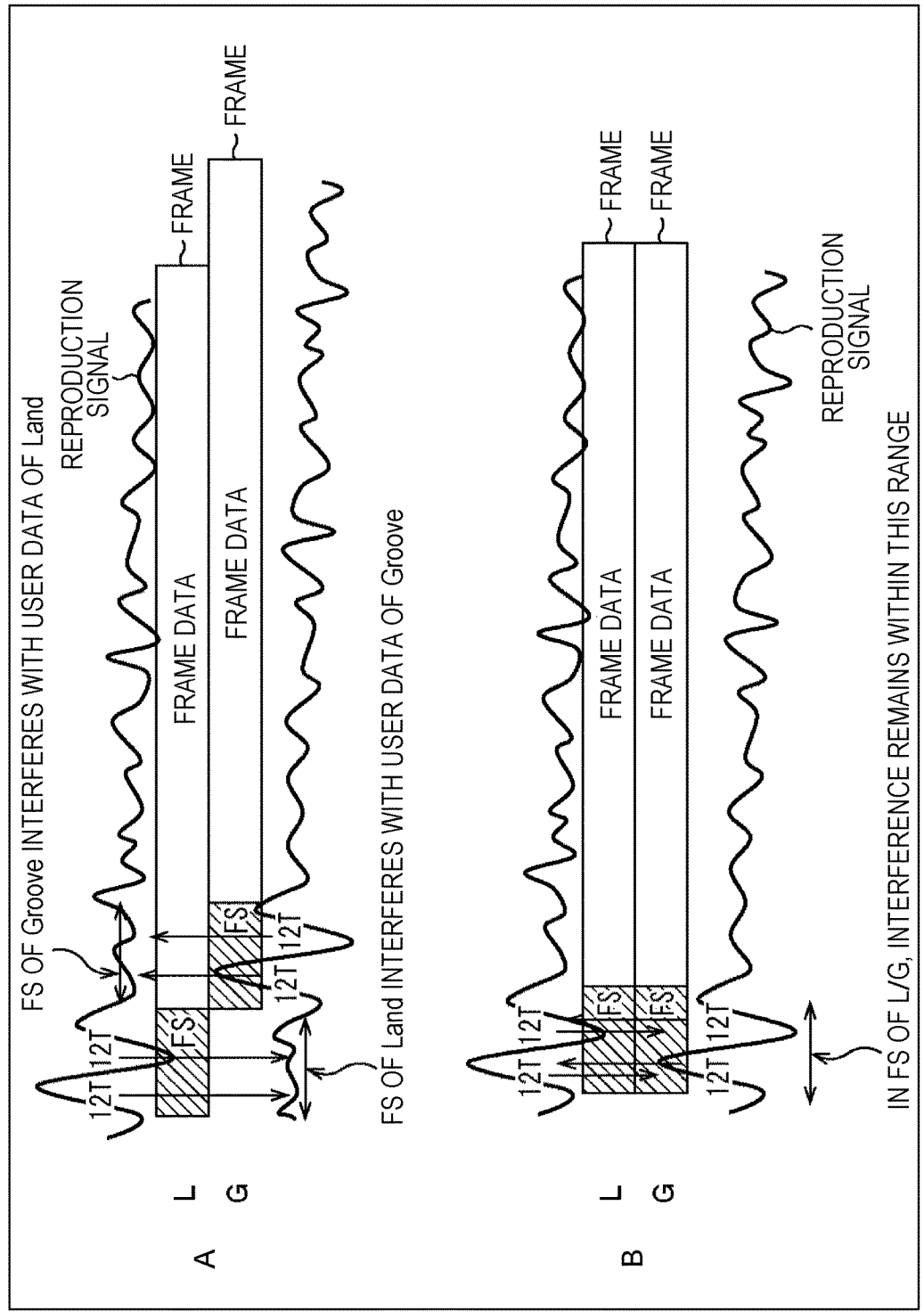
FIG. 24 is a diagram illustrating examples of recording of the FS on two adjacent tracks of the optical disk 16.

FIG. 24 is a diagram illustrating examples of recording of FS on two adjacent tracks of the optical disk 16.

In the above-described case, with respect to the recording of the frames in the land and groove which are adjacent two tracks of the optical disk 16, although not particularly mentioned, as the method of recording the frames in the adjacent land and groove, similarly to the synchronization pattern syn0, for example, there are a method of recording the frames in the adjacent land and groove by shifting the frames by a certain shift amount in the track direction and a method of recording the frames at the same positions in the track direction in the adjacent land and groove.

A of FIG. 24 illustrates an example of the frames recorded on the adjacent land L and groove G while being shifted in the track direction.

In A of FIG. 24, the frames are recorded on the adjacent land L and groove G while being shifted in the track direction by, for example, the length of the FS which is a constant shift amount.

As described above, in the case of recording the frames on the adjacent land L and groove G while shifting the frame in the track direction, the FS of the track adjacent to the to-reproduced track interferes with the reproduction signal of the frame data of the to-reproduced track, there is a concern that the decoding performance of the frame data of the to-reproduced track is deteriorated.

B of FIG. 24 illustrates an example of the frames recorded at the same positions in the track direction in the adjacent land L and groove G.

In B of FIG. 24, since the frames are recorded at the same positions in the track direction in the adjacent land L and groove G, the interference of the FS of the track adjacent to the to-reproduced track remains with only the FS of the to-reproduced track.

Therefore, in a case where the frames are recorded at the same positions in the track direction in the adjacent land L and groove G, deterioration of the decoding performance for the frame data due to the interference of FS can be prevented.

Therefore, in the recording/reproducing apparatus of FIG. 1, the frames are recorded at the same positions in the track direction in the adjacent land L and groove G as illustrated in B of FIG. 24.

However, in a case where the frames are recorded at the same positions in the track direction in the adjacent land L and groove G, the FS of the track adjacent to the to-reproduced track interferes with the reproduction signal of the FS of the to-reproduced track, and thus, there is a concern that the decoding performance of the FS is degraded.

Then, if the decoding performance of the FS is degraded, in a case where the clock shift (clock slip) of the channel clock of the PLL 32 (FIG. 4) exists, there is a concern that the section of the frame data cannot be specified correctly, and robustly reproducing the data recorded on the recording medium may be hindered.

By the way, the FS is a known pattern. Therefore, in the recording/reproducing apparatus of FIG. 1, by utilizing the fact that FS is a known pattern, it is possible to suppress the deterioration of the decoding performance of the FS of the to-reproduced track due to the interference of the FS of the track adjacent to the to-reproduced track, and it is possible to robustly reproduce the data recorded at a high density.

That is, in the recording/reproducing apparatus of FIG. 1, the restoration unit 35 (FIG. 4) restores the FS by performing only the maximum likelihood decoding of the FS out of the maximum likelihood decoding of the reproduction signal reproduced from the optical disk 16 according to time-varying trellis in which the state and the state transition are limited according to the time.

The time-varying trellis to be used for the maximum likelihood decoding of the FS is limited according to the states that can be taken and the state transitions that can be performed in the FS which is a known pattern.

In addition, the time-varying trellis is appropriately limited according to the minimum run, the maximum run, and the repeated minimum transition run length (RMTR) of the PCWA 110 code, for example, as the channel code adopted to the optical disk 16.

In addition, in the present embodiment, in the maximum likelihood decoding of the FS, an FS in a case where there is no clock shift and an FS in a case where there is a clock shift are taken into consideration. Therefore, as the states that can be taken and the state transitions that can be performed in the FS, there are states that can be taken and state transitions that can be performed in each of the FS in a case where there is no clock shift and the FS in a case where there is a clock shift, and the time-varying trellis is limited according to the states that can be taken and the state transitions that can be performed in each of the FS in a case where there is no clock shift and the FS in a case where there is a clock shift.

<Example of Time-Varying Trellis to Be Used for Maximum Likelihood Decoding of FS>

Figure 25:
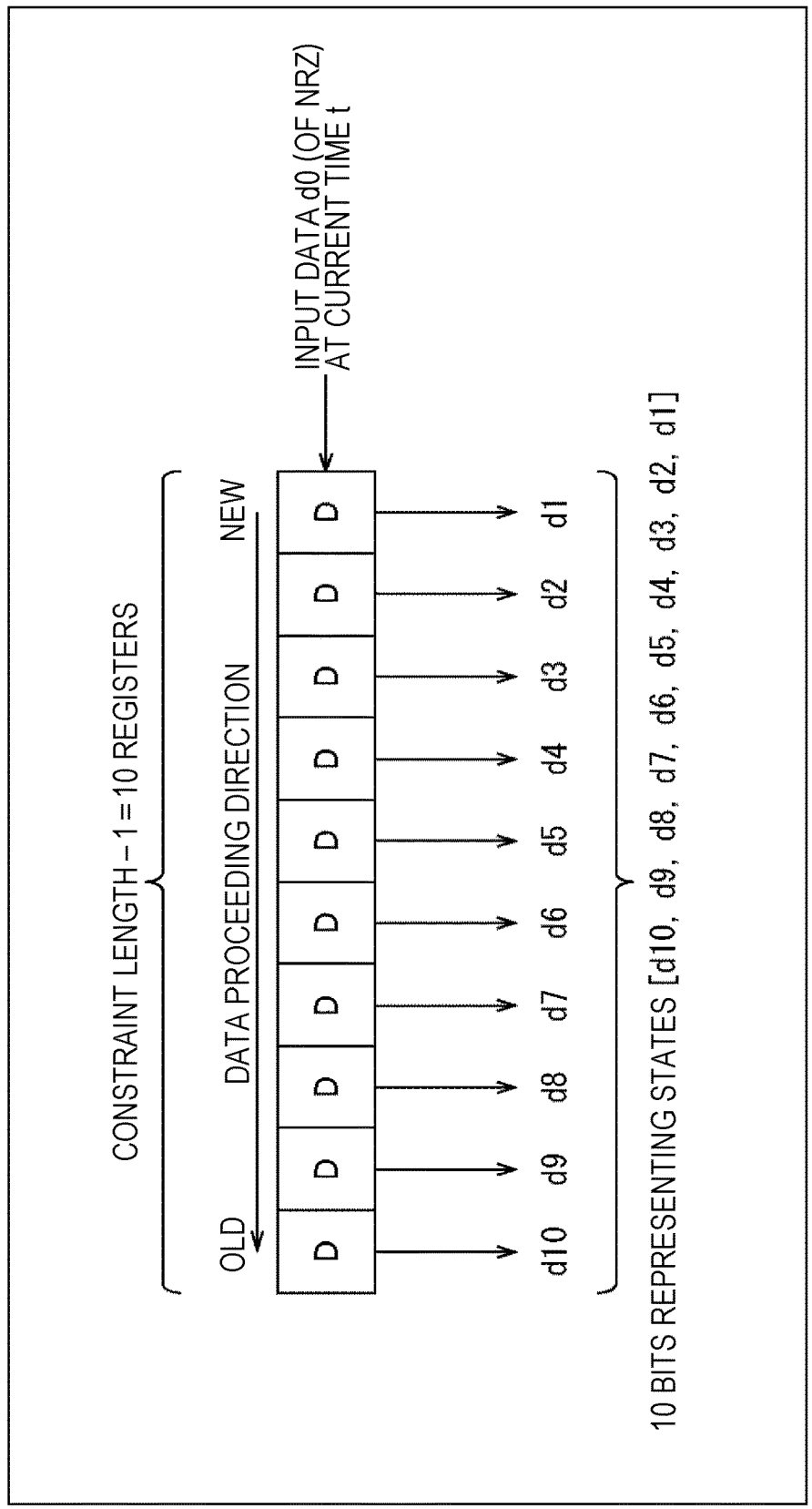
FIG. 25 is a diagram illustrating partial response maximum likelihood (PRML) of a code with a constraint length (ISI length) of 11 and a minimum run d=1 (2T in an NRZ representation).

FIG. 25 is a diagram illustrating partial response maximum likelihood (PRML) of a code with a constraint length (ISI length) of 11 and a minimum run d=1 (2T in the NRZ representation).

Herein, the PCWA 110 code adopted in the recording/reproducing apparatus of FIG. 1 is one kind of code with the minimum run d=1.

Now, the input data (in the NRZ representation) at the current time t among the codes with the minimum run d=1 as the input data to be input to the PR channel with a constraint length of 11 is represented as d0, and the input data (in the NRZ representation) at the time t−n earlier by n times than the current time t is represented as d#n.

In a case where the constraint length is 11, the input data d0 at the current time t is affected by the input data, the of which is the constraint length −1, immediately before the input data d0, that is, the input data d1, d2, . . . , and d10 at the past 10 times t−1, t−2, . . . , and t−n.

Therefore, ten registers, the number of which is the constraint lengths −1, are prepared, and input data d1, d2, . . . , and d10 of the past ten times t−1, t−2, . . . , t−10 are stored in the ten registers.

The trellis of the PRML of the code of with the constraint length of 11 and the minimum run d=1 may have the states represented by the past input data d1 to d10 stored in the 10 registers, that is, $1024=2^{10}$ states represented by 10 bits in which the input data d10, d9, . . . , and d1 are arranged in this order (time order).

The time-varying trellis to be used for the maximum likelihood decoding of the FS may include $1024=2^{10}$ states as described above.

Figure 26:
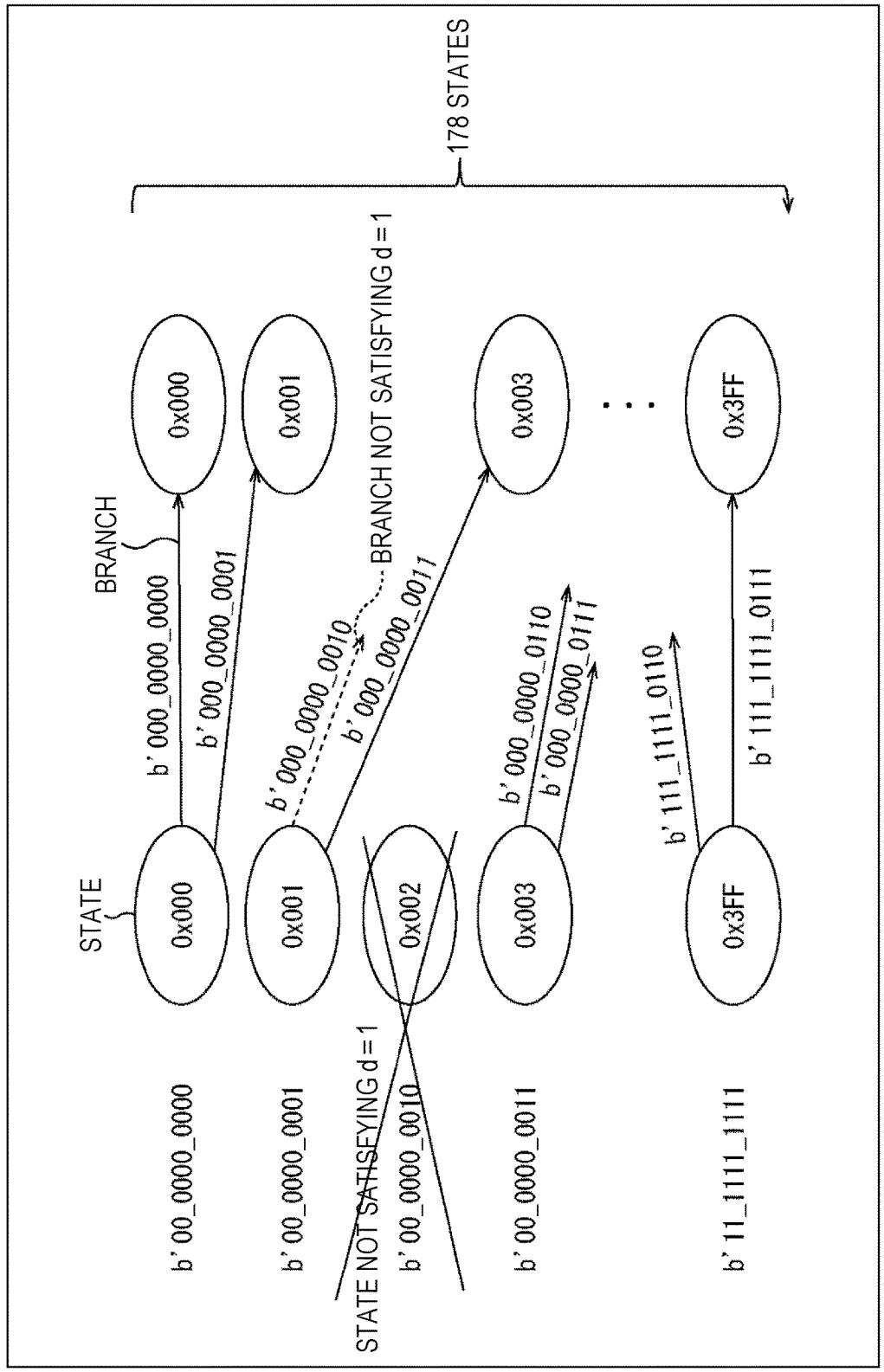
FIG. 26 is a diagram illustrating an example of a trellis used for the PRML of a code with a constraint length of 11 and a minimum run d=1.

FIG. 26 is a diagram illustrating an example of a trellis to be used for the PRML of a code with a constraint length of 11 and a minimum, run d=1.

Hereinafter, a value following 0x represents a hexadecimal number, and a value following b' represents a binary number.

In addition, hereinafter, the state and the state transition (branch) included in the trellis are appropriately represented by using a decimal number, a binary number, or a hexadecimal number.

For example, states of a trellis having 1024 states are represented as states 0x000, 0x001, . . . , and 0x3FF.

Furthermore, in the trellis, the state transition or the branch from the state#i to the state#j is represented by the input data d0 of the current time, which is input when the state#i before the state transition and the state transition from the state#i to the state#j occurs (in a case where the trellis has 1024 states, i, j=0, 1, . . . , and, 1023).

For example, in the state 0x000=b'00_0000_0000 (underscores are given for easy viewing of values, not related to binary numbers), in a case where b'1 exists as the input data d0 of the current time, the state transitions from the state 0x000_b'00_0000_0000 to the state 0x001=b'00_0000_0001. However, the state transition or the branch from the state b'00_0000_0000 to the state b'00_0000_0001 is represented as the state transition b'000_0000_0001 or the branch b'000_0000_0001 by 11 bits including the state b'00_0000_0000 before the state transition as the higher bits and the input data d0='1 of the current time as the lower bit.

In this case, the lower 10 bits b'00_0000_0001 of the state transition or the branch b'000_0000_0001 represents the state of the transition destination of the state transition. As described with reference to FIG. 25, the bit string representing the state are equal to the bit strings d10, d9, . . . , and d1 obtained by arranging the input data d1, d2, . . . , and d10 of the past 10 times until reaching the state, in time order.

In the restoration unit 35, in a case where the PRML of a code having a constraint length of 11 and a minimum run d=1 is performed, due to the minimum run d=1, in the input data in the NRZ representation, 2 bits or more of 1 s and 2 bits or more of 0 s are consecutively arranged, respectively. That is, in the input data, only 1 bit of 1 and only 1 bit of 0 do not appear alone, respectively.

Therefore, the time-varying trellis to be used for the maximum likelihood decoding of the FS does not have a state in which only 1 bit of 1 appears alone, for example, a state 0x002=b'00_0000_0010.

Similarly, for example, the time-varying trellis has no state b'00_0000_0100 or the like. However, in the time-varying trellis, for example, the state b'00_0000_0001 or the like may exist. This is because, with respect to the state b'00_0000_0001, if the input data d0 of the current time is 1, 1 s are consecutively arranged between the current time and the one-time preceding time (the least significant bit of the state b'00_0000_0001).

In addition, due to the minimum run d=1, the time-varying trellis to be used for the maximum likelihood decoding of the FS has no branch where only 1 bit of 0 or 1 appears alone.

Therefore, for example, in the state 0x001=b'00_0000_0001, 0 is input as the input data d0 of the current time, and thus, the time-varying trellis has no branch b'000_000_0010 that state-transitions toward the state b'00_0000_0010.

Similarly, the time-varying trellis does not have the branch b'000_0000_0100 or the like. However, in the time-varying trellis, for example, the branch b'000_0000_0001 or the like may exist. This is because, with respect to the branch b'000_0000_0001, if the input data at the next time is 1 in the state b'00_0000_0001 of the transition destination of the branch b'000_0000_0001, 1 s are consecutively arranged between the current time and the next time.

In the PRML of the code with a constraint length of 11 and minimum run d=1, the time-varying trellis to be used for the maximum likelihood decoding of the FS is limited to a trellis having 178 states and 288 branches due to the minimum run d=1.

Herein, with only the limitation of the minimum run d=1, the structure of the trellis does not vary with time. Therefore, the trellis in which the state and branch (state transition) are limited only due to the minimum run d=1 is not a time-varying trellis.

FIG. 27 is a diagram illustrating an example of the FS.

As described with reference to FIG. 11, the FS is configured with the EC, the FS entity, and the BC.

Then, as described with reference to FIG. 11, the EC is a pattern that terminates the coding state of the PCWA 110 coding from the states S1 to S5 that can be taken to the state S3 which is one specific state.

That is, as the EC, there are five patterns starting from each of the states S1 to S5 and terminating to the state S3. Furthermore, as described with reference to FIG. 11, there are cases where replacement with a substitution code sequence is performed on the pattern starting from the state S1 and terminating to the state S3.

Therefore, six patterns exist in the EC, and six patterns, each of which has EC of each of the six patterns exist in the FS.

FIG. 27 illustrates the six patterns of the FS in the NRZI representation.

In FIG. 27, the FS0 is an FS having an EC starting from state S1 and terminating to the state S3, the FS1 has an FS having an EC in which replacement with a substitution code sequence is performed on the pattern starting from the state S1 and terminating to the state S3.

The FS2, FS3, FS4, and FS5 are FSs having the ECs that start from the states S2, S3, S4 and S5 and terminate to the state S3, respectively.

Assuming a section of the FS, it is can be assumed which bit of the FS is being decoded according to the time. In this case, the restoration unit 35 can perform the maximum likelihood decoding of the FS by limiting the time-varying trellis to be used for the maximum likelihood decoding of the FS to the states that can be taken as FS0 to FS5 and the state transitions that can be performed (by deleting the states that cannot be taken as the FS0 to FS5 and the state transitions that cannot be performed).

In the present embodiment, in order to detect the clock shift of the channel clock, the restoration unit 35 considers an FS in a case where there is no clock shift and an FS in a case where there is a clock shift as the FS.

That is, the restoration unit 35 limits the time-varying trellis to be used for the maximum likelihood decoding of the FS according to the states that can be taken and the state transitions that can be performed in each of the FS in a case where there is no clock shift and the FS in a case where there is a clock shift.

Herein, the state and state transition of the trellis to be used for the maximum likelihood decoding of the FS are limited according to the states that can be taken and the state transitions that can be performed in each of the FS in a case where there is no clock shift and the FS in a case where there is a clock shift, the trellis becomes a time-varying trellis.

FIG. 28 is a diagram illustrating an example of the FS in a case where there is no clock shift and the FS in a case where there is a clock shift for the FSs of six patterns in FIG. 27.

In FIG. 28, an extended FS code string FSB#i in which the FS in a case where there is no clock shift is extended, and extended FS code strings FSA#i and FSC#i in which the FS in a case where there is a clock shift is extended are illustrated (i=0, 1, 2, 3, 4, and 5).

That is, in FIG. 28, in order to detect a clock shift of ±1 clock and a clock shift of −1 clock as the clock shift of the channel clock, the front and rear sides of the FS#i in FIG. 27 are extended by 1 bit, so that the extended code string becomes the extended FS code string FSB#i.

Furthermore, in FIG. 28, the rear side of the FS#i in FIG. 28 is extended by 2 bits, so that the code string after the extension becomes an extended FS code string FSC#i; and the front side of the FS#i in FIG. 27 Is extended by 2 bits, so that the code string after the extension becomes an extended FS code string FSA#i.

Assuming that the extended FS code string FSB#i is a code string including an FS having no clock shift, the extended FS code string FSA#i is a code string including an FS having a clock shift of +1 clock, and the extended FS code string FSC#i is a code string including an FS having a clock shift of −1 clock.

In addition, in FIG. 28, the asterisk (*) included in the extended FS code strings FSA#i, FSB#i, and FSC#i represents extended bits for the FS#i in FIG. 27, and the value thereof is "don't care".

In addition, herein, the clock shift of ±1 clock is assumed to be detected, but it is possible to detect a clock shift of an arbitrary number of clocks other than ±1 clock as the clock shift. For example, in the case of detecting a clock shift of arbitrary ±N clocks which are ±2 clocks or more, there may be considered an extended FS code string in which the front side of the FS#i is extended by 2N bits, an extended FS code string in which the front side of the FS is extended by 2N−1 bits and the rear side of the FS is extended by 1 bit, . . . , an extended FS code string in which the front side of the FS#i is extended by N−1 bits and the rear side of the FS is extended by N−1 bits, an extended FS code strings in which the front and rear sides of the FS#i are extended by N bits, an extended FS code string in which the front side of the FS#i is extended by N−1 bits and the rear side of the FS is extended by N+1 bits, . . . , an extended FS code string in which the front side of the FS#i is extended by 1 bits and the rear side of the FS is extended by 2N−1 bits, and an extended FS code string in which the rear side of the FS is extended by 2N bits.

Figure 29:
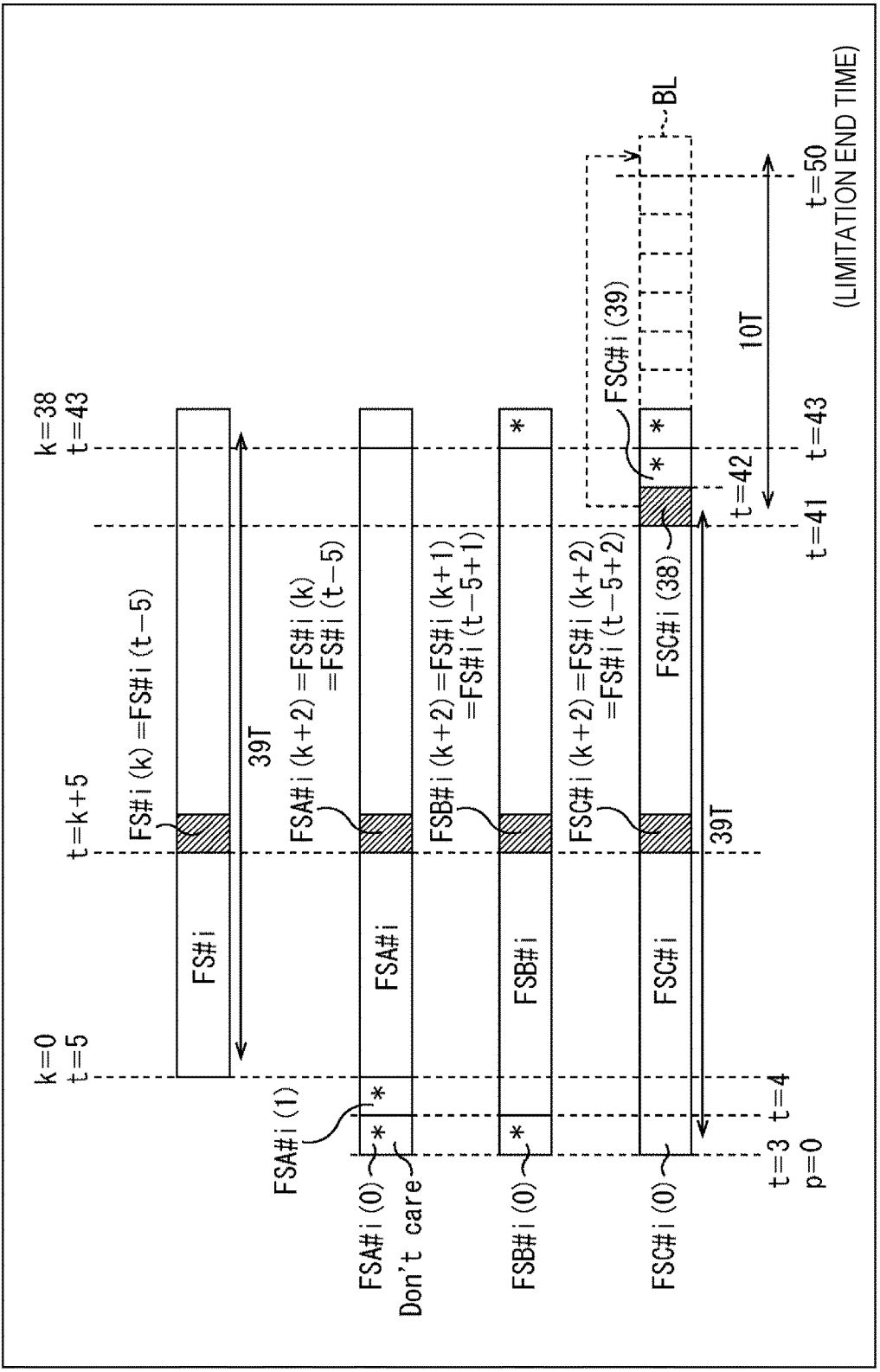
FIG. 29 is a diagram illustrating a relationship among extended FS code strings FSA#i, FSB#i, and FSC#i.

FIG. 29 is a diagram illustrating the relationship among the extended FS code strings FSA#i, FSB#i, and FSC#i.

In FIG. 29, the extended FS code strings FSA#i, FSB#i, and FSC#i are illustrated side by side with time on the horizontal axis.

In FIG. 29, among the extended FS code strings FSA#i, FSB#i, and FSC#i, for example, the time t of the first bit (first bit from the left) of the FS#i included in the extended FS code string FSA#i, that is, the third bit from the left of the extended FS code string FSA#i is set as a predetermined time, for example, the time t=5, and the extended FS code strings FSA#i, FSB#i, and FSC#i are aligned by using the time t=5 as a reference.

Herein, the (k+1)-th bit from the left of FS#i is expressed as FS#i(k).

In this case, assuming that the time of the bit FS#i (0) of the head of the FS#i is adjusted to the reference time t=5, the relationship between k and t is expressed by the formula t=k+5.

Furthermore, the bit at the time t=k+5 of the extended FS code string FSA#i is represented by FS#i(k). Furthermore, the bit at the time t=k+5 of the extended FS code string FSB#i is represented by FS#i(k+1), and the bit at the time t=k+5 of the extended FS code string FSC#i is represented by FS#i(k+2).

Now, the (p+1)-th bits from the left of the extended FS code strings FSA#i, FSB#i, and FSC#i are referred to as FSA#i(p), FSB#i(p), and FSC#i(p), respectively.

FSA#i (k+2), FSB#i (k+2), and FSC#i (k+2) are the same as FS#i (k), FS#i(k+1), and FS#i(k+2), respectively.

Herein, when the time t=5 is set as a reference as described above, the bits at the time t of the extended FS code strings FSA#i, FSB#i, and FSC#i are represented by FSA#i(t−3), FSB#i(t−3), and FSC#i(t−3), respectively.

In the maximum likelihood decoding of the FS, in a case where the FS is decoded as any one of the extended FS code strings FSA#i, FSB#i, and FSC#i, in the time-varying trellis to be used for the maximum likelihood decoding of that FS, at each time t, the state transition is limited by deleting the branches that cannot be taken for any one of the extended FS code strings FSA#i, FSB#i, and FSC#i.

With respect to the limitation of the time-varying trellis (state transition) at the time t, it is determined whether or not each branch at the time t can be taken on the basis of the bit strings FSA#i (0) to FSA#i (t−3), FSB#i (0) to FSB#i(t−3), and FSC#i(0) to FSC#i (t−3) among the extended FS code strings FSA#i, FSB#i, and FSC#i.

Herein, the bit strings FSA#i (0) to FSA#i(t−3) FSB#i(0) to FSB#i(t−3), and FSC#i(0) to FSC#i (t−3) of the extended FS code strings FSA#i, FSB#i, and FSC#i used for limiting the time-varying trellis are bit strings that can be taken as the FS and are hereinafter also referred to as FS candidate bit strings.

In addition, the bit strings from the (p+1)-th bit FSA#i (p) to the (p'+1)-th bit FSA#i(p') from the left of the extended FS code string FSA#i are represented by FSA#i[p:p'] (p<p'). The same applies to the extended FS code strings FSB#i and FSC#i.

The Bits FSA#i (0), FSA#i(1), and FSB#i(0) among the FS candidate bit strings FSA#i[0:t−3], FSB#i[0:t−3] and FSC#i[0:t−3] become "don't care".

The bits FSA#i (0) and FSB#i (0) that become "don't care" are the bits at the time t=3, the bit FSA#i (1) that becomes "don't care" is the bit at the time t=4.

In addition, at a time earlier than the time t=3, the extended FS code strings FSA#i, FSB#i, and FSC#i do not exist.

Therefore, until the time t=4, even if the FS candidate bit string does not appear, or even if the FS candidate bit string appears, since the "don't care" exists in the bit of each time of the FS candidate bit string, the time-varying trellis can take arbitrary state and branch.

In the extended FS code strings FSA#i, FSB#i, and FSC#i, the "don't care" bits no longer exist at the time t=5, and thereafter, so that the time-varying trellis is limited by the FS candidate bit string at the time t=5 and thereafter.

At the time t=5, bits FSA#i [0:5-3], FSB#i [0:5-3], and FSC#i[0:5-3], that is, bits FSA#i[0:2], FSB#i[0:2], and FSC#i[0:2] become the FS candidate bit strings.

With respect to the FS candidate bit strings FSA#i [0:2], FSB#i [0:2], and FSC#i[0:2], bits including "don't care" exist as the 2-bit FSA#i[0:1], FSB#i[0:1], and FSC#i[0:1] of the time t=3 and 4. Furthermore, any one of 0 and 1 in the NRZI representation can be taken as the bits FSA#i [2:2], FSB#i [2:2], and FSC#i [2:2] (third bits from the left of FSA#i, FSB#i, and FSC#i) of the time t=5.

Therefore, as a result, at the time t=5, the time-varying trellis is not limited to the extended FS code strings FSA#i, FSB#i, and FSC#i.

At the time t=6, bits FSA#i [0:6-3], FSB#i [0:6-3], and FSC#i[0:6-3], that is, bits FSA#i[0:3], FSB#i[0:3], and FSC#i[0:3] become FS candidate bit strings.

With respect to the FS candidate bit strings FSA#i [0:3], FSB#i [0:3], and FSC#i [0:3], bits including "don't care" exist as the 2-bit FSA#i[0:1], FSB#i[0:1], and FSC#i[0:1] of the time t=3 and 4. Furthermore, any one of 00, 01, and 10 in the NRZI representation can be taken as the 2-bit FSA#i [2:3], FSB#i[2:3], and FSC#i[2:3] of the time t=5 and 6.

Therefore, at the time t=6, the branches of which lower 2 bits are not any one of 00, 01, and 10 in the NRZI representation are limited.

Herein, in the present embodiment, as described with reference to FIG. 25, the minimum run d of the code to be subjected to the PRML is 1.

In the NRZI representation, 11 represents the inversion of two consecutive bits, so that, in a case where the minimum run d is 1, 11 cannot be taken in the NRZI representation.

That is, two bits that can be taken in a case where the minimum run d is 1 are only one of 00, 01, and 10 in the NRZI representation.

As described above, at the time t=6, the branches of which lower 2 bits are not any one of 00, 01, and 10 in the NRZI representation are limited, but all of 00, 01, and 10 in the NRZI representation are 2 bits that can be taken in a case where the minimum run d is 1.

For this reason, as a result, the time-varying trellis is not limited depending on the FS candidate bit strings FSA#i[0:3], FSB#i[0:3], and FSC#i[0:3].

At the time t=7, the bits FSA#i [0:7-3], FSB#i [0:7-3], and FSC#i [0:7-3], that is, 5-bit FSA#i[0:4], FSB#i[0:4] and FSC#i[0:4] are the FS candidate bit strings.

FIG. 30 is a diagram illustrating the FS candidate bit strings FSA#i[0:4], FSB#i[0:4], and FSC#i[0:4] in the case of the time t=7.

The FS candidate bit strings FSA#i[0:4], FSB#i[0:4], and FSC#i [0:4] in FIG. 30 are the left 5 bits of FSA#i, FSB#i, and FSC#i in FIG. 28, respectively.

At the time t=7, the branches of which the lower 5 bits are not any one of the FS candidate bit strings FSA#i [0:4], FSB#i[0:4], and FSC#i[0:4] in the NRZI representation are limited.

Herein, before the time t=6, for example, the branch b'000_0001_1001 from the state 12=b'00_0000_1100 to the state 25=b'00_0001_1001 exists in the time-varying trellis.

The branch b'000_0001_1001 is represented in the NRZ representation, but the numerical value b'000_0001_1001 representing this branch b'000_0001_1001 is b'00_0001_0101 in the NRZI representation.

The lower 5 bits of the branch b'00_0001_0101 in the NRZI representation is b'1_0101, but this 5-bit b'1_0101 is not coincident with any one of the FS candidate bit strings FSA#i[0:4], FSB#i[0:4], and FSC#i[0:4] in FIG. 30.

Therefore, the branch b'00_0001_0101 in the NRZI representation is a branch which cannot be taken as any one of the extended FS code strings FSA#i, FSB#i, and FSC#i.

For this reason, at the time t=7, the branch b'00_0001_0101 in the NRZI representation, that is, the branch b'000_0001_1001 in the NRZ representation is deleted from the time-varying trellis, and the time-varying trellis is limited to the trellis that cannot take the branch b'000_0001_1001.

Hereinafter, similarly, at the time t=7, the branches that cannot be taken as any one of the extended FS code strings FSA#i, FSB#i, and FSC#i are deleted.

Furthermore, among the states of the time-varying trellis at the time t=7, the states in which there is no branch connection, that is, the states in which there is no state transition from the past time are deleted.

As described with reference to FIG. 26, the time-varying trellis which is limited to 178 states and 288 branches with the minimum run d=1 become a trellis in which 178 states and 272 branches remain at the time t=7.

Hereinafter, similarly, at each time of the time-varying trellis, the branches that cannot be taken as any one of the extended FS code strings FSA#i, FSB#i, and FSC#i and the state in which there is no branch connection are deleted, and the time-varying trellis with the states and the branches (state transition) limited is completed by the extended FS code strings FSA#i, FSB#i, and FSC#i.

In addition, as described with reference to FIG. 29, in a case where the time t=5 is set as a reference, among the extended FS code strings FSA#i, FSB#i, and FSC#i, the bit FSC#i(39) of the extended FScode string FSC#i (FIG. 29) becomes "don't care" at the earliest time t=42. For this reason, the bits of the extended FS code strings FSA#i, FSB#i, and FSC#i after the time t=42 do not substantially limit the time-varying trellis, similarly to the case up to the time t=4.

Therefore, among the extended FS code strings FSA#i, FSB#i, and FSC#i, the bit at the latest time that affects the limitation of the time-varying trellis is the bit FSC#i(38) of the extended FS code string FSC#i at the time t=41, but the bits that are interfered with the bit FSC#i (38) are the bits, the number of which is the constraint length −1, subsequent to the bit FSC#i(38) including the bit FSC#i(38).

That is, the bits that are interfered with the bit FSC#i(38) are the 10 bits subsequent to the bit FSC#i(38) including the bit FSC#i(38).

Therefore, the latest (future) bit that is interfered with the bit FSC#i (38) is the bit BL of the bit FSC#i (38) at the time t=50=41+10−1, which is the 10-th time (including the time t=41) from the time t=41.

From, the above description, according to the extended FS code strings FSA#i, FSB#i, and FSC#i, the time-varying trellis is limited up to the time t=50 by the bit at the time t=41 of the bit FSC#i (38) or the like of the extended FS code string FSC#i.

Therefore, in a case where the time t=5 is set as a reference (in a case where the time t=5 is the time of the leftmost bit of the FS#i included in the FSA#i), the time-varying trellis is limited by the extended FS code strings FSA#i, FSB#i, and FSC#i from the time t=5 up to the time t=50.

Herein, the first time (=5) at which the time-varying trellis can be limited by the extended FS code strings FSA#i, FSB#i, and FSC#i is also referred to as a limitation start time, and the last time t (=50) is also referred to as a limitation end time.

In addition, as described with reference to FIGS. 29 and 30, the limitation of the time-varying trellis by the extended FS code strings FSA#i, FSB#i, and FSC#i is substantially limited in a period of from the time t=7 to the time t=50. That is, at the reference time t=5 or the next time t=6, the time-varying trellis is not substantially limited depending on the extended FS code strings FSA#i, FSB#i, and FSC#i.

In addition, according to the simulation performed by the inventor of the present invention, it is found that, at a time close to the limitation start time and a time close to the limitation end time, the number of states and branches to be deleted from the time-varying trellis is reduced by the extended FS code strings FSA#i, FSB#i, and FSC#i; and at a time away from the limitation start time and at a time away from the limitation end time, the number of states and branches to be deleted from the time-varying trellis is increased by the extended FS code strings FSA#i, FSB#i, and FSC#i.

<Special State>

Figure 31:
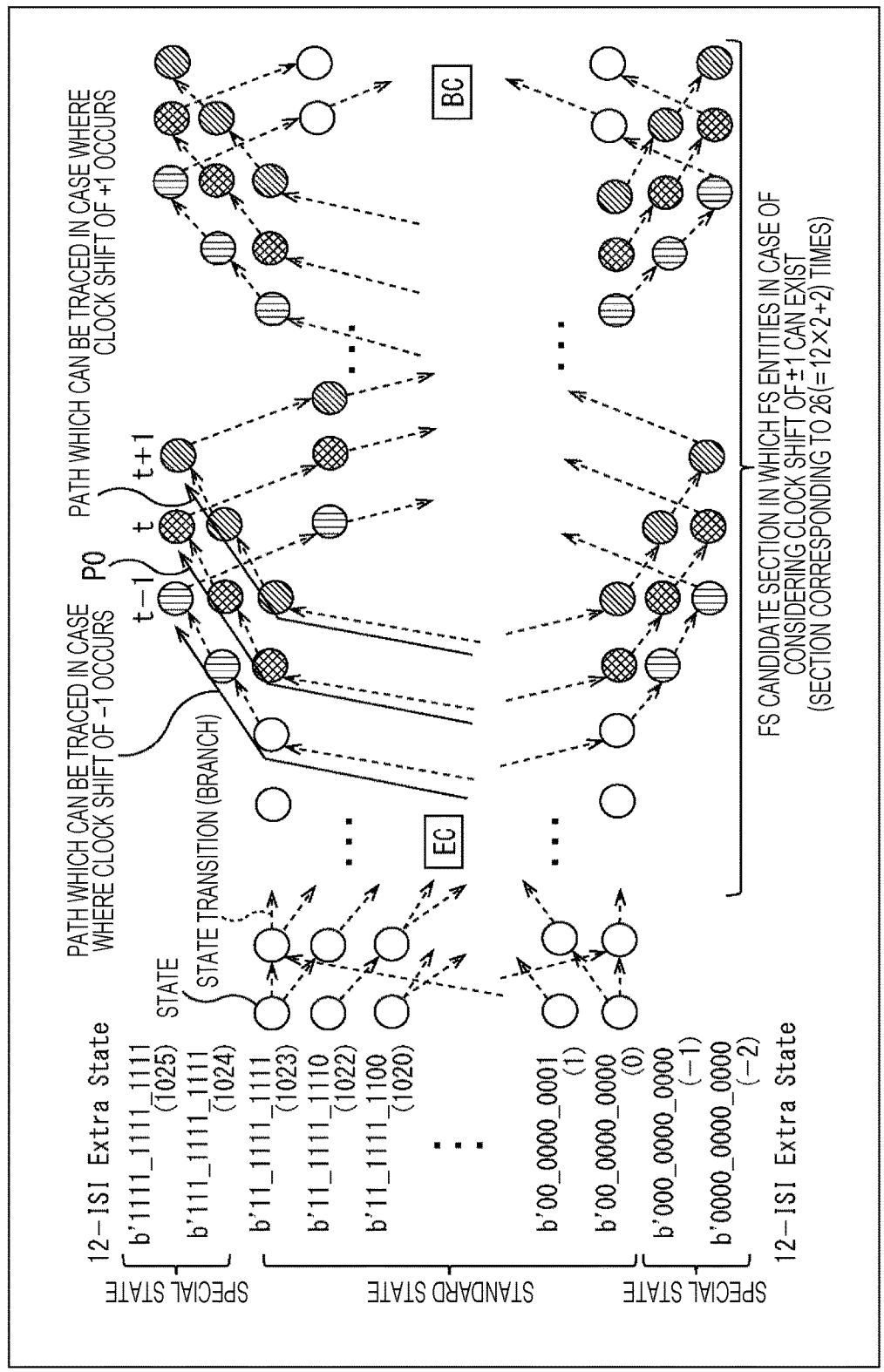
FIG. 31 is a diagram illustrating a special state.

FIG. 31 is a diagram illustrating a special state.

The time-varying trellis to be used for the maximum likelihood decoding of the FS may have $1024=2^{10}$ states as a number according to the constraint length, as described with reference to FIG. 25, unless there is any limitation. Herein, a time-varying trellis that can have a number of states according to the constraint length is also referred to as a standard time-varying trellis.

On the other hand, as described with reference to FIG. 12, the FS has the FS entity in which a pattern having a 12T run (a run exceeding the maximum run k) longer by 1T than the maximum run k=11T of the PCWA 110 code is repeated two times.

In a case where the maximum likelihood decoding of such FS is performed according to the standard time-varying trellis, in the standard time-varying trellis, for example, sometimes, the path of the FS entity including the 12T run longer than the maximum run k=11T of the PCWA 110 code and the path including the long run of the PCWA 110 code, for example, a 10T or 11T run (a pattern thereof) may merge with each other.

Herein, for example, in a PRML having a constraint length of 11, the paths having different runs of 10T or more, which is the constraint length of −1, repeatedly perform, the state transition toward the same state among the 1024 states as the number according to the constraint length such as the state transition from the state 0x000 toward the state 0x000 or the state transition from the state 0x3 FF toward the state 0x3FF, and thus, the paths merge into the same state.

As described above, in a case where the path of the FS entity including the 12T run longer than the maximum run k=11T of the PCWA 110 code merges with the path including the run of 10T or more of the PCWA 110 code, the detection accuracy of the FS entity, eventually, the FS is deteriorated.

Therefore, in order to improve the detection accuracy of the FS (the FS entity thereof), a special state is introduced into the standard time-varying trellis.

Herein, states of which the number corresponds to the constraint length that the standard time-varying trellis can have are also referred to as normal states. In addition, a trellis obtained by introducing a special state into the standard time-varying trellis is also referred to as an extended time-varying trellis.

As a special state, a state that paths of runs of each length from the run of the length of the constraint length to the 12T run of the FS entity reach is introduced so that the paths of runs of each length, from the run of the length, of the constraint length of −1 to the 12T run of the FS entity do not merge.

Therefore, in the present embodiment, the state that the path of the 0 run of 11T reaches, the state that the path of 1 run of 11T reaches, the state that the path of the 0 run of 12T reaches, and the state that the path of 1 run of 12T reaches are introduced as special states.

Herein, the state that the path of the 0 run of 11T reaches is referred to as a (special) state −1 or a state b'000_0000_0000, and the state that the path of the 1 run of 11 T reaches is referred to as a (special) state 1024 or a state b'111_1111_1111. Furthermore, the state that the path of the 0 run of 12T reaches is referred to as a (special) state −2 or a state b'0000_0000_0000, and the state that the path of the 1 run of 12T reaches is referred to as a (special) state 1025 or a state b'1111_1111_1111.

As described above, according to the extended time-varying trellis introducing the special states −2, −1, 1024, and 1025, it is possible to prevent the paths of the runs of the lengths of the 10T run, the 11T run, and the 12T run of the FS entity from merging with each other.

That is, in the extended time-varying trellis, for example, the path of the 1 run of 10T reaches the state 1023, the path of the 1 run of 11T reaches the state 1024, and the path of the 1 run of 12T reaches the state 1025.

Therefore, it is possible to prevent the path of the 10T run, the path of the 11T run, and the path of the 12T run from merging into the same state, and it is possible to improve the detection accuracy of the FS (FS entity).

For example, in a case where a clock shift does not occur, the path P0 of the first 12T run out of the of the two 12T runs of the FS entity reaches the special state 1025 at the time t. The path P0 reaches the special state 1025 via the state 1023 and further the special state 1024.

As described above, in a case where a clock shift does not occur, if the path P0 reaches the special state 1025 at the time t, for example, if a clock shift of −1 clock occurs, the path P0 reaches the special state 1025 at the one-time preceding time t−1.

In addition, for example, in a case where a clock shift of +1 clock occurs, the path P0 reaches the special state 1025 at the time t+1 after one time.

Therefore, it is possible to detect the amount and direction of the clock shift according to the time when the path P0 reaches the special state 1025 (the last time of the first 12T run out of the two 12T runs of the FS entity).

In addition, the PCWA 110 code has a limitation that the RMTR is 2, in addition to the limitation of the minimum run d=1 and the maximum run k=10.

The extended time-varying trellis can be limited according to the minimum run d=1, the extended FS code strings FSA#i, FSB#i, and FSC#i, and the RMTR of 2.

In a case where the extended time-varying trellis is limited by the minimum run d=1, the extended FS code strings FSA#i, FSB#i, and FSC#i, and the RMTR of 2, the maximum number of states that can be taken by the extended time-varying trellis at each time becomes 170, and the maximum number of branches that can be taken becomes 272.

<Configuration Example of Restoration unit 35>

Figure 32:
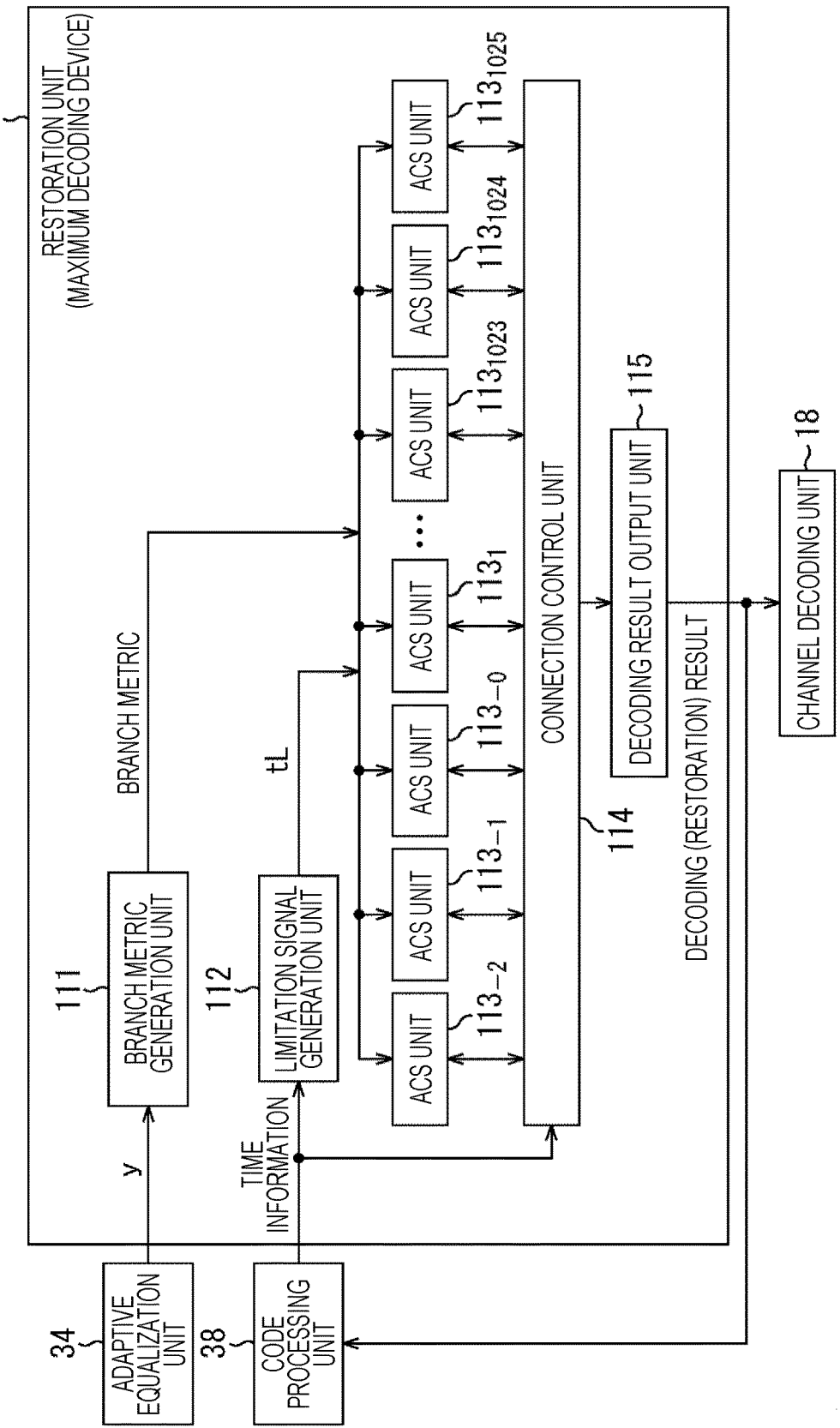
FIG. 32 is a block diagram illustrating a configuration example of a restoration unit 35.

FIG. 32 is a block diagram illustrating a configuration example of the restoration unit 35 in FIG. 4.

That is, FIG. 32 illustrates a configuration example of portions in the restoration unit 35, which can function as a maximum likelihood decoding device that performs the maximum likelihood decoding according to the extended time-varying trellis.

In FIG. 32, the restoration unit 35 as a maximum likelihood decoding device includes a branch metric generation unit 111, a limitation signal generation unit 112, an add compare select (ACS) unit $113_i$, a connection control unit 114, and a decoding result output unit 115.

The equalized signal y is supplied from the adaptive equalization unit 34 (FIG. 4) to the branch metric generation unit 111.

The branch metric generation unit 111 calculates and generates the branch metric $bm_j$ of the branch from the state j to the state i according to Formula (3) using the equalized signal y from the adaptive equalization unit 34.

$$bm_j = (y - \Sigma a_m \times d(j,i)_{CL-1-m})^2 \qquad (3)$$

In Formula (3), $a_m$ represents an (m+1)-th coefficient of an impulse response sequence of the PR channel (an (m+1)-th coefficient $a_m$ of $Pr(a_0, a_1, \ldots, a_{CL-1})$). $d(j,i)_k$ is a (k+1)-th input data ((k+1)-th old input data) among the time-series input data of the latest CL times for the path including the branch from the state j to the state i (k=0, 1, ..., and CL−1). CL represents the constraint length of the PR channel. $\Sigma$ represents a summation by changing m to an integer from 0 to CL−1.

According to Formula (3), the branch metric $bm_j$ is obtained as a square of a difference between the reference level $\Sigma a_m \times d(j, i)_{CL-1-m}$ obtained by convoluting the impulse response sequences $a_0, a_1, \ldots$, and $a_{CL-1}$ of the PR channel and the time series of the input data $d(j,i)_0, d(j,i)_1, \ldots$, and $d(j, i)_{CL-1}$ corresponding to and the most recent CL times for the paths including the branch from the state j to the state i and the equalized signal y.

Herein, the reference level $\Sigma a_m \times d(j,i)_{CL-1-m}$ may be obtained in advance for all the time series of the input data $d(j,i)_0, d(j,i)_1, \ldots$, and $d(j,i)_{CL-1}$ corresponding to the CL times.

For each state i that can be taken by the extended time-varying trellis, the branch metric generation unit 111 calculates a branch metric $bm_j$ of a branch that can be taken as a branch to the state i and supplies the branch metric $bm_j$ to the ACS unit $113_i$ corresponding to the state i.

The time information is supplied from the time information generation unit 62 (FIG. 6) of the code processing unit 38 to the limitation signal generation unit 112.

Herein, for example, as described with reference to FIG. 29, the time information supplied to the limitation signal generation unit 112 by the code processing unit 38 (the time information generation unit 62 thereof) indicates that the time corresponding to the third bit from the left of the extended FS code string FSA#i represents the time t set to be the time t=5 and is the time based on the FS (the position as estimated to be the FS) as a reference.

According to the time t indicated by the time information from the code processing unit 38 (the time information generation unit 62 thereof), the limitation signal generation unit 112 generates a limitation signal tL that limits the extended time-varying trellis according to the minimum run d of the PCWA 110 code, the RMTR, and the extended FS code string FSA#i, FSB#i, and FSC#i and supplies the limitation signal to the ACS unit $113_i$.

According to the limitation signal tL, the ACS unit $113_i$ controls the selection of the state metric in the state of the current time and the selection of the surviving path that survives up to the state of the current time, so that the maximum likelihood decoding of the FS is performed according to the extended time-varying trellis limited according to the minimum run d of the PCWA 110 code, the RMTR, and the extended FS code strings FSA#i, FSB#i, and FSC#i.

That is, the ACS unit $113_i$ obtains the state metric candidate of the state i of the current time by adding the state metric $sm_j$ of the state j and the branch metric $bm_j$ of the branch to the state i of the current time to each of one or more one-time preceding states, for example, the state j=j0, j1, and j2 corresponding to the state i of the extended time-varying trellis.

Furthermore, the ACS unit $113_i$ compares the state metric candidates of the state i of the current time and selects the candidate having the smallest value from the state metric candidates as the state metric $sm_i$ of the state i of the current time.

In addition, the ACS unit $113_i$ selects the surviving path that survives up to the state i of the current time from the surviving paths up to the one-time preceding states j=j0, j1, and j2.

That is, in obtaining the state metric $sm_i$ of the state i of the current time from the one-time preceding states j=j0, j1, and j2, the ACS unit $113_i$ sets the state j for which the state metric $sm_j$ is used as a surviving state and selects the path connecting the branch from the surviving state j to the state i of the current time to the surviving path up to the surviving state j as a surviving path that survives up to the state i of the current time.

As described above, the ACS unit $113_i$ performs the selection of the state metric $sm_i$ of the state i of the current time and the selection of the surviving path that survives up to the state i of the current time, and these selections are controlled by the limitation signal tL from the limitation signal generation unit 112. Under the control of the limitation signal T1, the extended time-varying trellis used for the maximum likelihood decoding of the FS is limited according to the minimum run d=1, the extended FS code strings FSA#i, FSB#i, and FSC#i, and the RMTR.

The ACS unit $113_i$ corresponds to the state i that can betaken by the extended time-varying trellis. For this reason, the restoration unit 35 includes at least the ACS units $113_i$ of which the number is the same as the number of states that can be taken by the extended time-varying trellis.

The ACS units $113_i$ corresponding to the $1024=2^{10}$ states as the number corresponding to the constraint length of 11 and the 1028 states which is the total of the special states −2, −1, 1-24, and 1025 illustrated in FIG. 31 are provided in the restoration unit 35, so that the restoration unit 35 can perform the maximum likelihood decoding on arbitrary PRs of which the constraint length is 11 as well as the maximum likelihood decoding of the FS according to the extended time-varying trellis.

Hereinafter, for simplifying the description, the restoration unit 35 includes the ACS units $113_i$ corresponding to the $1024=2^{10}$ states (normal states) as the number corresponding to the constraint length of 11 and the 1028 states which is the total of the special states −2, −1, 1-24, and 1025.

The time information is supplied from the time information generation unit 62 (FIG. 6) of the code processing unit 38 to the connection control unit 114.

The connection control unit 114 controls the connection between an arbitrary ACS unit $113_i$ and an arbitrary ACS unit $113_j$ according to the time t indicated by the time information from the code processing unit 38 (the time information generation unit 62 thereof) and enables data exchange between the ACS unit $113_i$ and the ACS unit $113_j$.

Furthermore, the connection control unit 114 controls the connection between an arbitrary ACS unit $113_i$ and the decoding result output unit 115 according to the time t indicated by the time information from the code processing unit 38 and enables data exchange between the ACS unit 113 and the decoding result output unit 115.

The decoding result output unit 115 receives the state metric $sm_i$ of each state i from the ACS unit $113_i$ through the connection control unit 114 and recognizes the state i having the smallest state metric $sm_i$.

Furthermore, the decoding result output unit 115 receives the surviving path that survives up to the state i from the ACS unit $113_i$ corresponding to the state i having the smallest state metric $sm_i$ obtains the bit string as the decoding result of the maximum likelihood decoding according to the surviving path, and outputs the bit string to the channel decoding unit 18 (FIG. 1) and the code processing unit 38 (FIG. 4).

<Configuration Example of ACS Unit $113_1$>

Figure 33:
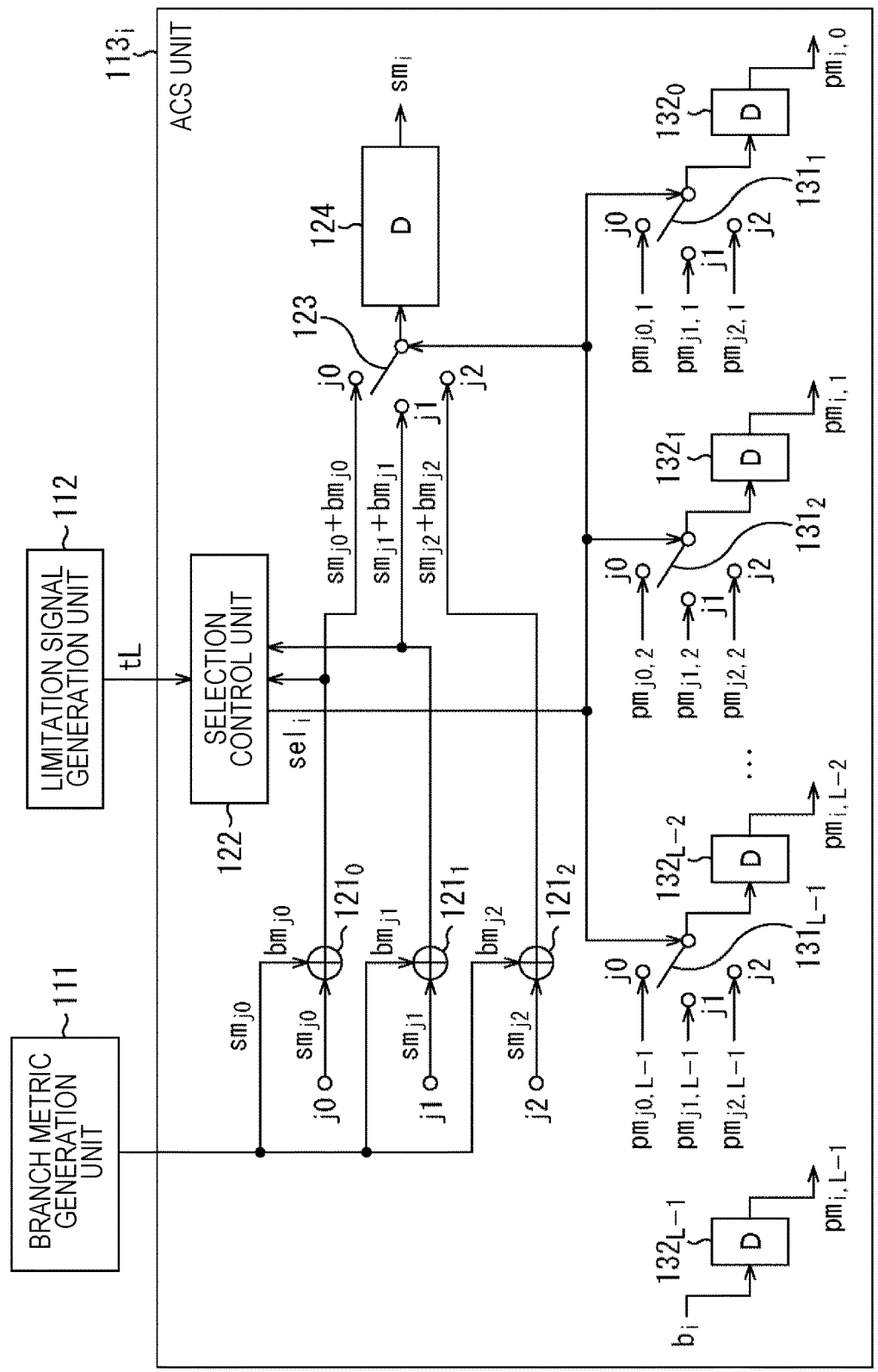
FIG. 33 is a block diagram illustrating a configuration example of an ACS unit $113_j$.

FIG. 33 is a block diagram illustrating a configuration example of the ACS unit $113_i$ in FIG. 32.

In FIG. 33, the ACS unit $113_i$ includes arithmetic units $121_0$, $121_1$, and $121_2$, a selection control unit 122, a selector 123, a state metric memory 124, selectors $131_1$, $131_2$, ..., and $131_{L-1}$ and path memories $132_0$, $132_1$, ..., and $132_{L-1}$.

The arithmetic unit $121_k$ has a terminal j#k (k=0, 1, and 2). The state metric $sm_{j\#k}$ of the one-time preceding state j#k stored in the state metric memory $121_k$ of the ACS unit $113_{j\#k}$ corresponding to the state j#k is supplied to the terminal j#k of the arithmetic unit $121_k$ through the connection control unit 114 (FIG. 32).

Herein, the state metric memory 124 of the ACS unit $113_{j\#k}$ corresponding to the state j#k in which the state transition to the state i is enabled at the current time according to the extended time-varying trellis is connected to the terminal j#k of the arithmetic unit $121_k$ through the connection control unit 114.

In addition, the branch metric $bm_{j\#k}$ of the branch from the state j#k to the state i is supplied to the arithmetic unit $121_k$ from the branch metric generation unit 111 (FIG. 32).

By adding the state metric $sm_{j\#k}$ supplied to the terminal j#k of the arithmetic unit $121_k$ and the branch metric $bm_{j\#k}$ from the branch metric generation unit 111, the arithmetic unit $121_k$ obtains the state metric candidate $sm_{j\#k}+bm_{j\#k}$ of the state i of the current time, and supplies the state metric candidate to the terminal j#k of the selector 123.

In addition, the arithmetic units $121_0$ and $121_1$ also supply the state metric candidates $sm_{j0}+bm_{j0}$ and $sm_{j1}bm_{j1}$ of the state i of the current time to the selection control unit 122.

The selection control unit 122 is supplied with the limitation signal tL from the limitation signal generation unit 112 (FIG. 32).

The selection control unit 122 generates the selection signal sell according to the limitation signal tL from the limitation signal generation unit 112. Furthermore, the selection control unit 122 supplies the selection signal sell to the selector 123 and the selectors $131_1$ to $131_{L-1}$, so that the selection of the terminal j#k of the selector 123 and the selection of the terminal j#k of each of the selectors $131_1$ to $131_{L-1}$ are controlled.

In addition, the selection control unit 122 generates the selection signal $sel_i$ according to the state metric candidates $sm_{j0}+bm_{j0}$ and $sm_{j1}bm_{j1}$ of the state i of the current time from the arithmetic units $121_0$ and $121_0$, respectively, if necessary.

The selection of the terminal j#k of the selector 123 corresponds to the selection of the state metric $sm_i$ of the state i of the current time, and the selection of the terminal j#k of each of the selectors $131_1$ to $131_{L-1}$ corresponds to the selection of the surviving path up to the state i of the current time.

The selector 123 selects the terminal j#k of the selector 123 according to the selection signal sell from the selection control unit 122, so that the state metric candidate $sm_{j\#k} + bm_{j\#k}$ supplied to the terminal j#k as the state metric $sm_i$ of state i of the current time.

Then, the selector 123 supplies the state metric $sm_i$ of the state i of the current time to the state metric memory 124.

The state metric memory 124 stores the state metric $sm_i$ of the state i of the current time from the selector 123.

The selector $131_r$ has (r=1, 2, . . . , and L−1) and has a terminal j#k. Herein, L represents the path memory length. At the terminal j#k of the selector $131_r$, the branch information $pm_{j\#k,r}$ indicating the branches constituting the surviving path up to the one-time preceding state j#k, which is stored in the path memory 132r of the ACS unit $113_{j\#k}$, is supplied through the connection control unit 114 (FIG. 32).

That is, the path memory 132r of the ACS unit $113_{j\#k}$ corresponding to the state j#k that can state-transition to the state i at the current time according to the extended time-varying trellis is connected to the terminal j#k of the selector 131r through the connection control unit 114, similarly to the terminal j#k of the arithmetic unit $121_k$.

In addition, in the present embodiment, the ACS unit $113_{j\#k}$ connected to the terminal j#k of the arithmetic unit $121_k$ and the selector $131_r$ is set in advance according to the extended time-varying trellis.

That is, the ACS unit $113_{j0}$ corresponding to a state (normal state or special state) j0 of a number equal to or smaller than the number of the state i among the states that can transition toward the state i corresponding to the ACS unit $113_i$ according to the extended time-varying trellis can be connected to the terminal 10, and the ACS unit $113_{j1}$ corresponding to a state (normal state or special state) j1 of a number larger than the number of the state i among the states that can transition toward the state i corresponding to the ACS unit $113_i$ according to the extended time-varying trellis can be connected to the terminal j1.

Only the ACS unit $113_{j2}$ corresponding to the special state j2 can be connected to the terminal j2 according to the extended time-varying trellis.

The selector 131r selects the terminal j#k of the selector 131r according to the selection signal sell from the selection control unit 122, so that the branch information $pm_{j\#k,r}$ of the branch constituting the surviving path up to the one-time preceding state j#k supplied to the terminal j#k is selected as the branch information $pm_{i,r-1}$ of the branches constituting the surviving path that survives up to the state i of the current time.

Then, the selector 131r supplies the branch information $pm_{i,r-1}$ of the branches constituting the surviving path that survives up to the state i of the current time to the path memory $132_{r-1}$.

Among the path memory 132r (r=0, 1, . . . , and L−1), the path memory 132r which is the path memories $132_0$ to $131_{L-2}$ stores the branch information $pm_{i,r+1}$ of the branches constituting the surviving path that survives up to the state i of the current time supplied from the selector $131_{r+1}$.

The path memory $132_{L-1}$ stores the branch information $b_i$ representing the branch from the state j#k to the state i.

Herein, the branch information $b_i$ of the branch from the state j#k to the state i is uniquely determined by the state i of the state transition destination and is equal to the least significant bit of the binary number representing the state i.

In the selector $131_r$, the branch information $pm_{j\#k,r}$ of the branches constituting the surviving path up to the one-time preceding state j#k is selected as the branch information $pm_{i,r-1}$ of the branches constituting the surviving path that survives up to the state i of the current time, the branch information $pm_{i,r-1}$ is stored in the path memories $132_0$ to $131_{L-2}$, and the branch information $b_i$ representing the branch from, the state j#k to the state i is stored in the path memory $132_{L-1}$, so that the storage contents of the path memories $132_0$ to $131_{L-1}$ are updated, to the surviving path (branches constituting the surviving path) up to the state i. The process of updating the stored contents of the path memories $132_0$ to $131_{L-1}$ is called register exchange.

In the ACS unit $113_i$ configured as described above, the selectors 123 and $131_r$ select, the terminal j#k according to the selection signal $sel_i$ from the selection control unit 122 as described above, but the selection signal sell is generated according to the limitation signal tL from the limitation signal, generation unit 112.

In the present embodiment, as the limitation signal tL from the limitation signal generation unit 112, there are five types of tL=0, 1, 2, 3, and 4.

In a case where the limitation signal tL=0, the selection control unit 122 outputs the selection signal $sel_i$=−1, indicating that the state i corresponding to the ACS unit $131_i$ is invalid (does not exist). In a case where the selection signal $sel_i$=−1, the selectors 123 and $131_r$ stop the operation (selection of the terminal j#k is not performed).

In a case where the limitation signal tL=1, the selection control unit 122 outputs the selection signal $sel_i$=0 instructing the selection of the terminal j0. In a case where the selection signal $sel_i$=0, the selectors 123 and $131_r$ select the terminal j0.

In a case where the limitation signal tL=2, the selection control unit 122 outputs the selection signal $sel_i$=1 instructing selection of the terminal j1. In a case where the selection signal $sel_i$=1, the selectors 123 and $131_r$ select the terminal j1.

In a case where the limitation signal tL=3, the selection control unit 122 outputs a selection signal $sel_i$=0 or 1 for instructing selection of the terminal j#k supplied with a smaller candidate $sm_{j\#k}+bm_{j\#k}$ among the state metric candidates $sm_{j0}+bm_{j0}$ and $sm_{j1}bm_{j1}$ of the state i of the current time from the respective arithmetic unit $121_0$ and $121_0$ among the terminal j0 and j1. As described above, in a case where the selection signal $sel_i$=0, the selectors 123 and $131_r$ select the terminal j0; and in a case where the selection signal $sel_i$=1, the selectors 123 and $131_r$ select the terminal j1.

In a case where the limitation signal tL=4, the selection control unit 122 outputs the selection signal $sel_i$=2 instructing the selection of the terminal j2. In a case where the selection signal $sel_i$=2, the selectors 123 and $131_r$ select the terminal j2.

Herein, the selection of the terminal j0 of the selectors 123 and $131_r$ corresponds to the selection of the branch from the state j0 to the state i corresponding to the ACS unit $113_{j0}$ connected to the terminal j0, and the selection of the terminal j1 corresponds to the selection of the branch from state j1 to the state i corresponding to the ACS unit $113_{j1}$ connected to the terminal j1. In addition, the selection of the terminal 12 corresponds to the selection of the branch from the state (special state) j2 to the state i corresponding to the ACS unit $113_{j2}$ connected to the terminal j2.

<Time Information Generating Process>

Figure 34:
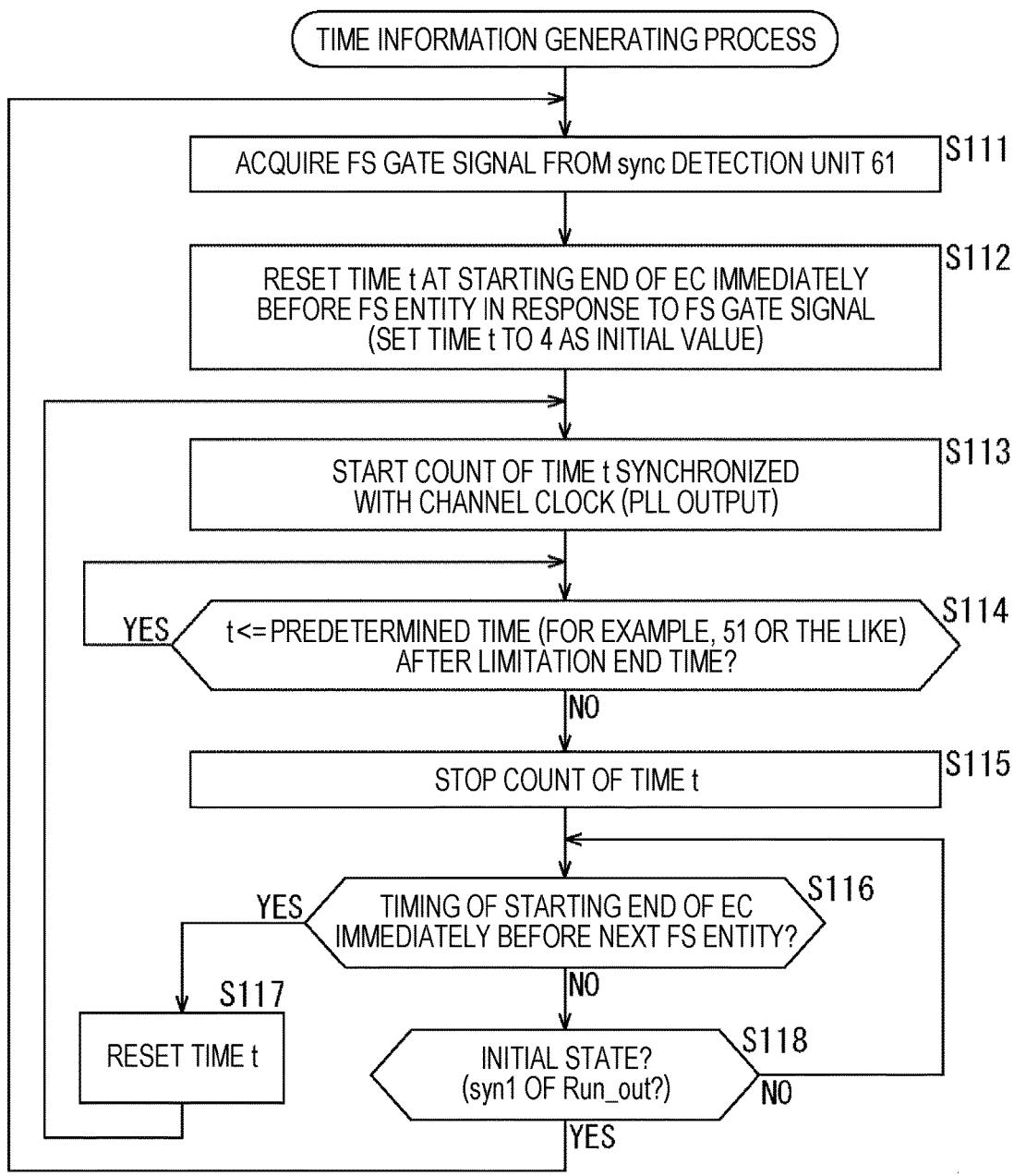
FIG. 34 is a flowchart illustrating an example of a time information generating process performed by the time information generation unit 62 of the code processing unit 38.

FIG. 34 is a flowchart illustrating an example of time information generating process performed by the time information generation unit 62 of the code processing unit 38 of FIG. 6.

In step S111, the time information generation unit 62 waits for supply of the FS gate signal representing the section of the FS of the leading frame 1 of the RUB (FIG. 9) from the sync detection unit 61 and receives the FS gate signal to acquire the FS gate signal, and the process proceeds to step S112.

In step S112, the time information generation unit 62 recognizes the timing of the start point of the EC immediately before the FS entity of the FS in the frame 1 according to the FS gate signal from the sync detection unit 61. Then, the time information generation unit 62 resets the time t to, for example, 4 as the initial value at the timing of the start point of the EC immediately before the FS entity of the FS in the frame 1, and the process proceeds from step S112 to step S113.

Herein, the RUB having the frame 1 including the FS indicated by the FS gate signal from the sync detection unit 61 is also referred to as an RUB of attention.

In step S113, the time information generation unit 62 starts counting the time t synchronized with the channel clock output from the PLL 32 (FIG. 4) and outputting the time information indicating the time t, and the process proceeds to step S114.

In step S114, the time information generation unit 62 determines whether or not the time t is a time after the last limitation end time (the time t=50 described with reference to FIGS. 29 and 30 in this embodiment) in which the extended time-varying trellis can be limited, that is, for example, a time within 51.

In a case where it is determined in step S114, that the time t is within 51, the process returns to step S114, and similar processes are repeated. In this case, counting the time t and outputting the time information indicating the time t are continued.

On the other hand, in a case where it is determined in step S114 that the time t is not within 51, the process proceeds to step S115, the time information generation unit 62 stops counting the time t and outputting the time information indicating the time t, and the process proceeds to step S116.

In step S116, the time information generation unit 62 determines whether or not the timing of the start point of the EC immediately before the FS entity of the FS in the next frame of the RUB of attention has come.

Herein, as illustrated in FIG. 9, in the RUB, the frame data of 3,600 cbits follows the FS of the frame, and then the FS of the next frame follows.

Therefore, the time information generation unit 62 counts the channel clocks corresponding to the frame data of 3,600 cbits, that is, the channel clocks of 3,600 clocks after the end of the FS, so that the time information generation unit 62 determines whether or not the timing of the start point of the EC immediately before the FS entity of the FS in the next frame of the RUB of attention has come.

In a case where it is determined in step S116 that the timing of the start point of the EC immediately before the FS entity of the FS in the next frame of the PUB of attention has come, the process proceeds to step S117.

In step S117, the time information generation unit 62 resets the time t to 4 as the initial value at the timing of the start point of the EC immediately before the FS entity of the FS in the next frame of the RUB of attention similarly to step S112. Then, the process returns to step S113, and after that, similar processes are repeated.

In addition, in a case where it is determined in step S116 that the timing of the start point of the EC immediately before the FS entity of the FS in the next frame of the RUB of attention has not come, the process proceeds to step S118.

In step S118, the time information generation unit 62 determines whether or not the reproduction of the Run_out (syn1 thereof) of the RUB of attention is ended, that is, whether or not the sync detection unit 61 is returned from the sync area possibility state described with reference to FIG. 22 to the initial state.

In a case where it is determined in step S118 that the sync detection unit 61 has not returned to the initial state, the process returns to step S116, and after that, similar processes are repeated.

In addition, in a case where it is determined in step S118 that the sync detection unit 61 has returned to the initial state, that is, in a case where the reproduction of the RUB of attention is ended and the reproduction of the next RUB is started, the process returns to step S111, and after that, similar processes are repeated.

According to the time information generating process described above, ideally, the time information generation unit 62 resets the time t to 4 at the timing of the start point of the EC immediately before the FS entity, starts counting the time t of synchronization with the channel clock, repeats the counting of the time t up to, for example, 51, which is the time after the limitation end time of 50.

<Maximum Likelihood Decoding Process>

Figure 35:
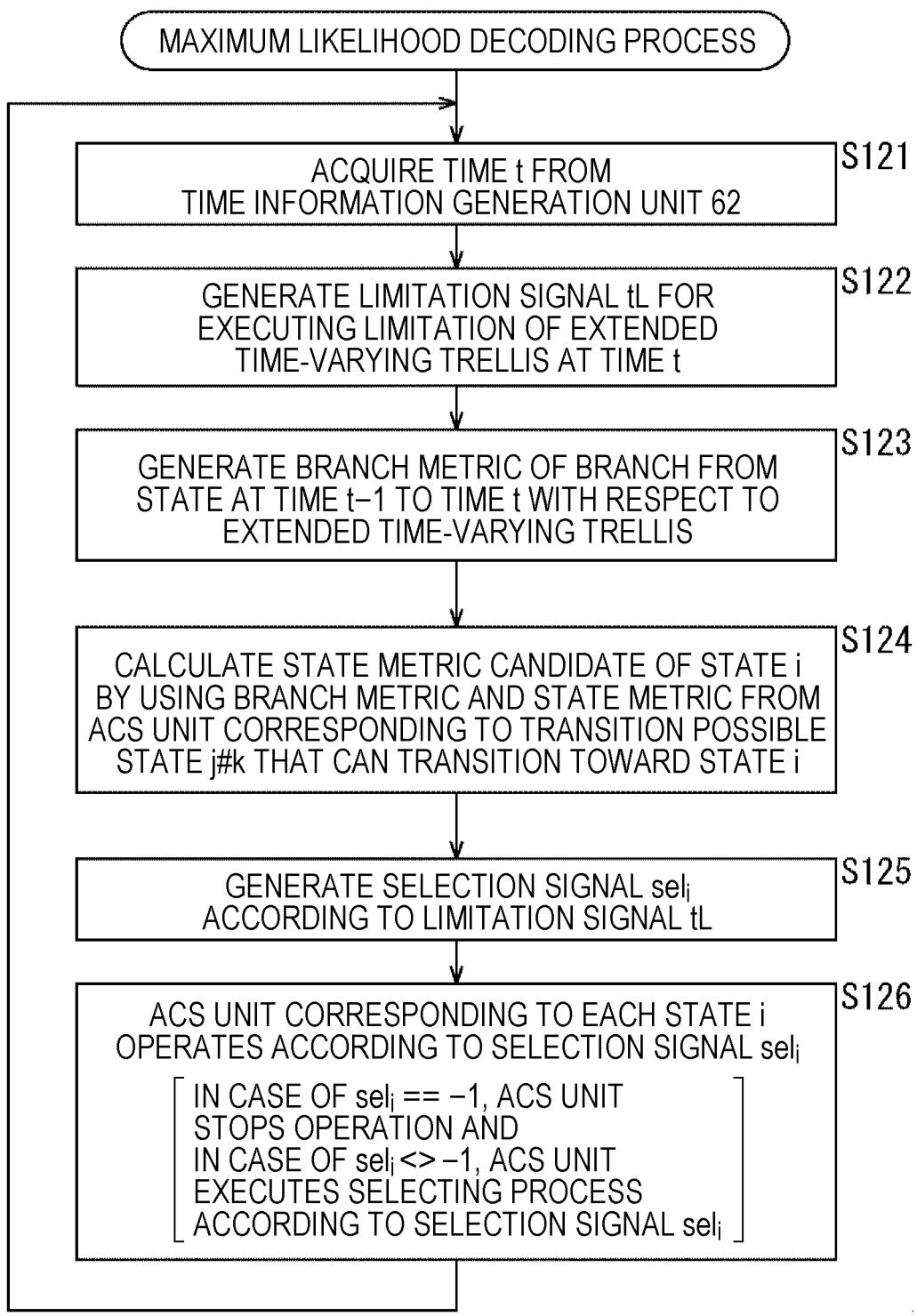
FIG. 35 is a flowchart illustrating a maximum likelihood decoding process performed by the restoration unit 35 as a maximum likelihood decoding device.

FIG. 35 is a flowchart illustrating the maximum likelihood decoding process performed by the restoration unit 35 as the maximum likelihood decoding device in FIG. 32.

In step S121, the limitation signal generation unit 112 and the connection control unit 114 wait for supply of the time information (the time t indicated by the time information) from the time information generation unit 62 (FIG. 6) of the code processing unit 38 and acquires the time information, and the process proceeds to step S122.

Hereinafter, according to the time t indicated by the time information from the time information generation unit 62, the connection control unit 114 connects ACS unit $113_i$ and the ACS unit $113_j$ corresponding to the state i and the state j, respectively, in which the state transition can be performed in the extended time-varying trellis and enables exchange of data between the ACS unit $113_i$ and the ACS unit $113_j$.

That is, in the connection control unit 114, the terminal j#k of the arithmetic unit $121_k$ of the ACS unit $113_i$ and the state metric memory 124 of the ACS unit $113_{j\#k}$ are connected to each other, and the terminal j#k of the selector $131_r$ of the ACS unit $113_i$ and the path memory $132_r$ of the ACS unit $113_{j\#k}$ are connected to each other.

In step S122, the limitation signal generation unit 112 generates the limitation signal tL for executing the limitation of the extended time-varying trellis (state transition thereof) at the (current) time t indicated by the time information from the time information generation unit 62 with respect to each state i existing at the time t. Furthermore, the limitation signal generation unit 112 supplies the limitation signal tL generated with respect to each state i existing at the time t to the ACS unit $113_i$ corresponding to each state i, and the process proceeds from step S122 to step S123.

In step S123, the branch metric generation unit 111 calculates the branch metric $bm_j$ of the branch from the state j of the time t−1 to the state i, which can transition toward each state i exiting at the time t, according to Formula (3) to generate the branch metric. Furthermore, the branch metric generation unit 111 supplies the branch metric $bm_j$ of the branch from the state j to the state i to the ACS unit $113_i$ corresponding to the state i, and the process proceeds from step S123 to step S124.

In steps S124 to S126, the ACS unit $113_i$ corresponding to each state i existing in the extended time-varying trellis performs the ACS process.

That is, in step S124, the arithmetic unit $121_k$ of the ACS unit $113_i$ obtains the state metric candidate $sm_{j\#k}+bm_{j\#k}$ of the state i of the current time t by adding the state metric $sm_{j\#k}$ from the ACS unit $113_{j\#k}$ corresponding to the state (transition possible state) j#k that can state-transition toward the state i, which is supplied to the terminal j#k of the arithmetic unit $121_k$, and the branch metric $bm_{j\#k}$ from the branch metric generation unit 111. Furthermore, the arithmetic unit $121_k$ supplies the state metric candidate $sm_{j\#k}+bm_{j\#k}$ of the state i of the current time t to the terminal j#k of the selector 123, and the process proceeds from step S124 to step S125.

In addition, the arithmetic units $121_0$ and $121_1$ also supply the state metric candidates $sm_{j0}+bm_{j0}$ and $sm_{j1}bm_{j1}$ of the state i of the current time to the selection control unit 122.

In step S125, the selection control unit 122 generates the selection signal sell by using the limitation signal tL from the limitation signal generation unit 112, and using the state metric candidates $sm_{j0}+bm_{j0}$ and $sm_{j1}bm_{j1}$ of the state i of the current time from, the arithmetic units $121_0$ and $121_1$ if necessary. Furthermore, the selection control unit 122 supplies the selection signal sell to the selector 123 and the selector $131_r$, and the process proceeds from step S125 to step S126.

In step S126, the ACS unit $113_i$ operates according to the selection signal sell generated by the selection control unit 122.

In a case where the selection signal $sel_i=-1$, the ACS unit $113_i$ stops the operation. Therefore, the selectors 123 and $131_r$ of the ACS unit $113_i$ also stop the operation (the selection of the terminal j#k is not performed).

In a case where the selection signal $sel_i < >-1$, the ACS unit $113_i$ performs the following selection process according to the selection signal $sel_i$.

That is, in a case where the selection signal $sel_i=0$, the selectors 123 and $131_r$ select the terminal j0, so that the state j0 is selected as the state of the transition source of the state transition (branch) toward the state i of the current time t corresponding to the ACS unit $113_i$.

Then, the selector 123 selects the terminal j0, and thus, among the state metric candidates $sm_{j\#k}+bm_{j\#k}$ of the state i of the current time t, the candidate $sm_{j0}+bm_{j0}$ obtained by using the state metric candidate $sm_{j0}$ of the state j0 of the transition source is supplied as the state metric $sm_i$ of the state i of the current time t through the selector 123 to the state metric memory 124 and is stored in the state metric memory.

In addition, the selector $131_r$ selects the terminal j0, and thus, register exchange for updating the storage contents of the path memories $132_0$ to $131_{L-1}$ is performed. That is, the branch information $pm_{j0,r}$ from the ACS unit $113_{j0}$ corresponding to the state j0 of the transition source is supplied to the path memory $132_{r-1}$ (r=1, 2, . . . , and L−1) through the selector $131_r$ and stored in the path memory. Furthermore, the branch information $b_i$ representing the branch from, the state j0 of the transition source to the state i is stored in the path memory $132_{L-1}$.

In a case where the selection signal $sel_i=1$, the selectors 123 and $131_r$ select the terminal j1, so that the state j1 is selected as the state of the transition source of the state transition (branch) toward the state i of the current time t corresponding to the ACS unit $113_i$.

Then, the selector 123 selects the terminal j1, and thus, among the state metric candidates $sm_{j\#k}+bm_{j\#k}$ of the state i of the current time t, the candidate $sm_{j1}+bm_{j1}$ obtained by using the state metric candidate $sm_{j1}$ of the state j1 of the transition source is supplied as the state metric $sm_i$ of the state i of the current time t through the selector 123 to the state metric memory 124 and is stored in the state metric memory.

In addition, the selector $131_r$ selects terminal j1, and thus, register exchange for updating the storage contents of the path memories $132_0$ to $131_{L-1}$ is performed. That is, the branch information $pm_{j1,r}$ from the ACS unit $113_{j1}$ corresponding to the state j1 of the transition source is supplied to the path memory $132_{r-1}$ (r=1, 2, . . . , and L−1) through the selector $131_r$ and stored in the path memory. Furthermore, the branch information $b_i$ representing the branch from the state j1 of the transition source to the state i is stored in the path memory $132_{L-1}$.

In a case where the selection signal $sel_i=2$, the selectors 123 and $131_r$ select the terminal j2, so that the state j2 is selected as the state of the transition source of the state transition (branch) toward the state i of the current time t corresponding to the ACS unit $113_i$.

Then, the selector 123 selects the terminal j2, and thus, among the state metric candidates $sm_{j\#k}+bm_{j\#k}$ of the state i of the current time t, the candidate $sm_{j2}+bm_{j2}$ obtained by using the state metric candidate $sm_{j2}$ of the state j2 of the transition source is supplied as the state metric $sm_i$ of the state i of the current time t through the selector 123 to the state metric memory 124 and is stored in the state metric memory.

In addition, the selector $131_r$ selects the terminal j2, and thus, register exchanges for updating the storage contents of the path memories $132_0$ to $131_{L-1}$ is performed. That is, the branch information $pm_{j2,r}$ from the ACS unit $113_{j2}$ corresponding to the state j2 of the transition source is supplied to the path memory $132_{r-1}$ (r=1, 2, . . . , and L−1) through the selector $131_r$ and stored in the path memory. Furthermore, branch information $b_i$ representing the branch from the state j2 of the transition source to the state i is stored in the path memory $132_{L-1}$.

After that, the process returns from step S126 to step S121, and the processes of steps S121 to S126 are repeated.

By repeating the processes of steps S121 to S126, the state metric $sm_i$ of the state i stored in the state metric memory 124 of the ACS unit $113_i$ corresponding to each state i and the branch information $pm_{i,r}$ stored in the path memory $132_r$ are appropriately supplied to the decoding result output unit 115 through the connection control unit 114.

The decoding result output unit 115 recognizes the state i(min) having the smallest state metric $sm_i$ among the state metric $sm_i$ of each state i from the ACS unit $113_i$ of each state i.

Furthermore, the decoding result output unit 115 acquires the branch information $pm_{i,r}$ stored in the path memory $132_r$ from the ACS unit $113_i$(min) corresponding to the state i(min) having the smallest state metric $sm_i$ through the connection control unit 114. Then, the decoding result output unit 115 sets the path configured with the branch information $pm_{i,r}$ acquired from the path memory $132_r$ of the ACS unit $113_i$ (min) as the surviving path that survives up to the state i(min) at the current time t, obtains the decoding result of the maximum likelihood decoding according to the surviving path, and supplies the decoding result to the channel decoding unit 18 and the coding processing unit 38.

<Specific Example of Maximum Likelihood Decoding Process>

Figure 36:
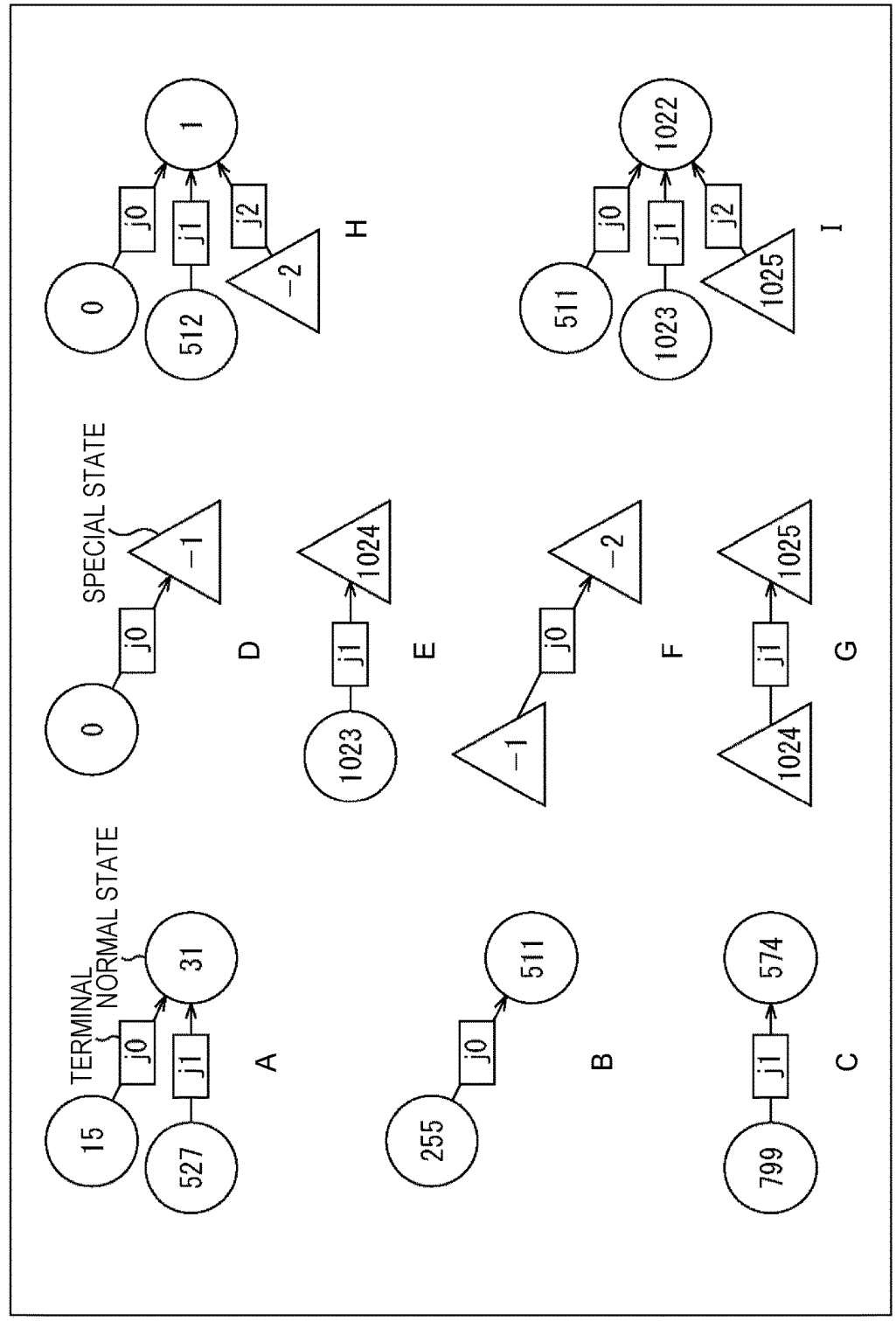
FIG. 36 is a diagram illustrating a specific example of the maximum likelihood decoding process performed according to the extended time-varying trellis.

FIG. 36 is a diagram illustrating a specific example of a maximum likelihood decoding process performed according to the extended time-varying trellis.

«ACS Unit $113_{31}$ Corresponding to State 31»

In the extended time-varying trellis, if attention is paid to the state 31 (=0x01 F=b'00_0001_1111) as the attention state, the state 15 (=0x00F=b'00_0000_1111) and the state 527 (=0x20F=b'10_0000_1111) exist as the transition possible state that can state-transition toward the attention state 31 as illustrated in A of FIG. 36, For this reason, the ACS unit $113_{15}$ corresponding to the state j0=15 is connected to the terminal j0 of the arithmetic unit $121_0$ and the selector $131_r$ of the ACS unit $113_{31}$ corresponding to the attention state 31, and information regarding the state 15 is supplied. The ACS unit $113_{527}$ corresponding to the state j1=527 is connected to the terminal j1 of the arithmetic unit $121_1$ and the selector $131_r$ of the ACS unit $113_{31}$, and information regarding the state 527 is supplied. Nothing is connected to the terminal j2 of the arithmetic unit $121_2$ and the selector $131_r$ of the ACS unit $113_{31}$.

As described in FIG. 26, the branch is configured with 11 bits indicating 10 bits representing the state before the state transition as the higher bits and the input data (the decoding result of the maximum likelihood decoding) of the current time as the least significant bit. Furthermore, the lower 10 bits of the 11-bit branch represent the state i after the state transition.

Therefore, the branch from the state 15 (=b'00_0000_1111) to the attention state 31 (=b'00_0001_1111) is represented by the branch b'000_0001_1111, and the branch from the state 527 (=b'10_0000_1111) to the attention state 31 is represented by the branch b'100_0001_1111.

The least significant bit of the branch which is the input data of the current time (the decoding result of the maximum likelihood decoding) is the branch information $b_i$ of the branch, and with respect to the attention state 31, the branch information $b_{31}$ is 1.

With respect to the attention state 31, the limitation signal generation unit 112 generates the following limitation signal tL according to the time t and supplies the limitation signal to the ACS unit $113_{31}$ corresponding to the attention state 31.

That is, in a case where the time t<10, the limitation signal generation unit 112 generates the limitation signal tL=3 in order to realize the limitation of the extended time-varying trellis. In this case, in the ACS unit $113_i$ corresponding to the attention state 31, the terminal j0 to which the information regarding the state 15 is supplied or the terminal j1 to which the information regarding the state 527 is supplied is selected in the selectors 123 and $131_r$.

In a case where, among the state metric candidate $sm_{15}+bm_{15}$ of the attention state 31 of the current time t obtained by using the state metric $sm_{15}$ of the state 15 and the state metric candidate $sm_{527}+bm_{527}$ of the attention state 31 of the current time t obtained by using the state metric $sm_{527}$ of the state 527, the candidate $sm_{15}+bm_{15}$ is obtained by using the state metric $sm_{15}$ of the state 15 is smaller, the terminal j0 is selected.

In addition, in a case where the candidate $sm_{527}+bm_{527}$ obtained by using the state metric $sm_{527}$ of the state 527 is smaller, the terminal j1 is selected.

In a case where the time t=10, the limitation signal generation unit 112 generates the limitation signal tL=0 in order to realize the limitation of the extended time-varying trellis. In this case, the ACS unit $113_{31}$ corresponding to the attention state 31 does not operate.

In a case where the time t is a time within a range represented by 11<=t<14, the limitation signal generation unit 112 generates the limitation signal tL=3 in order to realize the limitation of the extended time-varying trellis. In this case, in the ACS unit $113_{31}$ corresponding to the attention state 31, the terminal j0 to which the information regarding the state 15 is supplied or the terminal j1 to which the information regarding the state 527 is supplied is selected in the selectors 123 and $131_r$.

In a case where the time t is a time within a range represented by 14<=t<16, the limitation signal generation unit 112 generates the limitation signal tL=0 in order to realize the limitation of the extended time-varying trellis. In this case, the ACS unit $113_{31}$ corresponding to the attention state 31 does not operate.

In a case where the time t is a time within a range represented by 16<t<19, the limitation signal generation unit 112 generates the limitation signal tL=2 in order to realize the limitation of the extended time-varying trellis. In this case, in the ACS unit $113_{31}$ corresponding to the attention state 31, the terminal j1 to which the information regarding the state 527 is supplied is selected in the selectors 123 and $131_r$.

In a case where the time t is a time within a range represented by 19<=t<28, the limitation signal generation unit 112 generates the limitation signal tL=0 in order to realize the limitation of the extended time-varying trellis. In this case, the ACS unit $113_{31}$ corresponding to the attention state 31 does not operate.

In a case where the time t is a time within a range represented by 28<=t<31, the limitation signal generation unit 112 generates the limitation signal tL=1 to realize the limitation of the extended time-varying trellis. In this case, in the ACS unit $113_{31}$ corresponding to the attention state 31, the terminal j0 to which the information regarding the state 15 is supplied is selected in the selectors 123 and $131_r$.

In a case where the time t is a time within a range represented by 31<=t<40, the limitation signal generation unit 112 generates the limitation signal tL=0 in order to realize the limitation of the extended time-varying trellis. In this case, the ACS unit $113_{31}$ corresponding to the attention state 31 does not operate.

In a case where the time t is a time within a range represented by 40<=t<43, the limitation signal generation unit 112 generates the limitation signal tL=1 in order to realize the limitation of the extended time-varying trellis. In this case, in the ACS unit $113_{31}$ corresponding to the attention state 31, the terminal j0 to which the information regarding the state 15 is supplied is selected in the selectors 123 and $131_r$.

In a case where the time t is a time within a range represented by 43<=t<45, the limitation signal generation unit 112 generates the limitation signal tL=0 in order to realize the limitation of the extended time-varying trellis. In this case, the ACS unit $113_{31}$ corresponding to the attention state 31 does not operate.

In a case where the time t is a time within a range represented by 45<=t<48, the limitation signal generation unit 112 generates the limitation signal tL=2 in order to realize the limitation of the extended time-varying trellis. In this case, in the ACS unit $113_{31}$ corresponding to the attention state 31, the terminal j1 to which the information regarding the state 527 is supplied is selected in the selectors 123 and $131_r$.

In a case where the time t is a time within a range represented by 48<=t<50, the limitation signal generation unit 112 generates the limitation signal tL=0 in order to realize the limitation of the extended time-varying trellis. In this case, the ACS unit 113$_{31}$ corresponding to the attention state 31 does not operate.

In a case where the time t=50, the limitation signal generation unit 112 generates the limitation signal tL32 2 in order to realize the limitation of the extended time-varying trellis. In this case, in the ACS unit 113$_{31}$ corresponding to the attention state 31, the terminal j1 to which the information regarding the state 527 is supplied is selected in the selectors 123 and 131$_r$.

In a case where the time t>=51, the limitation signal generation unit 112 generates the limitation signal tL=3 in order to realize the limitation of the extended time-varying trellis. In this case, in the ACS unit 113$_{31}$ corresponding to the attention state 31, the terminal j0 to which the information regarding the state 15 is supplied or the terminal j1 to which the information regarding the state 527 is supplied is selected in the selectors 123 and 131$_r$.

«ACS Unit 113$_{511}$ Corresponding to State 511»

In the extended time-varying trellis, if attention is paid to the state 511 (=0x1FF=b'01_1111_1111) as the attention state, the state 255 (=0x0FF=b'00_1111_1111) exists as the attention state 511 that can state-transition toward the attention state 511 as illustrated in B of FIG. 36.

For this reason, the ACS unit 113$_{255}$ corresponding to the state j0=255 is connected to the terminal 10 of the arithmetic unit 121$_0$ and the selector 131$_r$ of the ACS unit 113$_{511}$ corresponding to the attention state 511, and information regarding the state 255 is supplied. Nothing is connected to the terminal j1 of the arithmetic unit 121$_1$ and the selector 131$_r$ of the ACS unit 113$_{511}$ and the terminal j2 of the arithmetic unit 121$_2$ and the selector 131$_r$ of the ACS unit 113$_{511}$.

From the description in FIG. 26, the branch is configured with 11 bits including 10 bits representing the state before the state transition as the higher bits and the input data (the decoding result of the maximum likelihood decoding) of the current time as the least significant bit. Furthermore, the lower 10 bits of the 11-bit branch represent the state i after the state transition.

Therefore, the branch from the state 255 (=b'00_1111_1111) to the attention state 511 (=b'01_1111_1111) is represented by the branch b'001_1111_1111.

The least significant bit of the branch which is the input data of the current time (the decoding result of the maximum likelihood decoding) is the branch information b$_i$ of the branch, and the branch information b$_{511}$ of the attention state 511 is 1.

With respect to the attention state 511, the limitation signal generation unit 112 generates the following limitation signal tL according to the time t and supplies the limitation signal to the ACS unit 113$_{511}$ corresponding to the attention state 511.

That is, in a case where the time t<9, the limitation signal generation unit 112 generates the limitation signal tL=1 in order to realize the limitation of the extended time-varying trellis. In this case, in the ACS unit 113$_{511}$ corresponding to the attention state 511, the terminal j0 to which the information regarding the state 255 is supplied is selected in the selectors 123 and 131$_r$.

In a case where the time t is a time within a range represented by 9<=t<20, the limitation signal generation unit 112 generates the limitation signal tL=0 in order to realize the limitation of the extended time-varying trellis. In this case, the ACS unit 113$_{511}$ corresponding to the attention state 511 does not operate.

In a case where the time t is a time within a range represented by 20<=t<23, the limitation signal generation unit 112 generates the limitation signal tL=1 in order to realize the limitation of the extended time-varying trellis. In this case, in the ACS unit 113$_{511}$ corresponding to the attention state 511, the terminal 10 to which the information regarding the state 255 is supplied is selected in the selectors 123 and 131$_r$.

In a case where the time t is a time within a range represented by 23<=t<32, the limitation signal generation unit 112 generates the limitation signal tL=0 in order to realize the limitation of the extended time-varying trellis. In this case, the ACS unit 113$_{511}$ corresponding to the attention state 511 does not operate.

In a case where the time t is a time within a range represented by 32<=t<35, the limitation signal generation unit 112 generates the limitation signal tL=1 in order to realize the limitation of the extended time-varying trellis. In this case, in the ACS unit 113$_{511}$ corresponding to the attention state 511, the terminal j0 to which the information regarding the state 255 is supplied is selected in the selectors 123 and 131$_r$.

In a case where the time t is a time within a range represented by 35<=t<49, the limitation signal generation unit 112 generates the limitation signal tL=0 in order to realize the limitation of the extended time-varying trellis. In this case, the ACS unit 113$_{511}$ corresponding to the attention state 511 does not operate.

In a case where the time t>=49, the limitation signal generation unit 112 generates the limitation signal tL=1 in order to realize the limitation of the extended time-varying trellis. In this case, in the ACS unit 113$_{511}$ corresponding to the attention state 511, the terminal j0 to which the information regarding the state 255 is supplied is selected in the selectors 123 and 131$_r$.

«ACS Unit 113$_{574}$ Corresponding to State 574»

In the extended time-varying trellis, if attention is paid to the state 574 (=0x23E=b'10_0011_1110) as the attention state, the state 799 (=0x31F=b'11 0001_1111) exists as the transition possible state that can state-transition toward the attention state 574 as illustrated in C of FIG. 36.

For this reason, the ACS unit 113$_{799}$ corresponding to the state j1=799 is connected to the terminal j1 of the arithmetic unit 121$_1$ and the selector 131$_r$ of the ACS unit 113$_{574}$ corresponding to the attention state 574, and information regarding the state 799 is supplied. Nothing is connected to the terminal j0 of the arithmetic unit 121$_0$ and the selector 131$_r$ of the ACS unit 113$_{574}$ and the terminal j2 of the arithmetic unit 121$_2$ and the selector 131$_r$ of the ACS unit 113$_{574}$.

From the description in FIG. 26, the branch is configured with 11 bits including 10 bits representing the state before the state transition as the higher bits and the input data (the decoding result of the maximum likelihood decoding) of the current time as the least significant bit. Furthermore, the lower 10 bits of the 11-bit branch represent the state i after the state transition.

Therefore, the branch from the state 799 (=b'110_0001_1111) to the attention state 574 is represented by b'110_0011_1110.

The least significant bit of the branch which is the input data of the current time (the decoding result of the maximum likelihood decoding) is the branch information $b_i$ of the branch, and the branch information $b_{574}$ of the attention state 574 is 0.

With respect to the attention state 574, the limitation signal generation unit 112 generates the following limitation signal tL according to the time t and supplies the limitation signal to the ACS unit $113_{574}$ corresponding to the attention state 574.

That is, in a case where the time t<11, the limitation signal generation unit 112 generates the limitation signal tL=2 in order to realize the limitation of the extended time-varying trellis. In this case, in the ACS unit $113_{574}$ corresponding to the attention state 574, the terminal j1 to which the information regarding the state 799 is supplied is selected in the selectors 123 and $131_r$.

In a case where the time t=11, the limitation signal generation unit 112 generates the limitation signal tL=0 in order to realize the limitation of the extended time-varying trellis. In this case, the ACS unit $113_{574}$ corresponding to the attention state 574 does not operate.

In a case where the time t is a time within a range represented by 12<=t<15, the limitation signal generation unit 112 generates the limitation signal tL=2 in order to realize the limitation of the extended time-varying trellis. In this case, in the ACS unit $113_{574}$ corresponding to the attention state 574, the terminal j1 to which the information regarding the state 799 is supplied is selected in the selectors 123 and $131_r$.

In a case where the time t is a time within a range represented by 15<=t<49, the limitation signal generation unit 112 generates the limitation signal tL=0 in order to realize the limitation of the extended time-varying trellis. In this case, the ACS unit $113_{574}$ corresponding to the attention state 574 does not operate.

In a case where the time t>=49, the limitation signal generation unit 112 generates the limitation signal tL=2 in order to realize the limitation of the extended time-varying trellis. In this case, in the ACS unit $113_{574}$ corresponding to the attention state 574, the terminal j1 to which the information regarding the state 799 is supplied is selected in the selectors 123 and $131_r$.

«ACS Unit $113_{-1}$ Corresponding to State −1»

In the extended time-varying trellis, if attention is paid to the special state −1 as the attention state, the state 0 exists as the transition possible state that can state-transition toward the attention state −1 as illustrated in D of FIG. 36.

For this reason, the ACS unit $113_0$ corresponding to the state j0=0 is connected to the arithmetic unit $121_0$ of the ACS unit $113_{-1}$ and the terminal j0 of the selector $131_r$ corresponding to the attention state −1, and information regarding the state 0 is supplied. Nothing is connected to the arithmetic unit $121_1$ of the ACS unit $113_{-1}$ and the terminal j1 of the selector $131_r$ and the arithmetic unit $121_2$ of the ACS unit $113_{-1}$ and the terminal j2 of the selector $131_r$.

The branch from the state 0 (=b'00_0000_0000) to the attention state −1 is represented by the branch b'000_000_0000.

The least significant bit of the branch which is the input data of the current time (the decoding result of the maximum likelihood decoding) is the branch information $b_i$ of the branch, and the branch information $b_{-1}$ of the attention state −1 is 0.

With respect to the attention state −1, the limitation signal generation unit 112 generates the following limitation signal tL according to the time t and supplies the limitation signal to the ACS unit $113_{-1}$ corresponding to the attention state −1.

That is, in a case where the time t<22, the limitation signal generation unit 112 generates the limitation signal tL=0 in order to realize the limitation of the extended time-varying trellis. In this case, the ACS unit $113_{-1}$ corresponding to the attention state −1 does not operate.

In a case where the time t is a time within a range represented by 22<=t<25, the limitation signal generation unit 112 generates the limitation signal tL=1 in order to realize the limitation of the extended time-varying trellis. In this case, in ACS unit $113_{-1}$ corresponding to attention state −1, the terminal 10 to which information regarding state 0 is supplied is selected in the selectors 123 and $131_r$.

In a case where the time t is a time within a range represented by 25<=t<34, the limitation signal generation unit 112 generates the limitation signal tL=0 in order to realize the limitation of the extended time-varying trellis. In this case, the ACS unit $113_{-1}$ corresponding to the attention state −1 does not operate.

In a case where the time t is a time within a range represented by 34<t<37, the limitation signal generation unit 112 generates the limitation signal tL=1 in order to realize the limitation of the extended time-varying trellis. In this case, in ACS unit $113_{-1}$ corresponding to attention state −1, the terminal 10 to which information regarding state 0 is supplied is supplied in the selectors 123 and $131_r$.

In a case where the time t>=37, the limitation signal generation unit 112 generates the limitation signal tL=0 in order to realize the limitation of the extended time-varying trellis. In this case, the ACS unit $113_{-1}$ corresponding to the attention state −1 does not operate.

«ACS Unit $113_{1024}$ Corresponding to State 1024»

In the extended time-varying trellis, if attention is paid to the special state 1024 as the attention state, the state 1023 exists as the transition possible state that can state-transition toward the attention state 1024 as illustrated in E of FIG. 36.

For this reason, the ACS unit $113_{1023}$ corresponding to the state j1=1023 is connected to the arithmetic unit $121_1$ of the ACS unit $113_{1024}$ and the terminal j1 of the selector $131_r$ corresponding to the attention state 1024, and information regarding the state 1023 is supplied. Nothing is connected to the arithmetic unit $121_0$ of the ACS unit $113_{1024}$ and the terminal j0 of the selector $131_r$ and the arithmetic unit $121_2$ of the ACS unit $113_{1024}$ and the terminal j2 of the selector $131_r$.

The branch from, the state 1023 (=b'11_0001_1111) to the attention state 1024 is represented, by b'111_1111_1111.

The least significant bit of the branch which is the input data of the current time (the decoding result of the maximum likelihood decoding) is the branch information $b_i$ of the branch, and the branch information $b_{1024}$ of the attention state 1024 is 1.

With, respect, to the attention state 1024, the limitation signal generation unit 112 generates the following limitation signal tL according to the time t and supplies the limitation signal tL to the ACS unit $113_{1024}$ corresponding to the attention state 1024.

That is, in a case where the time t<22, the limitation signal generation unit 112 generates the limitation signal tL=0 in order to realize the limitation of the extended time-varying trellis. In this case, the ACS unit $113_{1024}$ corresponding to the attention state 1024 does not operate.

In a case where the time t is a time within a range represented by 22<=t<25, the limitation signal generation unit 112 generates the limitation signal tL=2 in order to realize the limitation of the extended time-varying trellis. In this case, in the ACS unit $113_{1024}$ corresponding to the attention state 1024, the terminal 11 to which the information regarding the state 1023 is supplied is selected in the selectors 123 and 131$_r$.

In a case where the time t is a time within a range represented by 25<=t<34, the limitation signal generation unit 112 generates the limitation signal tL=0 in order to realize the limitation of the extended time-varying trellis. In this case, the ACS unit 113$_{1024}$ corresponding to the attention state 1024 does not operate.

In a case where the time t is a time within a range represented by 34<=t<37, the limitation signal generation unit 112 generates the limitation signal tL=2 in order to realize the limitation of the extended time-varying trellis. In this case, in the ACS unit 113$_{1024}$ corresponding to the attention state 1024, the terminal j1 to which the information regarding the state 1023 is supplied is selected in the selectors 123 and 131$_r$.

In a case where the time t>=37, the limitation signal generation unit 112 generates the limitation signal tL=0 in order to realize the limitation of the extended time-varying trellis. In this case, the ACS unit 113$_{1024}$ corresponding to the attention state 1024 does not operate.

«ACS Unit 113$_{-2}$ Corresponding to State −2»

In the extended time-varying trellis, when attention is paid to the special state −2 as the attention state, the state −1 exists as the transition possible state in which state transition can be performed toward the attention state −2 as illustrated in F of FIG. 36.

For this reason, the ACS unit 113$_{-1}$ corresponding to the state j0=−1 is connected to the arithmetic unit 121$_0$ of the ACS unit 113$_{-2}$ and the terminal j0 of the selector 131$_r$ corresponding to the attention state −2, and the information regarding the state −1 is supplied. Nothing is connected to the terminal j1 of the arithmetic unit 121$_1$ and the selector 131$_r$ of the ACS unit 113$_{-2}$ and the terminal j2 of the arithmetic unit 121$_2$ and the selector 131$_r$ of the ACS unit 113$_{-2}$.

The branch from the state −1 to the attention state −2 is represented by branch b'000_0000_0000.

The least significant bit of the branch which is the input data of the current time (the decoding result of the maximum likelihood decoding) is the branch information b$_i$ of the branch, and the branch information b$_{-2}$ of the attention state −2 is 0.

With respect to the attention state −2, the limitation signal generation unit 112 generates the following limitation signal tL according to the time t and supplies the limitation signal tL to the ACS unit 113$_{-2}$ corresponding to the attention state −2.

That is, in a case where the time t<23, the limitation signal generation unit 112 generates the limitation signal tL=0 in order to realize the limitation of the extended time-varying trellis. In this case, the ACS unit 113$_{-2}$ corresponding to the attention state −2 does not operate.

In a case where the time t is a time within a range represented by 23<=t<26, the limitation signal generation unit 112 generates the limitation signal tL=1 in order to realize the limitation of the extended time-varying trellis. In this case, in the ACS unit 113$_{-2}$ corresponding to the attention state −2, the terminal j0 to which the information regarding the state −1 is supplied is selected in the selectors 123 and 131$_r$.

In a case where the time t is a time within a range represented by 26<=t<35, the limitation signal generation unit 112 generates the limitation signal tL=0 in order to realize the limitation of the extended time-varying trellis. In this case, the ACS unit 113$_{-2}$ corresponding to the attention state 2 does not operate.

In a case where the time t is a time within a range represented by 35<=t<38, the limitation signal generation unit 112 generates the limitation signal tL=1 to realize the limitation of the extended time-varying trellis. In this case, in the ACS unit 113$_{-2}$ corresponding to the attention state −2, select the terminal 10 to which the information regarding the state −1 is supplied is selected in the selectors 123 and 131$_r$.

In a case where the time t>=38, the limitation signal generation unit 112 generates the limitation signal tL=0 in order to realize the limitation of the extended time-varying trellis. In this case, the ACS unit 113$_{-2}$ corresponding to the attention state 2 does not operate.

«ACS Unit 113$_{1025}$ Corresponding to State 1025»

In the extended time-varying trellis, if attention is paid to the special state 1025 as the attention state, the state 1024 exists as the transition possible state that can state-transition toward the attention state 1025 as illustrated in G of FIG. 36.

For this reason, the ACS unit 113$_{1024}$ corresponding to the state j1=1024 is connected to the arithmetic unit 121$_1$ of the ACS unit 113$_{1025}$ and the terminal j1 of the selector 131$_r$ corresponding to the attention state 1025, and the information regarding the state 1024 is supplied. Nothing is connected to the arithmetic unit 121$_0$ of the ACS unit 113$_{1025}$ and the terminal j0 of the selector 131$_r$ and the arithmetic unit 121$_2$ of the ACS unit 113$_{1025}$ and the terminal j2 of the selector 131$_r$.

The branch from the state 1024 to the attention state 1025 is represented by b'111_1111_1111.

The least significant bit of the branch which is the input data of the current time (the decoding result of the maximum likelihood decoding) is the branch information b$_i$ of the branch, and the branch information b$_{1025}$ of the attention state 1025 is 1.

With respect to the attention state 1025, the limitation signal generation unit 112 generates the following limitation signal tL according to the time t and supplies the limitation signal to the ACS unit 113$_{1025}$ corresponding to the attention state 1025.

That is, in a case where the time t<23, the limitation signal generation unit 112 generates the limitation signal tL=0 in order to realize the limitation of the extended time-varying trellis. In this case, the ACS unit 113$_{1025}$ corresponding to the attention state 1025 does not operate.

In a case where the time t is a time within a range represented by 23<=t<26, the limitation signal generation unit 112 generates the limitation signal tL=2 in order to realize the limitation of the extended time-varying trellis. In this case, in the ACS unit 113$_{1025}$ corresponding to the attention state 1025, the terminal 11 to which the information regarding the state 1024 is supplied is selected in the selectors 123 and 131$_r$.

In a case where the time t is a time within a range represented by 26<=t<35, the limitation signal generation unit 112 generates the limitation signal tL=0 in order to realize the limitation of the extended time-varying trellis. In this case, the ACS unit 113$_{1025}$ corresponding to the attention state 1025 does not operate.

In a case where the time t is a time within a range represented by 35<=t<38, the limitation signal generation unit 112 generates the limitation signal tL=2 in order to realize the limitation of the extended time-varying trellis. In this case, in the ACS unit 113$_{1025}$ corresponding to the attention state 1025, the terminal l1 to which the information regarding the state 1024 is supplied is selected in the selectors 123 and 131$_r$.

In a case where the time t>=38, the limitation signal generation unit 112 generates the limitation signal tL=0 in order to realize the limitation of the extended time-varying trellis. In this case, the ACS unit 113$_{1025}$ corresponding to the attention state 1025 does not operate.

«ACS Unit 113$_1$ Corresponding to State 1»

In the extended time-varying trellis, if attention is paid to the state 1 (=0x001=b'00_0000_0001) as the attention state, the state 0 (=0x000=b'00_0000_0000), the state 512 (=0x200=b'10_0000_0000), and the state −2 exist as the transition possible states in which the state transition can be performed toward the attention state 1 as illustrated in H of FIG. 36.

For this reason, the ACS unit 113$_0$ corresponding to the state j0=0 is connected to the arithmetic unit 121$_0$ of the ACS unit 113$_1$ and the terminal j0 of the selector 131$_r$, corresponding to the attention state 1, and the information regarding the state 0 is supplied. The ACS unit 113$_{512}$ corresponding to the state j1=512 is connected to the arithmetic unit 121$_1$ of the ACS unit 113$_1$ and the terminal j1 of the selector 131$_r$, and the information regarding the state 512 is supplied. The ACS unit 113$_{-2}$ corresponding to the state (special state) j2=2 is connected to the arithmetic unit 121$_2$ of the ACS unit 113$_1$ and the terminal j2 of the selector 131$_r$, and the information regarding the state 2 is supplied.

The branch from the state 0 (=b'00_0000_0000) to the attention state 1 (=b'00_0000_0001) is represented by branch b'000_0000_0001. The branch from the state 512 (=b'10_0000_0000) to the attention state 1 is represented by b'100_0000_0001. The branch from the state −2 to the attention state 1 is represented by b'000_0000_0001.

The least significant bit of the branch which is the input data of the current time (the decoding result of the maximum likelihood decoding) is the branch information b$_i$ of the branch, and the branch information b$_1$ of the attention state 1 is 1.

With respect to the attention state 1, the limitation signal generation unit 112 generates the following limitation signal tL according to the time t and supplies the limitation signal to the ACS unit 113$_1$ corresponding to the attention state 1.

That is, in a case where the time t<10, the limitation signal generation unit 112 generates the limitation signal tL=3 in order to realize the limitation of the extended time-varying trellis. In this case, in the ACS unit 113$_1$ corresponding to the attention state 1, the terminal j0 to which the information regarding the state 0 is supplied or the terminal j1 to which the information regarding the state 512 is supplied is selected in the selectors 123 and 131$_r$.

In a case where, among the state metric candidates sm$_0$+bm$_0$ of the attention state 1 of the current time t obtained by using the state metric sm$_0$ of the state 0 and the state metric candidate sm$_{512}$+bm$_{512}$ of the attention state 1 of the current time t obtained by using the state metric sm$_{512}$ of the state 512, the candidate sm$_0$+bm$_0$ obtained by using the state metric sm$_0$ of the state 0 is smaller, the terminal j0 is selected.

In addition, in a case where the candidate sm$_{512}$+bm$_{512}$ obtained by using the state metric sm$_{512}$ of the state 512 is smaller, the terminal j1 is selected.

In a case where the time t is a time within a range represented by 10<=t<24, the limitation signal generation unit 112 generates the limitation signal tL=0 in order to realize the limitation of the extended time-varying trellis. In this case, the ACS unit 113$_1$ corresponding to the attention state 1 does not operate.

In a case where the time t is a time within a range represented by 24<=t<27, the limitation signal generation unit 112 generates the limitation signal tL=4 in order to realize the limitation of the extended time-varying trellis. In this case, in the ACS unit 113$_1$ corresponding to the attention state 1, the terminal j2 to which the information regarding the state −2 is supplied is selected in the selectors 123 and 131$_r$.

In a case where the time t is a time within a range represented by 27<t<36, the limitation signal generation unit 112 generates the limitation signal tL=0 in order to realize the limitation of the extended time-varying trellis. In this case, the ACS unit 113$_1$ corresponding to the attention state 1 does not operate.

In a case where the time t is a time within a range represented by 36<=t<39, the limitation signal generation unit 112 generates the limitation signal tL=4 in order to realize the limitation of the extended time-varying trellis. In this case, in the ACS unit 113$_1$ corresponding to the attention state 1, the terminal j2 to which the information regarding the state −2 is supplied is selected in the selectors 123 and 131$_r$.

In a case where the time t is a time within a range represented by 39<=t<50, the limitation signal generation unit 112 generates the limitation signal tL=0 in order to realize the limitation of the extended time-varying trellis. In this case, the ACS unit 113$_1$ corresponding to the attention state 1 does not operate.

In a case where the time t>=50, the limitation signal generation unit 112 generates the limitation signal tL=3 in order to realize the limitation of the extended time-varying trellis. In this case, in the ACS unit 113$_1$ corresponding to the attention state 1, the terminal j0 to which the information regarding the state 0 is supplied or the terminal l1 to which the information regarding the state 512 is supplied is selected in the selectors 123 and 131$_r$.

«ACS Unit 113$_{1022}$ Corresponding to State 1022»

In the extended time-varying trellis, if attention is paid to the state 1022 (0x3FE=b'11_1111_1110) as the attention state, the state 511 (=0x1FF=b'01_1111_1111), the state 1023 (=0x3FF=b'11_1111_1111), and the state 1025 exist as the transition possible states in which the state transition can be performed toward the attention state 1022 as illustrated in I of FIG. 36.

For this reason, the ACS unit 113$_{511}$ corresponding to the state j0=511 is connected to the arithmetic unit 121$_0$ of the ACS unit 113$_{1022}$ and the terminal j0 of the selector 131$_r$, corresponding to the attention state 1022, and the information regarding the state 511 is supplied. The ACS unit 113$_{1023}$ corresponding to the state j1=1023 is connected to the arithmetic unit 121$_1$ of the ACS unit 113$_{1022}$ and the terminal j1 of the selector 131$_r$, and the information regarding the state 1023 is supplied. The ACS unit 113$_{1025}$ corresponding to the state (special state) j2=1025 is connected to the arithmetic unit 121$_2$ of the ACS unit 113$_{1022}$ and the terminal j2 of the selector 131$_r$, and the information regarding the state 1025 is supplied.

The branch from the state 511 (=b'01_1111_1111) to the attention state 1022 (=b'11_1111_1110) is represented by the branch b'011_1111_1110. The branch from the state 1023 (=b'11_1111_1111) to the attention state 1022 is represented by b'111_1111_1110. The branch from the state 1025 to the attention state 1022 is represented by b'111_1111_1110.

The least significant bit of the branch which is the input data of the current time (the decoding result of the maximum likelihood decoding) is the branch information $b_i$ of the branch, and the branch information $b_{1022}$ of the attention state 1022 is 0.

With respect to the attention state 1022, the limitation signal generation unit 112 generates the limitation signal tL similar to that in the case of the above-described state 1 according to the time t and supplies the limitation signal to the ACS unit $113_{1022}$ corresponding to the attention state 1022.

That is, in a case where the time t<10, the limitation signal generation unit 112 generates the limitation signal tL=3 in order to realize the limitation of the extended time-varying trellis. In this case, in the ACS unit $113_{1022}$ corresponding to the attention state 1022, the terminal j0 to which the information regarding the state 511 is supplied or the terminal j1 to which the information regarding the state 1023 is supplied is selected in the selectors 123 and $131_r$.

in a case where, among the state metric candidates $sm_{511}+bm_{511}$ of the attention state 1022 of the current time t obtained by using the state metric $sm_{511}$ of the state 511 and the state metric candidate $sm_{1023}+bm_{1023}$ of the attention state 1022 of the current time t obtained by using the state metric $sm_{1023}$ of the state 1023, the candidate $sm_{511}+bm_{511}$ obtained by using the state metric $sm_{511}$ of the state 511 is smaller, the terminal j0 is selected.

In addition, in a case where the candidate $sm_{1023}+bm_{1023}$ obtained by using the state metric $sm_{1023}$ of the state 1023 is smaller, the terminal j1 is selected.

In a case where the time t is a time within a range represented by 10<=t<24, the limitation signal generation unit 112 generates the limitation signal tL=0 in order to realize the limitation of the extended time-varying trellis. In this case, the ACS unit $113_{1022}$ corresponding to the attention state 1022 does not operate.

In a case where the time t is a time within a range represented by 24<=t<27, the limitation signal generation unit 112 generates the limitation signal tL=4 in order to realize the limitation of the extended time-varying trellis. In this case, in the ACS unit $113_{1022}$ corresponding to the attention state 1022, the terminal j2 to which the information regarding the state 1025 is supplied is selected in the selectors 123 and $131_r$.

In a case where the time t is a time within a range represented by 27<=t<36, the limitation signal generation unit 112 generates the limitation signal tL=0 in order to realize the limitation of the extended time-varying trellis. In this case, the ACS unit $113_{1022}$ corresponding to the attention state 1022 does not operate.

In a case where the time t is a time within a range represented by 36<=t<39, the limitation signal generation unit 112 generates the limitation signal tL=4 in order to realize the limitation of the extended time-varying trellis. In this case, in the ACS unit $113_{1022}$ corresponding to the attention state 1022, the terminal j2 to which the information regarding the state 1025 is supplied is selected in the selectors 123 and $131_r$.

In a case where the time t is a time within a range represented by 39<=t<50, the limitation signal generation unit 112 generates the limitation signal tL=0 in order to realize the limitation of the extended time-varying trellis. In this case, the ACS unit $113_{1022}$ corresponding to the attention state 1022 does not operate.

In a case where the time t>=50, the limitation signal generation unit 112 generates the limitation signal tL=3 in order to realize the limitation of the extended time-varying trellis. In this case, in the ACS unit $113_{1022}$ corresponding to the attention state 1022, the terminal j0 to which the information regarding the state 511 is supplied or the terminal j1 to which the information regarding the state 1023 is supplied is selected in the selectors 123 and $131_r$.

As illustrated in FIG. 36, the extended time-varying trellis includes a branch (A of FIG. 36) from any one of two normal states to a normal state, branches from one normal state to a normal state (B and C of FIG. 36), branches from one normal state to a special state (D and E of FIG. 36), branches from one special state to a special state (F and G of FIG. 36), and branches from any one of two normal states and one special state to a normal state (H and I of FIG. 36).

In the above-described case, the maximum likelihood decoding process performed for each of the states 31, 511, 574, −1, 1024, −2, 1025, 1, and 1022 has been described. However, a similar maximum likelihood decoding process is performed on other states of the extended time-varying trellis.

<Detection of Clock Shift and Generation of Data Gate Signal>

Figure 37:
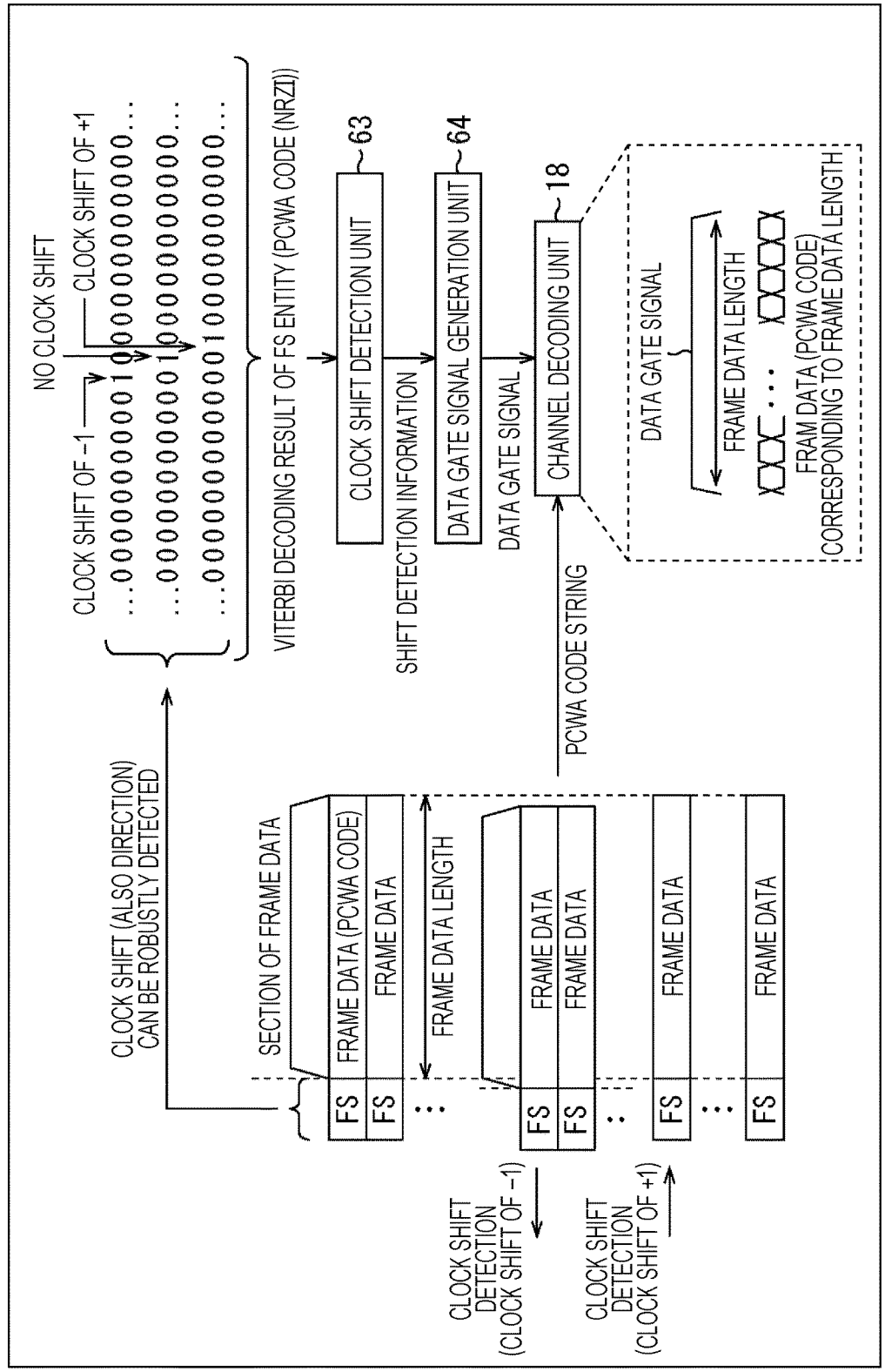
FIG. 37 is a diagram illustrating detection of clock shift and generation of a data gate signal.

FIG. 37 is a diagram illustrating the detection of the clock shift and the generation of the data gate signal.

The maximum likelihood decoding of the FS entity of the FS is performed according to the extended time-varying trellis limited by the extended FS code strings FSA#i, FSB#i, and FSC#i (FIG. 28), so that, as a result of the maximum likelihood decoding, the position of 1 in the center of the FS entity in the NRZI representation is shifted by the number of bits corresponding to the amount of clock shift in the direction in which the clock shift occurs. Therefore, it is possible to accurately detect the clock shift from the decoding result of the maximum likelihood decoding (Viterbi decoding) of the FS entity.

That is, in a case where the extended FS code string FSA#i is obtained as the decoding result of the maximum likelihood decoding of the FS entity, it can be detected that there is a clock shift of +1 clock. In a case where the extended FS code string FSB#i is obtained as the decoding result of the maximum likelihood decoding of the FS entity, it can be detected that there is no clock shift. In a case where the extended FS code string FSC#i is obtained as the decoding result of the maximum likelihood decoding of the FS entity, it can be detected that there is a clock shift of −1 clock.

The clock shift detection unit 63 (FIG. 6) detects the clock shift according to the decoding result of the maximum likelihood decoding of the FS (FS entity thereof) from the restoration unit 35 and outputs shift detection information indicating the detection result of the clock shift to the data gate signal generation unit 64.

The data gate signal generation unit 64 generates a data gate signal that accurately represents the section of the frame data (FIG. 9) subsequent to the FS according to the shift detection information from the clock shift detection unit 63 and supplies the data gate signal to the channel decoding unit 18.

The channel decoding unit 18 extracts the code string of the section represented by the data gate signal from the data gate signal generation unit 64, that is, the frame data from the code string of the PCWA 110 code as the decoding result of the maximum likelihood decoding from the restoration unit 35.

Then, the channel decoding unit 18 performs decoding (channel decoding) of the PCWA 110 code as frame data and supplies the frame data obtained by the decoding, that is, the row data to which the DCC bit is added to the DCC deleting unit 19 (FIG. 1).

As described above, in the recording/reproducing apparatus 1 of FIG. 1, since the synchronization pattern syn0 of the Run_in (FIG. 9) is recorded in the adjacent two lands and grooves while being shifted by a certain shift amount in the track direction on the optical disk 16, it is possible to robustly detect the synchronization pattern syn0 of the Run_in.

Furthermore, since the synchronization pattern syn0 of the Run_in can be detected robustly, it is possible to specify the section of the FS (FS entity thereof) at the head of the frame subsequent to the Run_in with a certain degree of accuracy.

Then, the maximum likelihood decoding of FS (FS entity thereof) can be performed by using the extended time-varying trellis for the section of the FS specified with a certain degree of accuracy.

In addition, the FS includes the FS entities having the runs having a length (12T in the present embodiment) equal to or larger than the constraint length of the PR, and the extended time-varying trellis includes a normal state which is a state corresponding to the constraint length of the PR and a special state other than the normal state.

In this case, a path corresponding to a run having a length equal to or larger than the constraint length of the PR of the FS entity reaches (state-transitions toward) a special state in the extended time-varying trellis, and thus, the path corresponding to the run having a length equal to or larger than the constraint length of the PR of the FS entity and the path corresponding to the run having a length smaller than the constraint length of the PR of the FS entity are prevented from being merged into the same state (normal state). As a result, the detection accuracy of the FS (FS entity thereof) can be improved.

Furthermore, the maximum likelihood decoding of the FS is performed according to the extended time-varying trellis in which the states and branches (state transitions) are limited according to the FS in a case where there is no clock shift and the FS in a case where there is clock shift, so that it is possible to accurately detect the clock shift from the decoding result of the maximum likelihood decoding.

Furthermore, according to the detection result of the clock shift, it is possible to accurately specify the section of the frame data subsequent to the FS.

As a result, the frame data recorded at a high density can be robustly reproduced.

<Description of Computer to which Present Technology is Applied>

Next, a series of the processes described above can be performed by hardware or software. In a case where a series of the processes is performed by software, a program constituting the software is installed in a general-purpose computer or the like.

Figure 38:
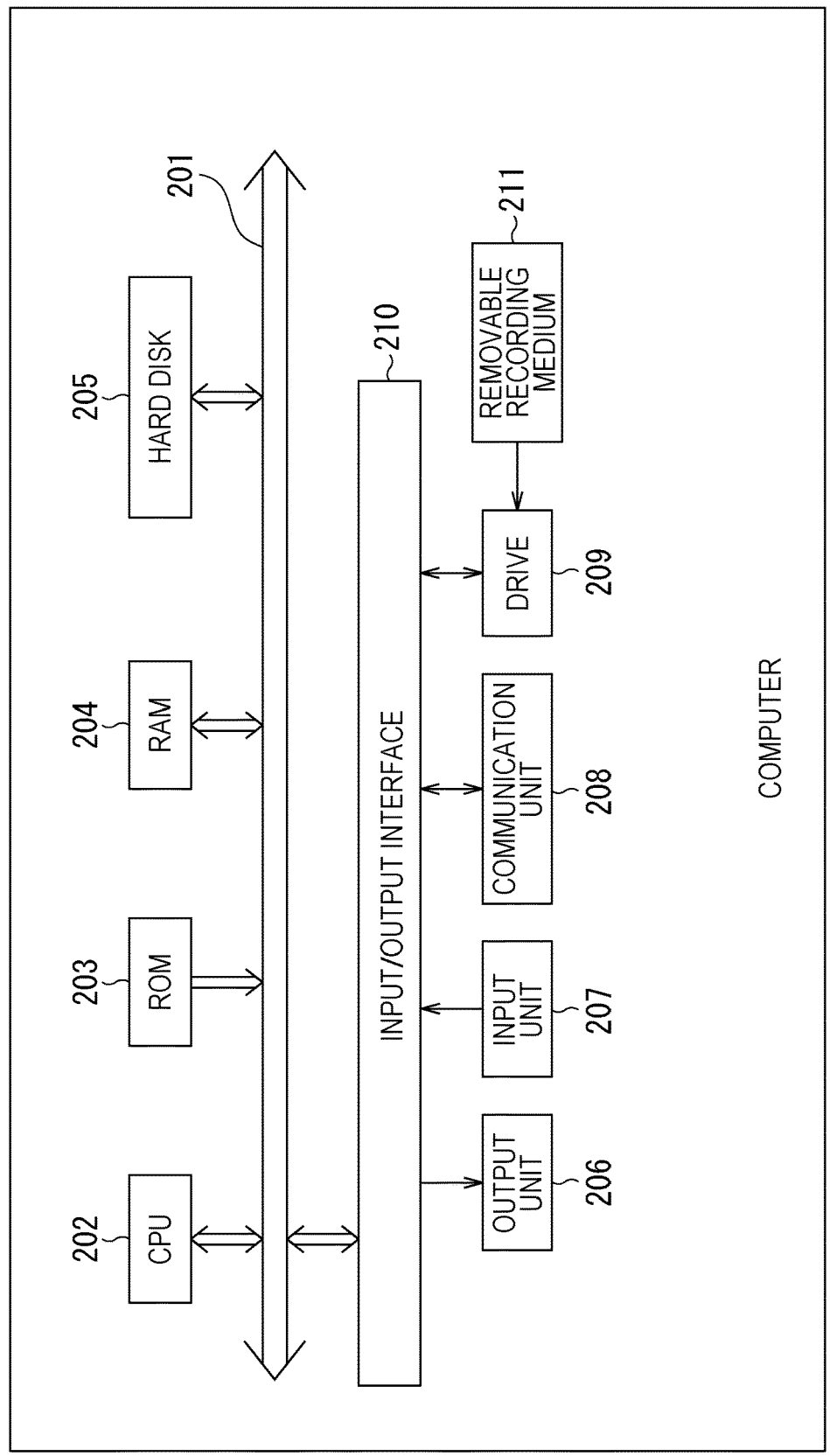
FIG. 38 is a block diagram illustrating a configuration example of an embodiment of a computer to which the present technology is applied.

FIG. 38 is a block diagram illustrating a configuration example of an embodiment of a computer in which a program for executing a series of the processes described above is installed.

The program can be recorded in a hard disk 205 or a ROM 203 as a recording medium built in the computer in advance.

Alternatively, the program can be stored (recorded) in a removable recording medium 211. Such a removable recording medium 211 can be provided as so-called packaged software. Herein, as the removable recording medium 211, there may be exemplified, for example, a flexible disk, a compact disc read only memory (CD-ROM), a magneto optical (MO) disk, a digital versatile disc, (DVD), a magnetic disk, a semiconductor memory, and the like.

Note that, in addition to installing the program from the removable recording medium 211 as described above in the computer, the program can be downloaded to the computer via a communication network or a broadcasting network and installed in a built-in hard disk 205. In other words, the program can be, for example, wirelessly transferred from a download site to a computer via an artificial satellite for digital satellite broadcasting or wired transferred to a computer via a network such as a LAN (Local Area Network) or the Internet.

The computer incorporates a CPU (Central Processing Unit) 202, and an input/output interface 210 is connected to the CPU 202 via a bus 201.

If a command is input by the user operating the input unit 207 through the input/output interface 210, for example, the CPU 202 executes the program stored in the read only memory (ROM) 203 according to the command. Alternatively, the CPU 202 loads a program stored in the hard disk 205 onto the random access memory (RAM) 204 and executes the program.

With this arrangement, the CPU 202 performs the processes according to the above-described flowchart or the processes performed by the above-described configuration of the block diagram. Then, the CPU 202, for example, outputs the processing result, through the input/output interface 210 from the output unit 206, transmits the processing result from the communication unit 208, or stores the processing result in the hard disk 205, as necessary, for example.

In addition, the input unit 207 is configured with a keyboard, a mouse, a microphone, or the like. Furthermore, the output unit 206 is configured with a liquid crystal display (LCD), a speaker, or the like.

Herein, in this specification, the processes performed by the computer according to the program are not necessarily performed in a time-sequence order according to the order described as the flowchart. That is, the processes performed by the computer according to the program also include processes that are executed in parallel or individually (for example, parallel processes or processes according to objects).

Furthermore, the program may be processed by one computer (processor) or may be distributed to be processed by a plurality of computers. Furthermore, the program may be transferred to a remote computer and executed by the remote computer.

Furthermore, in this specification, a system denotes a group of a plurality of constituent elements (devices, modules (parts), and the like), and it does not matter whether or not all constituent elements are in the same casing. Therefore, a plurality of devices that are accommodated in separate housings and are connected via a network and one device that accommodates a plurality of modules in one housing are also systems.

In addition, the embodiments of the present technology are not limited to the above-described embodiments, and various modifications are possible without departing from the spirit of the present technology.

For example, in the present technology, it is possible to adopt a configuration of cloud computing in which one function is snared by a plurality of devices via a network so as to be collaboratively processed.

Furthermore, each step described in the above-described flowchart can be executed by one device or shared by a plurality of devices to be executed.

Furthermore, in a case where a plurality of processes is included in one step, the plurality of processes included in the one step can be executed by one device and shared by a plurality of devices to be executed.

In addition, the effects described in this specification are merely examples and are not limited, and other effects may be provided.

In addition, the present technology can adopt the following configurations.

<1>

A signal processing apparatus including a restoration unit that restores a frame sync (FS) by performing maximum likelihood decoding of the FS according to a time-varying trellis with a state and a state transition being limited according to a time, in maximum likelihood decoding of a reproduction signal reproduced from a disk-shaped recording medium, the FS representing a head of a frame, the FS of the frame being arranged at the head of the frame, the FS being recorded at the same positions in a track direction in two adjacent tracks.

<2>

The signal processing apparatus according to <1>, in which the time-varying trellis is limited according to the states that can be taken and the state transitions that can be performed in the FS.

<3>

The signal processing apparatus according to <2>, in which the time-varying trellis is limited according to the states that can be taken and the state transitions that can be performed in each of the FS in a case where there is no clock shift and the FS in a case where there is a clock shift.

<4>

The signal processing apparatus according to <3>, in which the time-varying trellis has a normal state corresponding to a constraint length of a partial response (PR) and a special state other than the normal state.

<5>

The signal processing apparatus according to <4>, in which the FS is a pattern having a run equal to or larger than the constraint length, and in a case where the run equal to or larger than the constraint length occurs, the state-transition toward the special state in the time-varying trellis is performed.

<6>

The signal processing apparatus according to any of <1> to <5>, in which user data is coded into a predetermined channel code and recorded on the disk-shaped recording medium, and the time-varying trellis is limited according to a minimum run of the channel code and a repeated minimum transition run length (RMTR).

<7>

The signal processing apparatus according to any of <1> to <6>, in which the restoration unit includes an add-compare-select (ACS) unit that obtains a candidate of a state metric of a state of a current time, with respect to each of one or more one-time-preceding state, by adding the state metric of the state and a branch metric of a branch to the state of the current time, selects the state metric of the state of the current time from the candidate of the state metric, and selects a surviving path surviving up to the state of the current time from the surviving path up to each of one or more one-time-preceding states, and the selection of the state metric of the state of the current time and the selection of the surviving path surviving up to the state of the current time are controlled according to a limitation signal limiting the time-varying trellis generated according to a time based on the FS as a reference.

<8>

The signal processing apparatus according to <7>, in which a Run_in including a synchronization pattern for synchronization is recorded on the disk-shaped recording medium, the Run_in representing a start of an ECC block including a parity used for an error correction coding (ECC) process, the frame is arranged after the Run_in, based on, as a reference, a position of the FS obtained in response to detection of the synchronization pattern, the time is counted, and the limitation signal is generated according to the time.

<9>

The signal processing apparatus according to any of <1> to <8>, further including a clock shift detection unit that detects a clock shift according to a decoding result of the maximum likelihood decoding of the FS.

<10>

The signal processing apparatus according to <9>, further including a data gate signal generation unit that generates a data gate signal representing a section of user data subsequent to the FS in the frame according to a detection result of the clock shift.

[11]

The signal processing apparatus according to <10>, in which the user data subsequent to the FS is coded into a predetermined channel code, and a channel decoding unit that decodes the channel code decodes the channel code according to the data gate signal.

<12>

A signal processing method including restoring a frame sync (FS) by performing maximum likelihood decoding of the FS according to a time-varying trellis with a state and a state transition being limited according to a time, in maximum likelihood decoding of a reproduction signal reproduced from a disk-shaped recording medium, the FS representing a head of a frame, the FS of the frame being arranged at the head of the frame, the FS being recorded at the same positions in a track direction in two adjacent tracks.

REFERENCE SIGNS LIST

11 ECC processing unit
12 DCC adding unit
13 Channel coding unit
14 RUB configuring unit
15 Recording/reproducing system
16 Optical disk
17 Signal processing unit
18 Channel decoding unit
19 DCC deleting unit
20 ECC processing unit
31 ADC
32 PLL
33 Memory
34 Adaptive equalization unit
35 Restoration unit
36 Convolution unit
37 Error calculation unit
38 Code processing unit
$51_0$ to $51_2$ Adaptive equalizer
52 Addition unit
61 sync detection unit
62 Time information generation unit 63 Clock shift detection unit
64 Data gate signal generation unit
111 Branch metric: generation unit
112 Limitation signal generation unit
$113_{-2}$ to $113_{1025}$ ACS unit
114 Connection control unit
115 Decoding result output unit
$121_0$ to $121_2$ Arithmetic unit
122 Selection control unit
123 Selector
124 State metric memory
$131_1$ to $131_{L-1}$ Selector
$132_0$ to $132_{L-1}$ Path memory
201 Bus
202 CPU
203 ROM
204 RAM
205 Hard disk
206 Output unit
207 Input unit
208 Communication unit
209 Drive
210 Input/output interface
211 Removable recording medium

The invention claimed is:

1. A signal processing apparatus comprising circuitry configured to reproduce a reproduction signal from a disk-shaped recording medium, and restore a frame sync (FS) by performing maximum likelihood decoding of the FS according to a time-varying trellis with a state and a state transition being limited according to a time, in maximum likelihood decoding of the reproduction signal reproduced from the disk-shaped recording medium, the FS representing a head of a frame, the FS of the frame being arranged at the head of the frame, the FS being recorded at the same positions in a track direction in two adjacent tracks.

2. The signal processing apparatus according to claim 1, wherein the time-varying trellis is limited according to the states that can be taken and the state transitions that can be performed in the FS.

3. The signal processing apparatus according to claim 2, wherein the time-varying trellis is limited according to the states that can be taken and the state transitions that can be performed in each of the FS in a case where there is no clock shift and the FS in a case where there is a clock shift.

4. The signal processing apparatus according to claim 3, wherein the time-varying trellis has a normal state corresponding to a constraint length of a partial response (PR) and a special state other than the normal state.

5. The signal processing apparatus according to claim 4,
wherein the FS is a pattern having a run equal to or larger than the constraint length, and
in a case where the run equal to or larger than the constraint length occurs, the state-transition toward the special state in the time-varying trellis is performed.

6. The signal processing apparatus according to claim 1,
wherein user data is coded into a predetermined channel code and recorded on the disk-shaped recording medium, and
the time-varying trellis is limited according to a minimum run of the channel code and a repeated minimum transition run length (RMTR).

7. The signal processing apparatus according to claim 1,
wherein the circuitry is further configured to obtain a candidate of a state metric of a state of a current time, with respect to each of one or more one-time-preceding state, by adding the state metric of the state and a branch metric of a branch to the state of the current time, selects the state metric of the state of the current time from the candidate of the state metric, and selects a surviving path surviving up to the state of the current time from the surviving path up to each of one or more one-time-preceding states, and
the selection of the state metric of the state of the current time and the selection of the surviving path surviving up to the state of the current time are controlled according to a limitation signal limiting the time-varying trellis generated according to a time based on the FS as a reference.

8. The signal processing apparatus according to claim 7,
wherein a Run_in including a synchronization pattern for synchronization is recorded on the disk-shaped recording medium, the Run_in representing a start of an ECC block including a parity used for an error correction coding (ECC) process,
the frame is arranged after the Run_in,
based on, as a reference, a position of the FS obtained in response to detection of the synchronization pattern, the time is counted, and
the limitation signal is generated according to the time.

9. The signal processing apparatus according to claim 1, wherein the circuitry is further configured to detect a clock shift according to a decoding result of the maximum likelihood decoding of the FS.

10. The signal processing apparatus according to claim 9, wherein the circuitry is further configured to generate a data gate signal representing a section of user data subsequent to the FS in the frame according to a detection result of the clock shift.

11. The signal processing apparatus according to claim 10,
wherein the user data subsequent to the FS is coded into a predetermined channel code, and
wherein the circuitry is further configured to decode the channel code decodes the channel code according to the data gate signal.

12. A signal processing method comprising restoring a frame sync (FS) by performing maximum likelihood decoding of the FS according to a time-varying trellis with a state and a state transition being limited according to a time, in maximum likelihood decoding of a reproduction signal reproduced from a disk-shaped recording medium, the FS representing a head of a frame, the FS of the frame being arranged at the head of the frame, the FS being recorded at the same positions in a track direction in two adjacent tracks.

13. A non-transitory computer-readable medium having embodied thereon a program, which when executed by a computer causes the computer to execute a signal processing method, the method comprising restoring a frame sync (FS) by performing maximum likelihood decoding of the FS according to a time-varying trellis with a state and a state transition being limited according to a time, in maximum likelihood decoding of a reproduction signal reproduced from a disk-shaped recording medium, the FS representing a head of a frame, the FS of the frame being arranged at the head of the frame, the FS being recorded at the same positions in a track direction in two adjacent tracks.

* * * * *